US010014067B2

(12) United States Patent
Maekawa et al.

(10) Patent No.: US 10,014,067 B2
(45) Date of Patent: Jul. 3, 2018

(54) SEMICONDUCTOR DEVICE AND MANUFACTURING METHOD THEREOF

(71) Applicant: Renesas Electronics Corporation, Koutou-ku, Tokyo (JP)

(72) Inventors: Keiichi Maekawa, Tokyo (JP); Shiro Kamohara, Tokyo (JP); Yasushi Yamagata, Tokyo (JP); Yoshiki Yamamoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/382,646

(22) Filed: Dec. 17, 2016

(65) Prior Publication Data

US 2017/0263328 A1 Sep. 14, 2017

(30) Foreign Application Priority Data

Mar. 8, 2016 (JP) ................................ 2016-044528

(51) Int. Cl.

| | |
|---|---|
| ***G11C 17/16*** | (2006.01) |
| ***G11C 17/18*** | (2006.01) |
| ***H01L 21/266*** | (2006.01) |
| ***H01L 21/283*** | (2006.01) |
| ***H01L 21/768*** | (2006.01) |
| ***H01L 21/84*** | (2006.01) |

(Continued)

(52) U.S. Cl.

CPC .............. *G11C 17/18* (2013.01); *G11C 17/16* (2013.01); *H01L 21/266* (2013.01); *H01L 21/283* (2013.01); *H01L 21/76895* (2013.01); *H01L 21/84* (2013.01); *H01L 27/1203* (2013.01); *H01L 29/36* (2013.01)

(58) Field of Classification Search

CPC ................................ G11C 17/16; G11C 17/18

See application file for complete search history.

(56) References Cited

U.S. PATENT DOCUMENTS

| | | | | |
|---|---|---|---|---|
| 6,798,693 | B2 | 9/2004 | Peng | |
| 2003/0227056 | A1 * | 12/2003 | Wang | H01L 21/84 257/347 |

(Continued)

FOREIGN PATENT DOCUMENTS

| | | | |
|---|---|---|---|
| JP | 2005-504434 | T | 2/2005 |

*Primary Examiner* — Hoai V Ho
*Assistant Examiner* — Jay Radke
(74) *Attorney, Agent, or Firm* — Shapiro, Gabor and Rosenberger, PLLC

(57) ABSTRACT

To provide a semiconductor device equipped with anti-fuse memory cells, which is capable of improving read-out accuracy of information. There is provided a semiconductor device in which an N channel type memory transistor, a selection core transistor, and a selection bulk transistor are respectively electrically coupled in series. The memory transistor and the selection core transistor are formed in a silicon layer of an SOI substrate, and the selection bulk transistor is formed in a semiconductor substrate. A word line is coupled to a memory gate electrode of the memory transistor, and a bit line is coupled to the selection bulk transistor. A write-in operation is performed while applying a counter voltage opposite in polarity to a voltage applied from the word line to the memory gate electrode to the bit line.

14 Claims, 67 Drawing Sheets

(51) Int. Cl.
*H01L 27/12* (2006.01)
*H01L 29/36* (2006.01)

(56) References Cited

U.S. PATENT DOCUMENTS

| | | | | |
|---|---|---|---|---|
| 2008/0175060 | A1* | 7/2008 | Liu | G11C 11/404 365/185.18 |
| 2009/0101960 | A1* | 4/2009 | Aoki | H01L 27/11529 257/315 |
| 2011/0255327 | A1* | 10/2011 | Schmitt | G11C 17/16 365/104 |
| 2013/0087855 | A1* | 4/2013 | Makiyama | H01L 21/84 257/350 |
| 2013/0264644 | A1* | 10/2013 | Tsunomura | H01L 27/1203 257/350 |
| 2014/0340955 | A1* | 11/2014 | Wu | H01L 27/11206 365/104 |
| 2015/0287730 | A1* | 10/2015 | Wu | G11C 5/06 365/96 |
| 2016/0104542 | A1* | 4/2016 | Wu | G11C 16/14 365/96 |
| 2016/0141295 | A1* | 5/2016 | Wu | H01L 27/11206 365/96 |
| 2016/0379720 | A1* | 12/2016 | Luan | G11C 17/16 365/96 |
| 2017/0117284 | A1* | 4/2017 | Wu | H01L 27/11206 |

* cited by examiner

FIG. 4

(EMBODIMENT)

| OPERATION | CELL | WL | BL | BGW | CGW | SUB | STATE |
|---|---|---|---|---|---|---|---|
| WRITE-IN | MCA | Vml-P(WL1) | Vbl-P(BL1) | Vbg-P | Vsl1-P(CGW1) | Vb-S | SELECTION |
| | MCB | Vml-P(WL1) | 0V(BL2) | Vbg-P | Vsl1-P(CGW1) | Vb-S | NON-SELECTION |
| | MCC | 0V(WL2) | Vbl-P(BL1) | Vbg-P | Vsl2-P(CGW2) | Vb-S | NON-SELECTION |
| | MCD | 0V(WL2) | 0V(BL2) | Vbg-P | Vsl2-P(CGW2) | Vb-S | NON-SELECTION |
| READ-OUT | MCA | Vml-R(WL1) | 0V(BL1) | Vbg-R | Vsl1-R(CGW1) | 0V | SELECTION |
| | MCB | Vml-R(WL1) | 0V(BL2) | Vbg-R | Vsl1-R(CGW1) | 0V | NON-SELECTION |
| | MCC | 0V(WL2) | 0V(BL1) | Vbg-R | Vsl2-R(CGW2) | 0V | NON-SELECTION |
| | MCD | 0V(WL2) | 0V(BL2) | Vbg-R | Vsl2-R(CGW2) | 0V | NON-SELECTION |

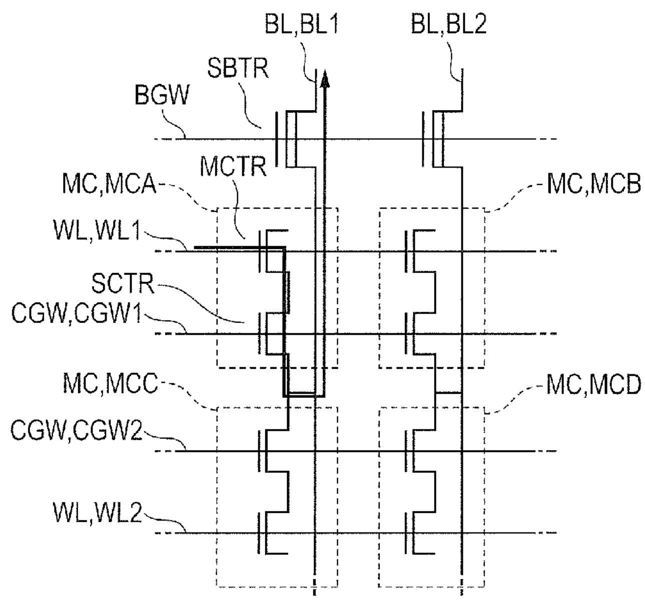

FIG. 6

(COMPARATIVE EXAMPLE)

| OPERATION | CELL | WL | BL | BGW | CGW | SUB | STATE |
|---|---|---|---|---|---|---|---|
| WRITE-IN | MCA | Vml-P(WL1) | 0V(BL1) | Vbg-P | Vsl1-P(CGW1) | 0V | SELECTION |
| | MCB | Vml-P(WL1) | 0V(BL2) | Vbg-P | Vsl1-P(CGW1) | 0V | NON-SELECTION |
| | MCC | 0V(WL2) | 0V(BL1) | Vbg-P | Vsl2-P(CGW2) | 0V | NON-SELECTION |
| | MCD | 0V(WL2) | 0V(BL2) | Vbg-P | Vsl2-P(CGW2) | 0V | NON-SELECTION |
| READ-OUT | MCA | Vml-R(WL1) | 0V(BL1) | Vbg-R | Vsl1-R(CGW1) | 0V | SELECTION |
| | MCB | Vml-R(WL1) | 0V(BL2) | Vbg-R | Vsl1-R(CGW1) | 0V | NON-SELECTION |
| | MCC | 0V(WL2) | 0V(BL1) | Vbg-R | Vsl2-R(CGW2) | 0V | NON-SELECTION |
| | MCD | 0V(WL2) | 0V(BL2) | Vbg-R | Vsl2-R(CGW2) | 0V | NON-SELECTION |

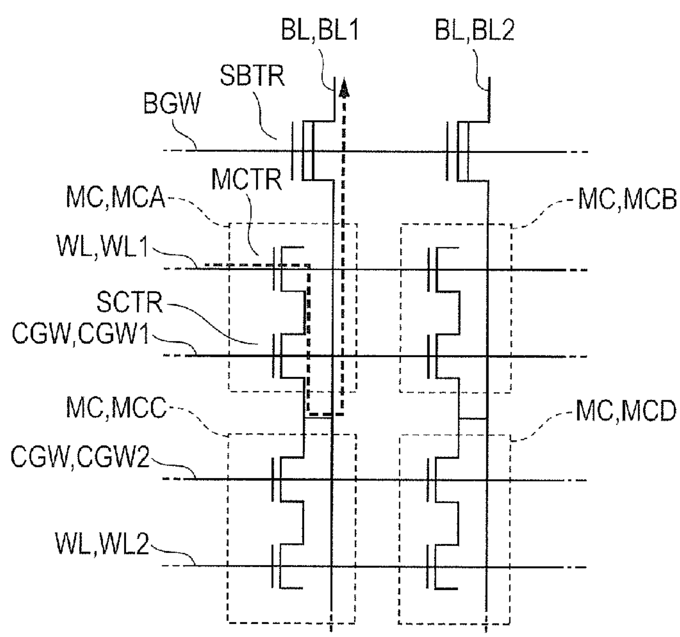

SEMICONDUCTOR DEVICE AND MANUFACTURING METHOD THEREOF

CROSS-REFERENCE TO RELATED APPLICATIONS

The disclosure of Japanese Patent Application No. 2016-044528 filed on Mar. 8, 2016 including the specification, drawings and abstract is incorporated herein by reference in its entirety.

BACKGROUND

The present invention relates to a semiconductor device and a manufacturing method thereof, and is suitably available to, for example, a semiconductor device equipped with anti-fuse memory cells.

Non-volatile memory cells have heretofore been known as memory cells equipped in a semiconductor device. As one of such non-volatile memory cells, there is known a non-volatile memory cell which is capable of writing-in only once and to which a fuse is applied. A memory transistor based on a MOS (Metal Oxide Semiconductor) transistor form is applied as a fuse. The present memory cell is referred to as an anti-fuse memory cell. As one of Patent Documents each having disclosed such a semiconductor device, there is known, for example, Patent Document 1.

In the semiconductor device, one memory cell is configured by a memory transistor, a first selection transistor, and a second selection transistor. The memory transistor, the first selection transistor, and the second selection transistor are electrically coupled in series. A word line is electrically coupled to a memory gate electrode of the memory transistor. A bit line is electrically coupled to the second selection transistor.

A write-in operation of information is performed by applying a prescribed voltage from the word line to the memory gate electrode and thereby dielectric-breaking a gate insulating film. On the other hand, a read-out operation of information is performed by detecting a current flowing from the memory gate electrode to the bit line through a breakdown point made to be a resistor by being subjected to dielectric breakdown, the first selection transistor, and the second selection transistor.

RELATED ART DOCUMENTS

Patent Document

[Patent Document 1] Japanese Unexamined Patent Application Publication No. 2005-504434

SUMMARY

The development of a semiconductor device in which a memory transistor and a first selection transistor, etc. are formed in a silicon layer of an SOI substrate has recently been advanced for the purpose of a reduction in voltage and the like.

It has however been revealed by the inventors that it becomes difficult to improve read-out accuracy of information due to gate coupling caused by a buried oxide film interposed between a silicon layer and a semiconductor substrate.

Other objects and novel features of the present invention will become apparent from the description of the present specification and the accompanying drawings.

A semiconductor device according to one aspect of the present invention is equipped with a substrate, a first element forming region, a second element forming region, a first conductivity type channel memory transistor, a first conductivity type channel first selection transistor, a first conductivity type channel second selection transistor, a word line, and a bit line. The substrate has a semiconductor substrate and a semiconductor layer formed over the semiconductor substrate with a buried insulating film interposed therebetween. The memory transistor and the first selection transistor are formed in the first element forming region defined in the semiconductor layer. The memory transistor includes a memory gate electrode positioned over the semiconductor layer with a memory gate insulating film interposed therebetween. The second selection transistor is formed in the second element forming region defined in the substrate. The word line is electrically coupled to the memory gate electrode. The bit line is electrically coupled to the second selection transistor. The memory transistor, the first selection transistor, and the second selection transistor are electrically coupled in series. A write-in operation of information is performed by bringing the first selection transistor and the second selection transistor into an ON state while applying a first voltage to the word line, thereby dielectric breaking the memory gate insulating film. A read-out operation of information is performed by bringing the first selection transistor and the second selection transistor into an ON state while applying a second voltage to the word line, thereby detecting a current flowing from the memory gate electrode to the bit line through the first selection transistor and the second selection transistor. The write-in operation is performed while applying a counter voltage opposite in polarity to the first voltage applied to the memory gate electrode to the bit line.

A method of manufacturing a semiconductor device according to another aspect of the present invention has the following steps. A substrate having a semiconductor substrate and a semiconductor layer formed over the semiconductor substrate with a buried insulating film interposed therebetween is provided. A semiconductor element is formed including the step of forming a first conductivity type channel memory transistor and a first conductivity type channel first selection transistor in a first element forming region defined in the semiconductor layer and forming a first conductivity type channel second selection transistor in a second element forming region defined in the substrate. The memory transistor, the first selection transistor, and the second selection transistor are electrically coupled in series, a word line is coupled to the memory transistor, and a bit line is coupled to the second selection transistor. The memory transistor forming step in the semiconductor element forming step includes the following steps. A memory gate electrode is formed over the semiconductor layer with a memory gate insulating film interposed therebetween. A first conductivity type impurity region is formed in the semiconductor layer positioned in a region in which the memory gate electrode is to be arranged. A first conductivity type memory extension region is formed in the semiconductor layer so as to contact the impurity region. A first conductivity type memory source-drain region is formed in the semiconductor layer so as to contact the memory extension region.

A method for manufacturing a semiconductor device according to a further aspect of the present invention has the following steps. A substrate having a semiconductor substrate and a semiconductor layer formed over the semiconductor substrate with a buried insulating film interposed therebetween is provided. A semiconductor element is formed including the step of forming a first conductivity type channel memory transistor and a first conductivity type channel first selection transistor in a first element forming region defined in the semiconductor layer and forming a first conductivity type channel second selection transistor in a second element forming region defined in the substrate. The memory transistor, the first selection transistor, and the second selection transistor are electrically coupled in series, a word line is coupled to the memory transistor, and a bit line is coupled to the second selection transistor. The first selection transistor forming step in the step of forming the semiconductor element includes the following steps. An insulating film to be a first selection gate insulating film is formed at the surface of the semiconductor layer. A second conductivity type conducive film to be a first selection gate electrode is formed at the surface of the insulating film. A hard mask is formed so as to cover the conductive film. Etching processing is performed on the conductive film and the insulating film with the hard mask as an etching mask to thereby form the first selection gate electrode through the first selection gate insulating film. A first conductivity type impurity is implanted in a state in which the hard mask covering the first selection gate electrode is left, to thereby form a first selection source-drain region having a first impurity concentration in the semiconductor layer. After the hard mask is removed, a first conductivity type impurity is implanted with the first selection gate electrode as an implantation mask to thereby form a first selection extension region having a second impurity concentration lower than the first impurity concentration in the semiconductor layer.

According to the semiconductor device according to one aspect of the present invention, it is possible to improve read-out accuracy of information.

According to the semiconductor device manufacturing method according to another aspect of the present invention, it is possible to manufacture a semiconductor device capable of improving read-out accuracy of information.

According to the semiconductor device manufacturing method according to a further aspect of the present invention, it is possible to manufacture a semiconductor device capable of improving read-out accuracy of information.

BRIEF DESCRIPTION OF THE DRAWINGS

FIG. 4 is a diagram showing one example of conditions for write-in and read-out operations of the semiconductor device in the same embodiment;

FIG. 6 is a diagram showing one example of conditions for write-in and read-out operations of the semiconductor device according to the comparative example;

DETAILED DESCRIPTION

Embodiment 1

A description will be made here about a semiconductor device equipped with anti-fuse memory cells, in which breakdown efficiency of a memory gate insulating film is improved.

(Circuit of Memory Cell)

Figure 1:
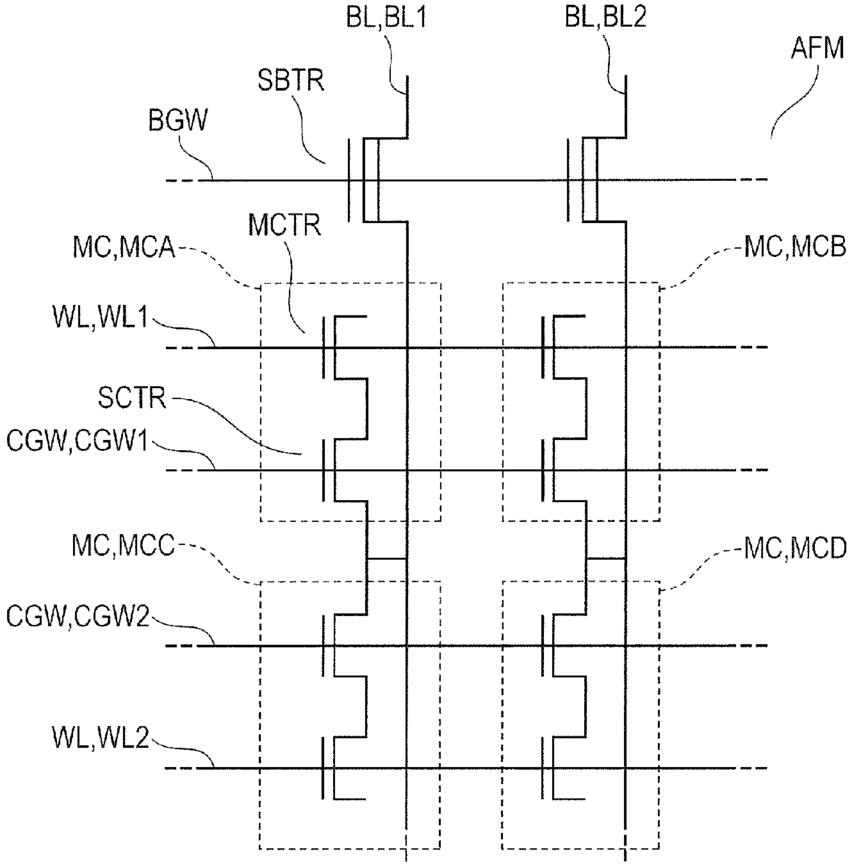
FIG. 1 is an equivalent circuit diagram of memory cells in a semiconductor device according to each embodiment.

A description will first be made about a circuit of each memory cell in the semiconductor device. As shown in FIG. 1, a plurality of memory cells MC are arranged in a matrix form (rows×columns) as the memory cells of the semiconductor device AFM. Incidentally, four memory cells MCA, MCB, MCC, and MCD (2 rows×2 columns) are shown in FIG. 1 for simplification of the drawing. One memory cell MC is configured by a memory transistor MCTR and a selection core transistor SCTR (first selection transistor). The memory transistor MCTR and the selection core transistor SCTR are electrically coupled in series. Further, a selection bulk transistor SBTR (second selection transistor) is arranged for each column of the memory cells MC arranged in the matrix form.

Of the respective memory cells MC arranged in the matrix form, respective gate electrodes of the selection core transistors SCTR of the memory cells MC arranged in the same row are electrically coupled to a core gate wiring CGW. Also, gate electrodes of the memory transistors MCTR of the memory cells MC arranged in the same row are respectively electrically coupled to a word line WL. For example, the gate electrode of the memory transistor of the memory cell MCA (MCC) and the gate electrode of the memory transistor of the memory cell MCB (MCD) are electrically coupled to a word line WL1 (WL2).

The selection core transistors SCTR (source-drain regions) of the memory cells MC arranged in the same column are respectively electrically coupled to the selection bulk transistor SBTR (source-drain region) of the same column. Also, gate electrodes of the selection bulk transistors SBTR are respectively electrically coupled to a bulk gate wiring BGW. The selection bulk transistors SBTR (source-drain regions) are respectively electrically coupled to bit lines BL. For example, a bit line BL1 (BL2) is electrically coupled to the source-drain region of the selection bulk transistor SBTR of the first (second) column.

(Structure of Memory Cell)

A description will next be made about a structure of each memory cell in the semiconductor device AFM. An SOI (Silicon On Insulator) substrate is applied to a semiconductor device equipped with memory cells according to each embodiment. The SOI substrate includes a semiconductor substrate BSUB, a buried oxide film BOX, and a silicon layer SOI (refer to FIG. 18). A region (SOI region) with the silicon layer SOI left therein, and a region (bulk region) of the semiconductor substrate BSUB from which the silicon layer and the buried oxide film are removed are arranged in the semiconductor device.

Figure 2:
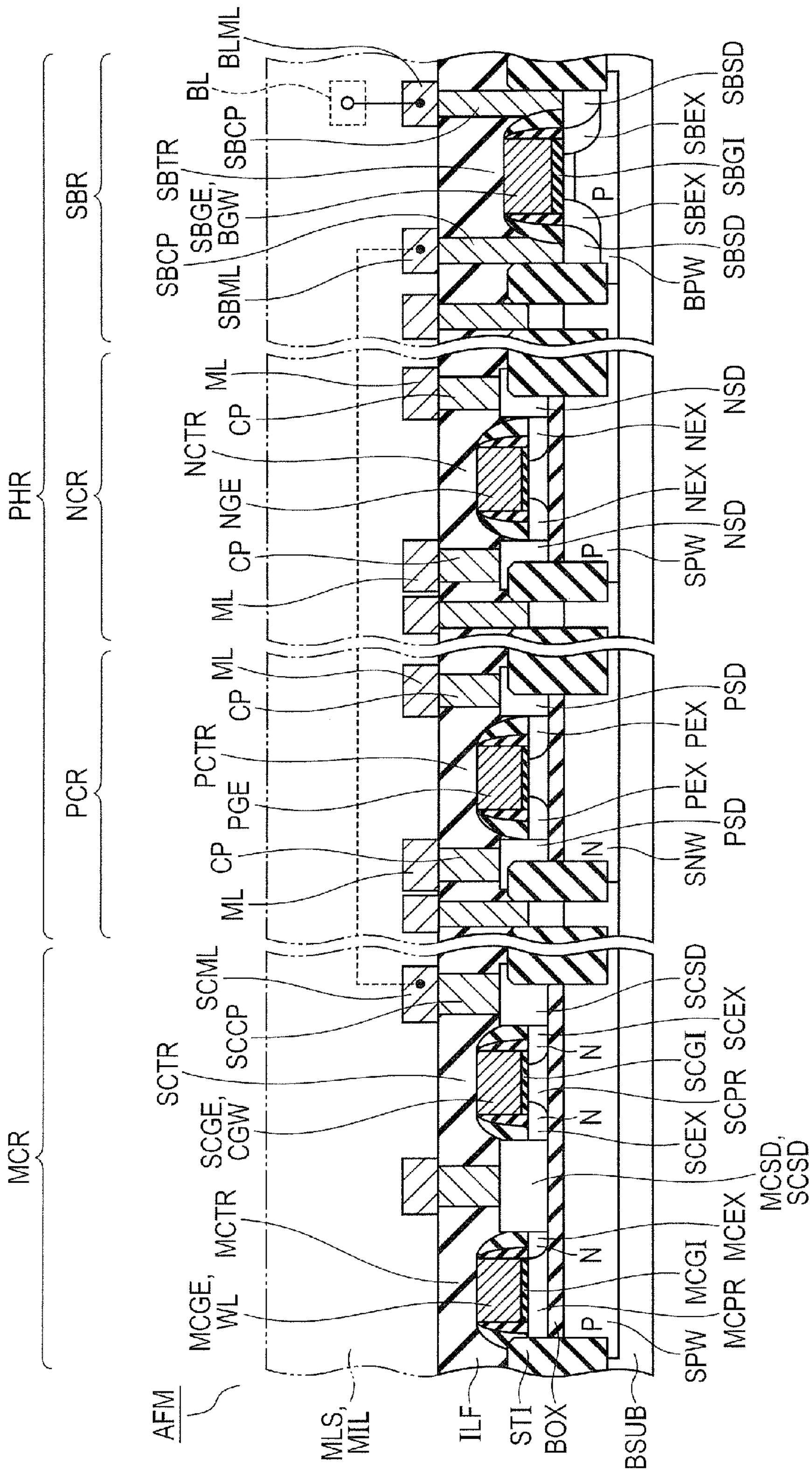
FIG. 2 is a sectional diagram of a semiconductor device according to an embodiment 1.

As shown in FIG. 2, in the semiconductor device AFM, a memory cell region MCR and a peripheral circuit region PHR are defined by a shallow trench isolation insulating film STI. A selection bulk transistor region SBR is defined in the peripheral circuit region PHR. The memory cell region MCR is arranged in the SOI region (silicon layer SOI). The selection bulk transistor region SBR is arranged in the bulk region (semiconductor substrate BSUB).

The memory cell region MCR is formed with an N channel type memory transistor MCTR and an N channel type selection core transistor SCTR. The memory transistor MCTR includes a memory gate electrode MCGE, an N type extension region MCEX, and an N type source-drain region MCSD. The memory gate electrode MCGE is formed over a silicon layer as a channel with a memory gate insulating film MCGI interposed therebetween. In the embodiment 1, the silicon layer to be the channel is assumed to be a P type silicon layer MCPR.

The extension region MCEX is formed at a part of the silicon layer located directly below a sidewall insulating film. Here, the extension region MCEX may be formed so as not to overlap with the memory gate electrode MCGE as seen in a plan view (underlap). The source-drain region MCSD is formed in the silicon layer (including an elevated portion). The source-drain region MCSD is in contact with the extension region MCEX.

The selection core transistor SCTR includes a selection core gate electrode SCGE, a pair of extension regions SCEX of N type, and a pair of source-drain regions SCSD of N type. The selection core gate electrode SCGE is formed over a P type silicon layer SCPR as a channel with a selection core gate insulating film SCGI interposed therebetween. The pair of extension regions SCEX is formed at parts of the silicon layer. The pair of source-drain regions SCSD is formed in the silicon layer (including an elevated portion). The source-drain region SCSD is in contact with the extension region SCEX.

A P type well SPW is formed in the semiconductor substrate BSUB positioned in the memory cell region MCR. The P type well SPW is formed from an interface between the buried oxide film BOX and the semiconductor substrate BSUB to a predetermined depth.

An N channel type selection bulk transistor SBTR is formed in the selection bulk transistor region SBR. The selection bulk transistor SBTR includes a gate electrode SBGE, a pair of extension regions SBEX of N type, and a pair of source-drain regions SBSD of N type. The pair of extension regions SBEX is formed in the semiconductor substrate BSUB. The pair of source-drain regions SBSD is formed in the semiconductor substrate BSUB.

AP type well BPW is formed in the semiconductor substrate BSUB positioned in the selection bulk transistor region SBR. The P type well BPW is formed from the surface of the semiconductor substrate BSUB to a predetermined depth.

The source-drain region MCSD of the memory transistor MCTR and one of the pair of source-drain regions SCSD of the selection core transistor SCTR are formed in a common region. The memory transistor MCTR and the selection core transistor SCTR are electrically coupled through the source-drain region MCSD and one source-drain region SCSD.

The other of the pair of source-drain regions SCSD of the selection core transistor SCTR, and one of the pair of source-drain regions SBSD of the selection bulk transistor SBTR are electrically coupled to each other. A bit line BL is electrically coupled to the other of the pair of source-drain regions SBSD of the selection bulk transistor SBTR. Thus, the memory transistor MCTR, the selection core transistor SCTR, and the selection bulk transistor SBTR are electrically coupled in series in the order of the memory transistor MCTR, the selection core transistor SCTR, and the selection bulk transistor SBTR.

In the peripheral circuit region PHR, for example, a P type core transistor region PCR and an N type core transistor region NCR are defined in addition to the selection bulk transistor region SBR. The P type core transistor region PCR and the N type core transistor region NCR are arranged in the SOI region (silicon layer). The P type core transistor region PCR is formed with a P channel type core transistor PCTR. The N type core transistor region NCR is formed with an N channel type core transistor NCTR.

The P channel type core transistor PCTR includes a gate electrode PGE, a pair of extension regions PEX of P type, and a pair of source-drain regions PSD of P type. The pair of extension regions PEX is formed in the silicon layer. The pair of source-drain regions PSD is formed in the silicon layer (including an elevated portion).

The N channel type core transistor NCTR includes a gate electrode NGE, a pair of extension regions NEX of N type, and a pair of source-drain regions NSD of N type. The pair of extension regions NEX is formed in the silicon layer. The pair of source-drain regions NSD is formed in the silicon layer (including an elevated portion).

The semiconductor substrate BSUB positioned in the P type core transistor region PCR is formed with an N type well SNW. The N type well SNW is formed from the interface between the buried oxide film BOX and the semiconductor substrate BSUB to a predetermined depth.

The semiconductor substrate BSUB positioned in the N type core transistor region NCR is formed with a P type well SPW. The P type well SPW is formed from the interface between the buried oxide film BOX and the semiconductor substrate BSUB to a predetermined depth.

An interlayer insulating film ILF is formed so as to cover the memory transistor MCTR, the selection core transistor SCTR, and the selection bulk transistor SBTR, etc. Contact plugs SCCP, SBCP, and CP are formed so as to penetrate the interlayer insulating film ILF.

In the memory cell region MCR, the contact plugs SCCP are electrically coupled to the source-drain regions SCSD. In the selection bulk transistor region SBR, the contact plugs SBCP are electrically coupled to the source-drain regions SBSD. In the P type core transistor region PCR, the contact plugs CP are electrically coupled to the source-drain regions PSD. In the N type core transistor region NCR, the contact plugs CP are electrically coupled to the source-drain regions NSD.

Wirings SCML, SBML, BLML, and ML are formed over the interlayer insulating film ILF. In the memory cell region MCR, the wiring SCML is electrically coupled to the contact plug SCCP. In the selection bulk transistor region SBR, the wirings SBML and BLML are electrically coupled to the source-drain regions SBSD. The wiring BLML is electrically coupled to the bit line BL. In the P type core transistor region PCR, the wiring ML is electrically coupled to the contact plug CP. In the N type core transistor region NCR, the wiring ML is electrically coupled to the contact plug CP.

In the semiconductor device AFM, a multilayer wiring structure including a multilayer wiring MLS and a multilayer interlayer insulating film MIL is formed over the wirings SCML, SBML, BLML, and ML as needed. The semiconductor device AFM according to the embodiment 1 is configured as described above.

(Operation of Semiconductor Device)

A description will next be made about the operation of the semiconductor device AFM equipped with the above-mentioned memory cells MC. A structure of the memory transistor MCTR, the selection core transistor SCTR, and the selection bulk transistor SBTR is typically shown in FIG. 3. Also, one example of operational conditions, and an equivalent circuit diagram of the four (memory cells MCA, MCB, MCC, and MCD) of the memory cells MC are illustrated in FIG. 4.

(Write-in Operation)

Figure 3:
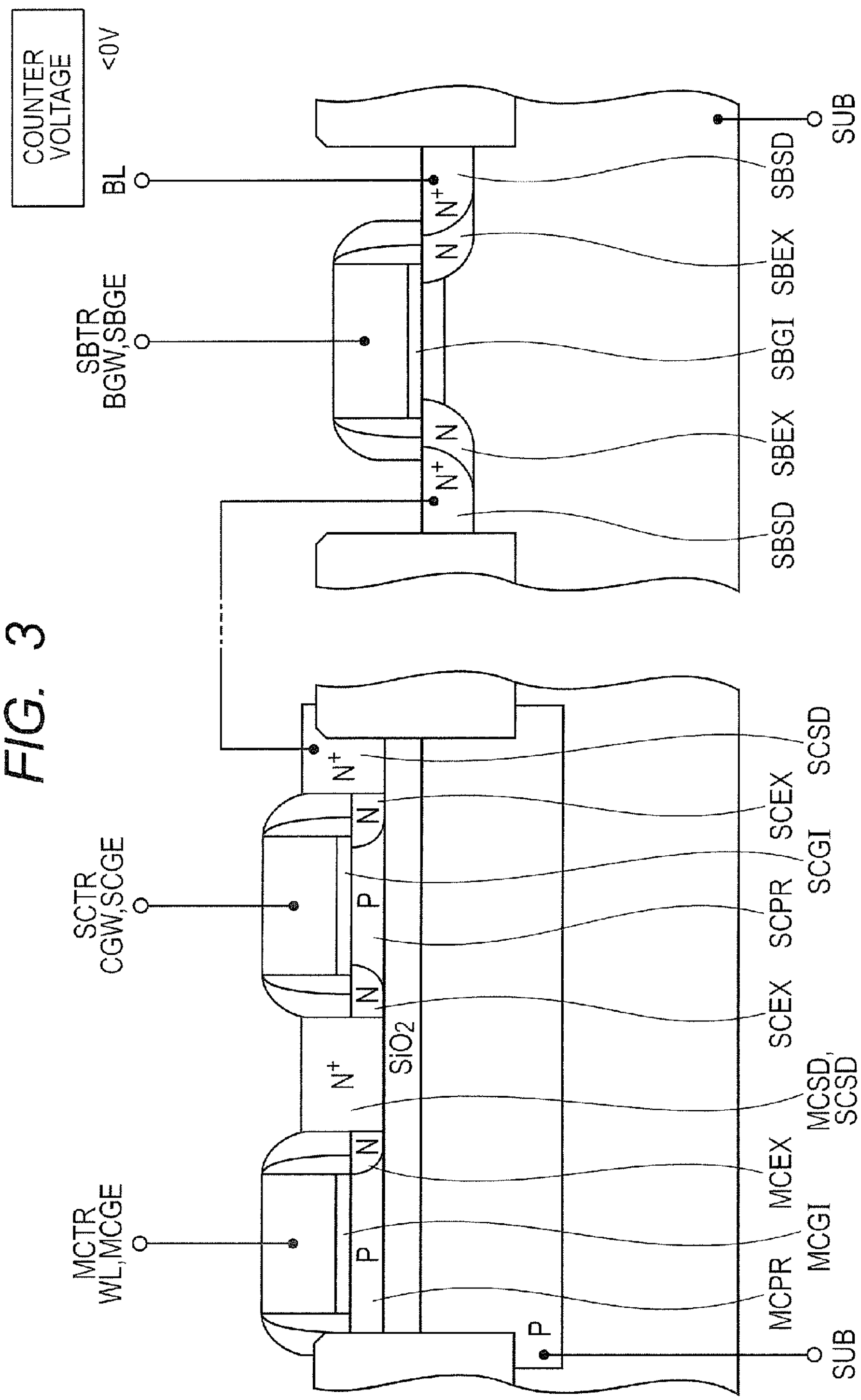
FIG. 3 is a sectional typical diagram for describing the operation of the semiconductor device in the same embodiment.

As shown in FIGS. 3 and 4, in the memory cells MC (rows×columns) arranged in the matrix form, the rows are respectively specified by the word lines WL and the core gate wirings CGW, and the columns are respectively specified by the bit lines BL. Now assume where, for example, information is written into the memory cell MCA of the four memory cells MC. In this case, in the memory cell MCA, the row is specified by the word line WL1 and the core gate wiring CGW1, and the column is specified by the bit line BL1.

For example, a voltage (Vml−P) of about 6.5V or so is applied to the word line WL1. For example, a voltage (Vsl1−P) of about 3.0V or so is applied to the core gate wiring CGW1. For example, a voltage (Vbl−P) of about −0.5V or so is applied to the bit line BL1. As for this voltage (Vbl−P), a voltage opposite in polarity to a voltage applied to the memory gate electrode MCGE is applied as a counter voltage. For example, a voltage (Vbg−P) of about 1.5V or so is applied to the bulk gate wiring BGW.

For example, a voltage of 0V is applied to another word line WL2. For example, the voltage (Vsl2−P) of 0V is applied to the core gate wiring CGW2. The voltage of 0V is applied to the bit line BL2. Further, for example, the voltage (Vb−S) of 0V is applied to the P type well SPW of the memory cell region MCR and the P type well BPW of the selection bulk transistor region SBR. According to such voltage conditions, the memory cell MCA is selected and the memory cells MCB, MCC, and MCD are respectively brought into a non-selection.

In the selected memory cell MCA, a voltage of about 6.5V or so is applied to the memory gate electrode MCGE of the memory transistor MCTR electrically coupled to the word line WL1. Further, the potential of the extension region MCEX (source-drain region MCSD) of the memory transistor MCTR becomes approximately the same potential as the counter voltage (about −0.5V or so) applied to the bit line BL1, through the selection bulk transistor SBTR and the selection core transistor SCTR respectively brought into an ON state.

Thus, the memory gate insulating film MCGI is locally dielectric broken. At this time, the potential of the N type extension region MCEX of the memory transistor MCTR becomes nearly the same potential as the counter voltage. Thus, the potential of the interface between the memory gate insulating film MCGI and the P type silicon layer MCPR as the channel floats, and the difference between the potential of the memory gate electrode MCGE and the potential of the interface can be suppressed from being lowered. As a result, the memory gate insulating film MCGI can be broken locally and satisfactorily. This will be described in detail later.

Most of hot holes generated when the memory gate insulting film MCGI is dielectric broken pass through the bit line BL1 via the selection core transistor and the selection bulk transistor. A point where the memory gate insulating film MCGI is dielectric broken becomes a resistor. Thus, the information is written into the memory cell MCA by dielectric breaking the memory gate insulating film MCGI.

(Read-Out Operation)

Now assume where the information written into the memory cell MCA of the four memory cells MC by the write-in operation is read out.

For example, a voltage (Vml−R) of about 1.0V or so is applied to the word line WL1. For example, a voltage (Vsl−R) of about 1.0V or so is applied to the core gate wiring CGW1. For example, a voltage of 0V is applied to the bit line BL1. For example, a voltage (Vbg−R) of about 3.3V or so is applied to the bulk gate wiring BGW.

For example, the voltage of 0V is applied to another word line WL2. For example, the voltage (Vsl2−R) of 0V is applied to the core gate wiring CGW2. The voltage of 0V is applied to the bit line BL2. Further, for example, the voltage (Vb−S) of 0V is applied to the P type well SPW of the memory cell region MCR and the P type well BPW of the selection bulk transistor region SBR. According to such voltage conditions, the memory cell MCA is selected and the memory cells MCB, MCC, and MCD are respectively brought into a non-selection.

In the selected memory cell MCA, a voltage of about 1.0V or so is applied to the memory gate electrode MCGE of the memory transistor MCTR electrically coupled to the word line WL1. Here, in a state in which the memory gate insulating film MCGI prior to the writing of the information is not dielectric broken, an FN (Fowler-Nordheim) tunnel current generated by the difference in potential between the voltage applied to the memory gate electrode MCGE and the voltage applied to the bit line BL1 flows through the memory gate insulating film MCGI as a gate leakage current.

The FN tunnel current having flowed through the memory gate insulating film MCGI flows into the bit line BL1 via the selection bulk transistor SBTR and the selection core transistor SCTR. This FN tunnel current is detected as a read-out current. Before the information is written, the read-out current is in the order of picoamperes or so.

On the other hand, the memory gate insulting film MCGI of the memory transistor MCTR after the information has been written is locally dielectric broken and serves as a resistor. Thus, the read-out current flowing from the memory gate electrode MCGE through the resistor, the selection bulk transistor SBTR, and the selection core transistor SCTR increases greatly (refer to an arrow indicated by a solid line in FIG. 4). The read-out current is in the order of microamperes or so. Information ("0" or "1") is read out by a current ratio (ON/OFF) of the read-out current before writing-in (OFF) and the read-out current after writing-in (ON).

In the above-described semiconductor device AFM, the memory gate insulating film MCGI of the memory transistor MCTR is dielectric broken satisfactorily by applying the counter voltage upon the write-in operation. It is thus possible to achieve an improvement in read-out accuracy. This will be described in comparison with a semiconductor device according to a comparative example.

Comparative Example

Figure 5:
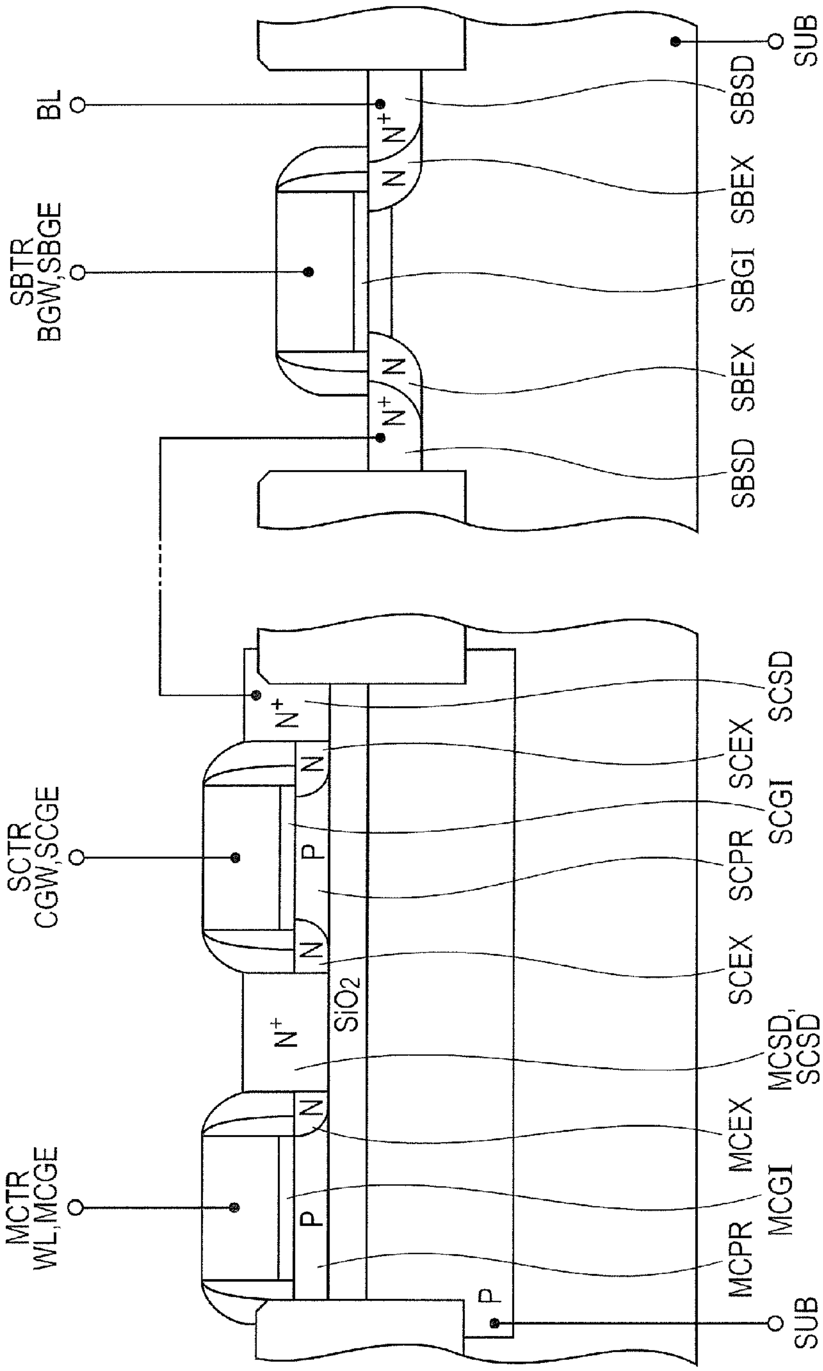
FIG. 5 is a sectional typical diagram for describing the operation of a semiconductor device according to a comparative example.

A structure of a memory transistor MCTR, a selection core transistor SCTR, and a selection bulk transistor SBTR in the semiconductor device according to the comparative example is typically shown in FIG. 5. The semiconductor device according to the comparative example is similar in structure to the semiconductor device shown in FIG. 3. Therefore, the same reference numerals are respectively attached to the same members, and their description will not be repeated unless otherwise required.

A description will next be made about the operation of the semiconductor device AFM according to the comparative example. One example of operational conditions, and an equivalent circuit diagram of four (memory cells MCA, MCB, MCC, and MCD) of memory cells MC are illustrated in FIG. 6.

(Write-in Operation)

Now assume where information is written into, for example, the memory cell MCA of the four memory cells MC.

The write-in operation is the same as that of the semiconductor device according to the embodiment except that the voltage applied to a bit line BL1 differs. For example, a voltage (Vml−P) of about 6.5V or so is applied to a word line WL1. For example, a voltage (Vsl1−P) of about 3.0V or so is applied to a core gate wiring CGW1. A voltage (Vbl−P) of 0V is applied to the bit line BL1. For example, a voltage (Vbg−P) of about 1.5V or so is applied to a bulk gate wiring BGW.

The voltage of 0V is applied to a word line WL2. For example, the voltage (Vsl2−P) of 0V is applied to a core gate wiring CGW2. The voltage of 0V is applied to a bit line BL2. Further, for example, the voltage of 0V is applied to a P type well SPW of a memory cell region MCR and a P type well BPW of a selection bulk transistor region SBR. According to such voltage conditions, the memory cell MCA is selected and the memory cells MCB, MCC, and MCD are respectively brought into a non-selection.

In the selected memory cell MCA, a voltage of about 6.5V or so is applied to a memory gate electrode MCGE of the memory transistor MCTR electrically coupled to the word line WL1. Further, the potential of an extension region MCEX (source-drain region MCSD) of the memory transistor MCTR becomes approximately the same potential as the voltage (0V) applied to the bit line BL1, through a selection bulk transistor SBTR and a selection core transistor SCTR respectively brought to an ON state. Thus, a memory gate insulating film MCGI is locally dielectric broken, and its dielectric broken point serves as a resistor, whereby the writing-in of information is carried out.

(Read-Out Operation)

Assume where the information written into the memory cell MCA of the four memory cells MC by the write-in operation is read out.

The read-out operation is the same as that of the semiconductor device according to the embodiment 1. For example, a voltage (Vml−R) of about 1.0V or so is applied to the word line WL1. For example, a voltage (Vsl−R) of about 1.0V or so is applied to the core gate wiring CGW1. For example, a voltage of 0V is applied to the bit line BL1. For example, a voltage (Vbg−R) of about 3.3V or so is applied to the bulk gate wiring BGW.

For example, the voltage of 0V is applied to another word line WL2. For example, the voltage (Vsl2−R) of 0V is applied to the core gate wiring CGW2. The voltage of 0V is applied to the bit line BL2. Further, for example, the voltage of 0V is applied to the P type well SPW of the memory cell region MCR and the P type well BPW of the selection bulk transistor region SBR. According to such voltage conditions, the memory cell MCA is selected and the memory cells MCB, MCC, and MCD are respectively brought into a non-selection.

In the memory gate insulting film MCGI of the memory transistor MCTR in the memory cell MCA with the information written therein, its locally dielectric broken point becomes a resistor. Thus, a substantial read-out current flows from the memory gate electrode MCGE to the bit line BL1 through the resistor, selection bulk transistor SBTR, and selection core transistor SCTR (refer to an arrow indicated by a dotted line in FIG. 6). Information ("0" or "1") is read out according to the ratio of a read-out current after writing-in to a read-out current based on an FN tunnel current before writing-in. The semiconductor device according to the comparative example is operated as described above.

(Breakdown Efficiency of Memory Gate Insulating Film)

Figure 7:
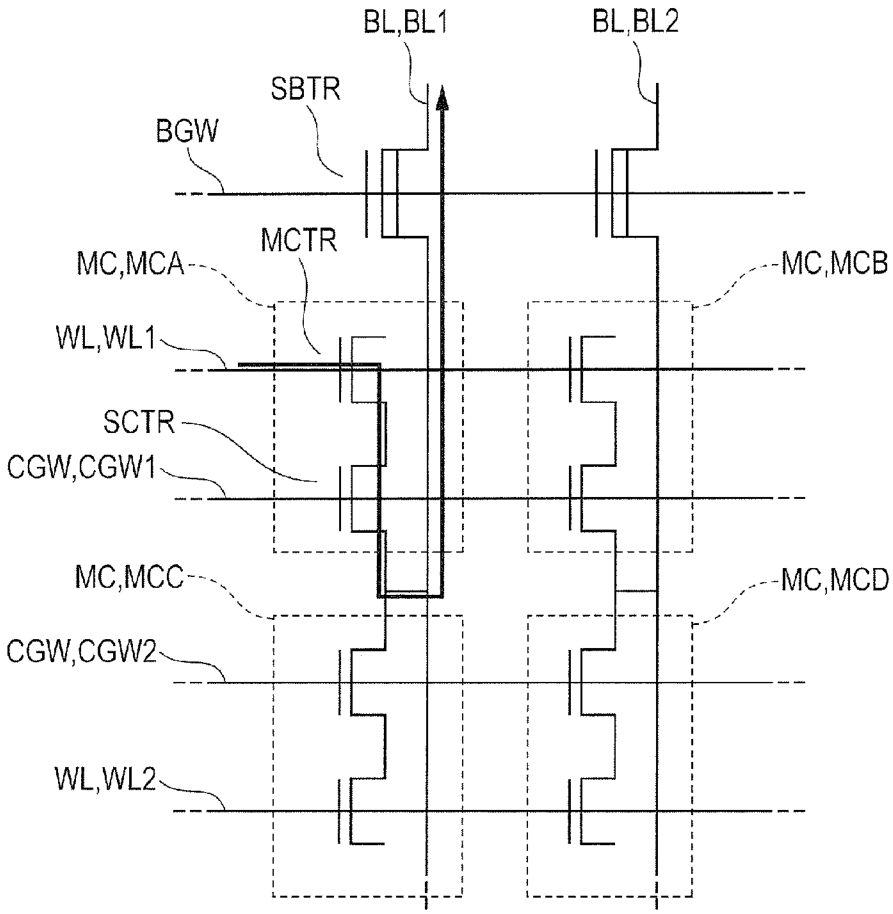
FIG. 7 is an equivalent circuit diagram of each memory cell for describing a write-in operation in the semiconductor device according to the comparative example.

In the semiconductor device AFM equipped with the anti-fuse memory cells, hot holes are generated when dielectric breaking the memory gate insulating film MCGI by applying a voltage to the memory gate electrode MCGE. As shown in FIG. 7, in terms of the circuit operation of the semiconductor device, the generated hot holes flow into the bit line BL through the selection core transistor SCTR and the selection bulk transistor SBTR both being in an ON state (refer to an arrow indicated by a solid line). At this time, the hot holes flow into a reversed layer (channel region) formed in each of the selection core transistor SCTR and the selection bulk transistor SBTR. The resistance value of the reversed layer is sufficiently higher than that of a source-drain region SBSD of the selection bulk transistor SBTR to which the bit line BL is coupled.

Therefore, upon a pulse operation in a short time as in the write-in operation, the hot holes become difficult to flow into the bit line BL as compared with the case where the hot holes are made to flow without via the reversed layer (channel region) as in the case of a single transistor. As a result, it has been known that the voltage of the bit line BL becomes difficult to be applied to the memory gate electrode MCGE, and the breakdown efficiency of the memory gate insulating film MCGI is lowered.

Here, the term "breakdown efficiency" means the following. The dielectric breakdown of a gate insulating film generally includes hard breakdown in which an insulation property is completely lost, and soft breakdown in which dielectric breakdown is made having an insulation property to some extent. The breakdown efficiency in the case of the hard breakdown is assumed to be 100. Then, the breakdown efficiency in the case of the soft breakdown becomes a value lower than 100 according to the degree of the insulation property. The lower the insulation property, the higher the breakdown efficiency, and the higher the insulation property, the lower the breakdown efficiency. In the semiconductor device according to the comparative example, the breakdown efficiency is reduced so that the insulation property of the memory gate insulating film becomes high.

Further, in the semiconductor device AFM to which the SOI substrate is applied, the P type silicon layer MCPR as the channel in the memory transistor MCTR is formed in the silicon layer positioned over the semiconductor substrate BSUB with the buried oxide film BOX interposed therebetween. That is, the P type silicon layer MCPR is formed in the silicon layer surrounded by the buried oxide film BOX and the shallow trench isolation insulating film STI. Therefore, capacitive coupling (gate coupling) is generated between the memory gate electrode MCGE and the semiconductor substrate (P type well SPW).

When a voltage (6.5V) of such a level that the memory gate insulating film MCGI is dielectric broken is instantaneously applied to the memory transistor MCTR formed in the silicon layer, it is desirable that the memory gate insulating film MCGI is dielectric broken by a potential difference (6.5V–0V) between the voltage (6.5V) applied to the memory gate electrode MSGE and the voltage (0V) applied to the bit line BL1.

However, the voltage (0V) applied to the bit line BL1 is not instantaneously applied to the P type extension region MCEX (source-drain region MCSD) by the gate coupling, and the potential of the P type silicon layer MCPR floats instantaneously, so that the dielectric breakdown of the memory gate insulating film MCGI is brought to insufficient dielectric breakdown (soft breakdown). The present inventors have therefore confirmed that a problem arises in that the read-out accuracy of whether or not the information is stored is reduced due to a reduction in read-out current value and the like as compared with the case where the SOI substrate is not applied.

Figure 8:
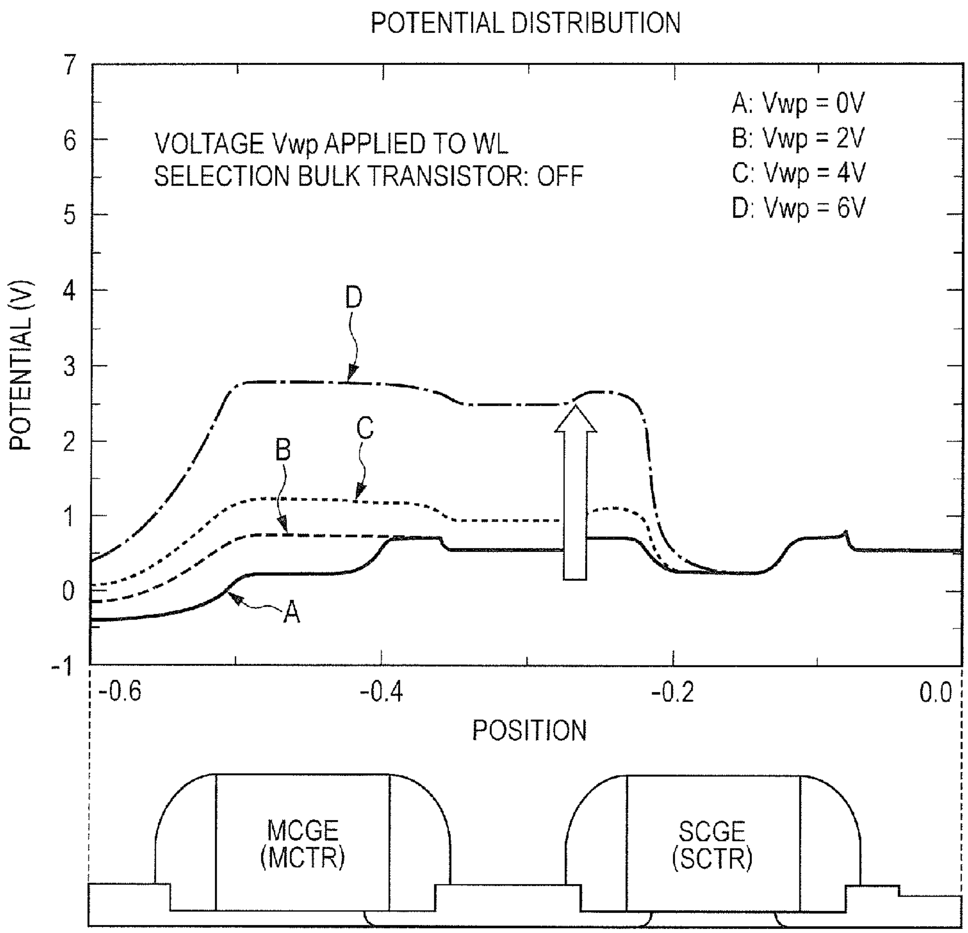
FIG. 8 is a diagram showing a potential distribution in a memory cell, for describing a problem of the semiconductor device according to the comparative example.

This will be described. Potential distributions of the memory gate electrode MCGE and its periphery when the voltage is applied to the memory gate electrode MCGE upon the write-in operation were first evaluated by simulation. Their evaluation results are shown in FIG. 8. A horizontal axis indicates the position in the direction substantially orthogonal to the direction in which the memory gate electrode MCGE or the like extends. A vertical axis indicates a potential at the interface between the memory gate insulating film MCGI and the P type silicon layer MCPR directly below the memory gate electrode MCGE.

A graph A indicates a potential where the voltage (Vmp) applied to the memory gate electrode MCGE is 0V. A graph B indicates a potential where the voltage (Vmp) applied to the memory gate electrode MCGE is 2V. A graph C indicates a potential where the voltage (Vmp) applied to the memory gate electrode MCGE is 4V. A graph D indicates a potential where the voltage (Vmp) applied to the memory gate electrode MCGE is 6V. Further, since the selection bulk transistor is in an OFF state, the potential of the bit line indicates that no voltage is applied to the P type silicon layer MCPR.

As illustrated in the graphs A to D, it is understood that as the voltage applied to the memory gate electrode MCGE becomes higher, the potential of the interface rises (refer to a void arrow). Particularly as shown in the graph D, when the voltage applied to the memory gate electrode MCGE is 6V, the potential of the interface rises up to about 3V or so.

Then, a substantial potential difference between the potential of the memory gate insulating film MCGI (interface) and the potential of the memory gate electrode MCGE is only 3V or so. For this reason, the dielectric breakdown of the memory gate insulating film MCGI becomes insufficient. As a result, the breakdown efficiency of the memory gate insulating film MCGI becomes low.

Further, in the semiconductor device to which the SOI substrate that requires a reduction in power consumption is applied, shortening a gate overlap length between the extension region and the gate electrode and reducing a Gate Induced Drain Leakage (GIDL) taken as one of off-leak sources have generally been known as an effective method of suppressing a leakage current.

Since, however, the semiconductor device AFM has a structure that when the gate overlap length is short, the voltage of the bit line BL acts on the memory gate electrode MCGE through the reversed layer formed directly below the memory gate electrode MCGE, the voltage of the bit line BL becomes difficult to be applied to the memory gate electrode MCGE of each selected memory cell. Therefore, the present inventors have newly confirmed this time that the short-time pulse operation is apt to be affected by the gate coupling.

(Variations in Read-Out Current)

Figure 9:
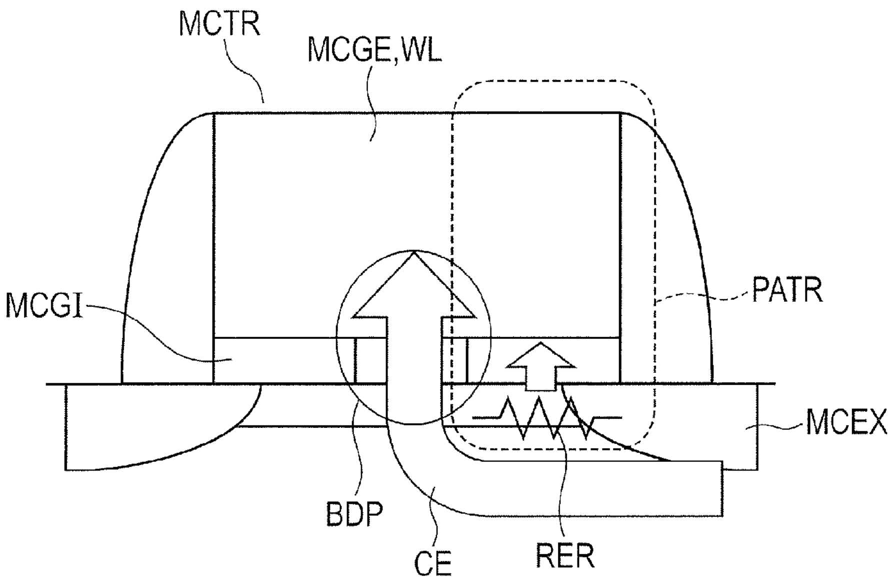
FIG. 9 is a sectional typical diagram showing a memory cell transistor having a parasitic MOS transistor, for describing the problem of the semiconductor device according to the comparative example.
Figure 10:
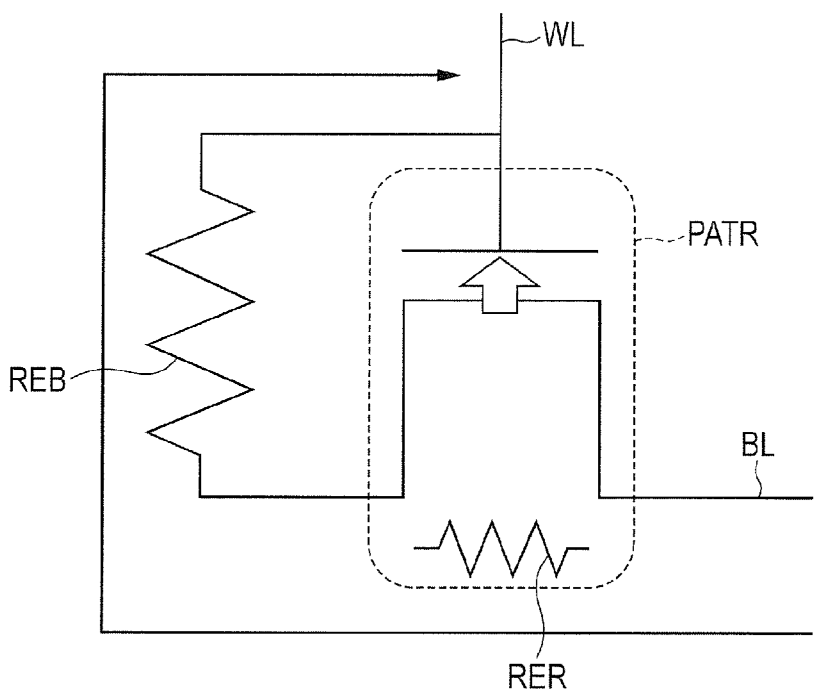
FIG. 10 is an equivalent circuit diagram of the memory cell transistor having the parasitic MOS transistor, for describing the problem of the semiconductor device according to the comparative example.

A description will next be made about variations in read-out current after the memory gate insulating film is dielectric broken. It is known that in terms of the dielectric breakdown of the memory gate insulating film, the memory gate insulating film is not dielectric broken uniformly, but dielectric broken locally (Percolation model). Here, a typical structure of the memory transistor MCTR in which the memory gate insulating film MCGI is locally dielectric broken is illustrated in FIG. 9. FIG. 9 shows one example in which a breakdown point BDP dielectric broken locally is away from the extension region MCEX. Further, an equivalent circuit diagram of the above example is illustrated in FIG. 10.

In the memory gate insulating film MCGI, a part other than the breakdown point BDP has a function as an insulating film. In this case, as shown in FIGS. 9 and 10, a part of the memory gate insulating film MCGI positioned between the breakdown point BDP and the extension region MCEX, or the like becomes a parasitic MOS transistor PAIR. Upon the read-out operation, a reversed layer is formed at a part of the P type silicon layer MCPR positioned in the parasitic MOS transistor PAIR. A read-out current (electronic CE) flows from the extension region MCEX to the memory gate electrode MCGE (word line WL) through the reversed layer and a resistor REB (breakdown point BDP) (refer to a void arrow in FIG. 9 and an arrow in FIG. 10).

In the memory transistor MCTR, the length of the reversed layer of the parasitic MOS transistor PAIR through which the read-out current flows upon the read-out operation depends on the position of the breakdown point BDP. If the breakdown point BDP is in a position closer to the extension region MCEX, the resistance value of a reversed layer resistance RER is low. As the breakdown point BDP is separated from the extension region MCEX, the resistance value of the reversed layer resistance RER becomes high. For that reason, variations occur in a detected read-out current value. As a result, the ratio (ON/OFF) between the read-out current before writing-in (OFF) and the read-out current after writing-in (ON) varies, so that a variation occurs in the read-out accuracy of information. Since the breakdown point of the gate insulating film is random in a planar type transistor as in the present memory transistor MCTR, it is difficult to control variations in the read-out current.

(Operative Effects or the Like)

In the semiconductor device according to the embodiment 1, the breakdown efficiency of the gate insulating film is particularly improved as compared with the semiconductor device according to the comparative example. That is, in the corresponding semiconductor device, the write-in operation is carried out while applying the counter voltage to the bit line, thereby making it possible to set the difference between the potential of the memory gate insulating film MCGI (interface) and the potential of the memory gate electrode MCGE to a desired potential difference and enhance the breakdown efficiency of the memory gate insulating film MCGI. This will be described based on the evaluations carried out by the present inventors.

Figure 11:
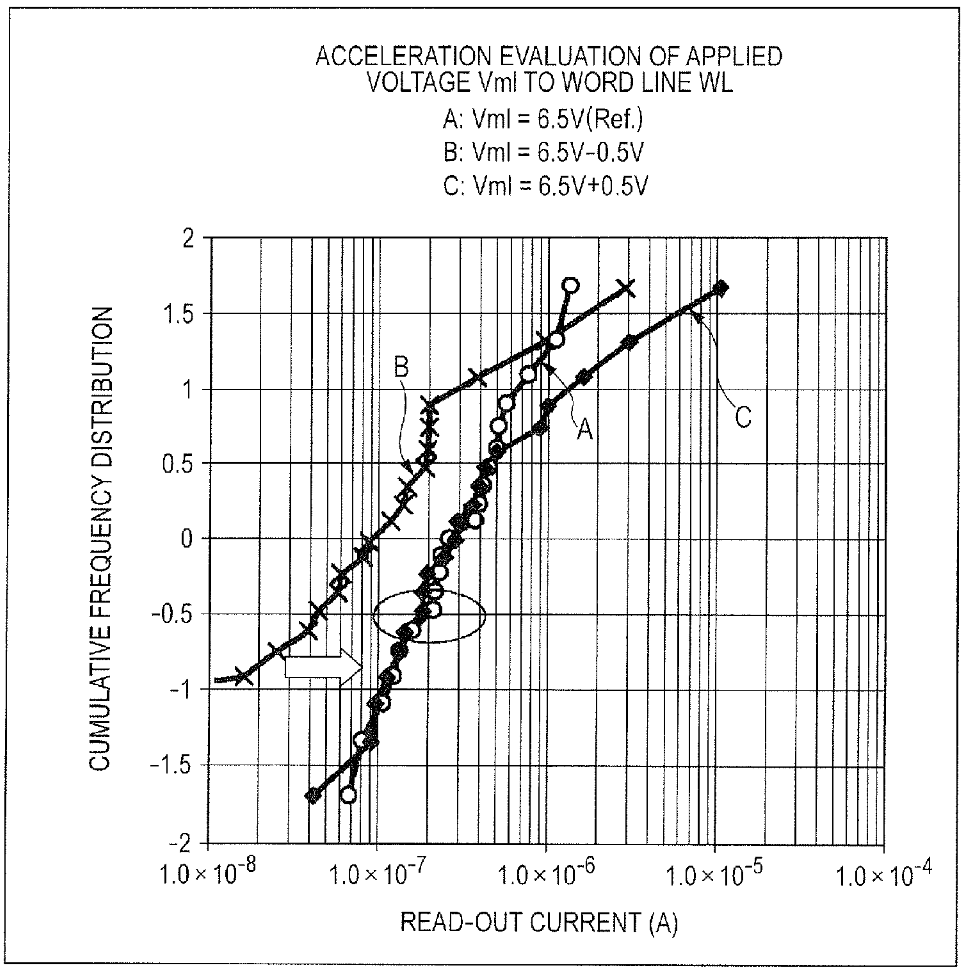
FIG. 11 is a first diagram showing a relation between a read-out current and a cumulative frequency distribution in the same embodiment.
Figure 12:
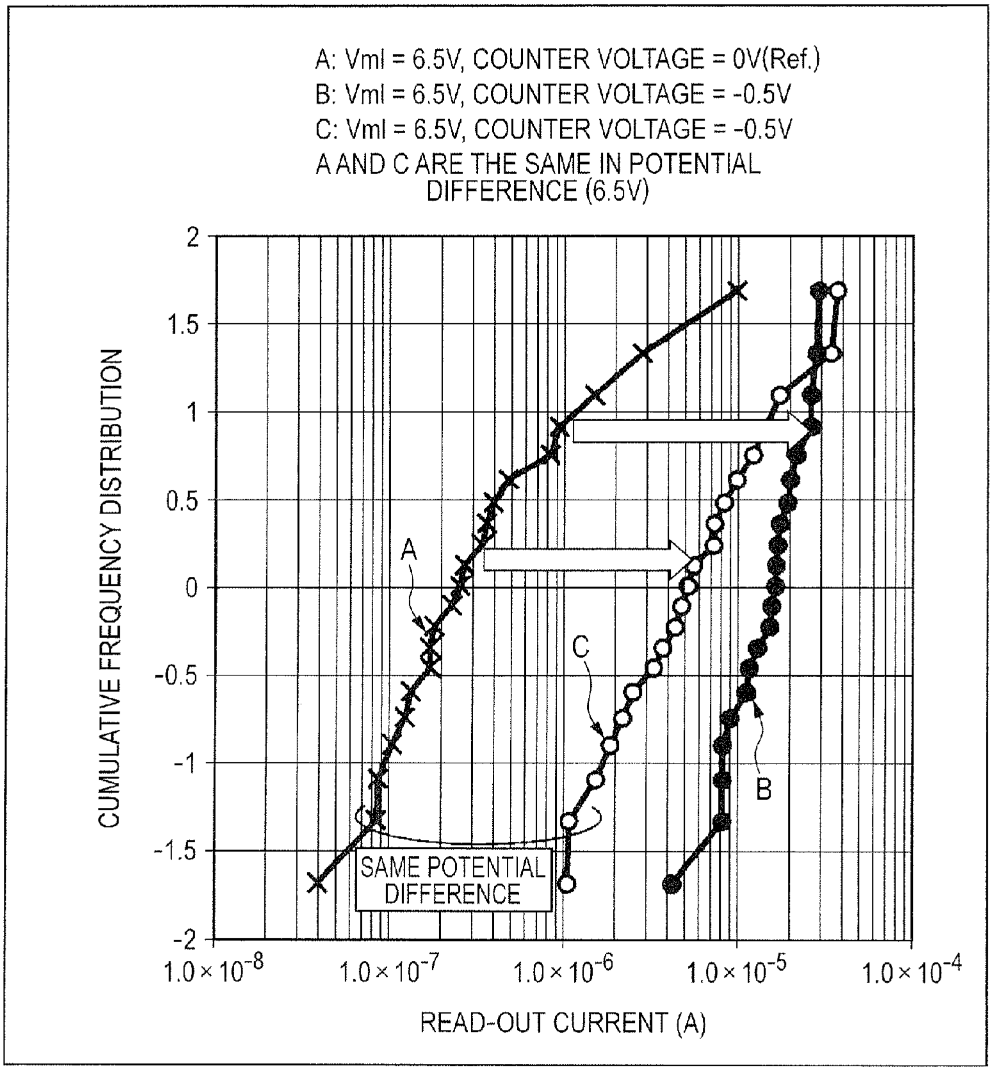
FIG. 12 is a second diagram showing a relation between a read-out current and a cumulative frequency distribution in the same embodiment.

The present inventors have carried out the read-out operation after the writing of the information into the memory cell and measured a read-out current thereat. The results of measurements are illustrated in FIGS. 11 and 12. A horizontal axis indicates a read-out current, and a vertical axis indicates a cumulative frequency distribution. First, FIG. 11 shows the results of measurements where upon the write-in operation, three types of voltages are applied as the voltage applied to the memory gate electrode.

A graph A is a measurement result where as reference data, 6.5V is applied to the memory gate electrode. A graph B is a measurement result where 6.0V (6.5V−0.5V) is applied to the memory gate electrode. A graph C is a measurement result where 7.0V (6.5V+0.5V) is applied to the memory gate electrode. Further, the voltage applied to the bit line is 0V in any case.

It was understood that when the voltage applied to the memory gate electrode was made lower than the voltage for reference, the read-out current was lowered. That is, it is understood that as shown in the graph B, when 6.0V is applied to the memory gate electrode, the read-out current is lowered as compared with the graph A (reference).

On the other hand, it was understood that even though the voltage applied to the memory gate electrode was made higher than the voltage for reference, the read-out current was only rarely raised. That is, it is understood that as shown in the graph C, even though 7.0V is applied to the memory gate electrode, the read-out current remains almost unchanged as compared with the graph A (reference) (overlapped part of graph A and graph C).

This means that there is a limit in enhancing the breakdown efficiency of the gate insulating film only by the increase in the voltage applied to the memory gate electrode. The present inventors have thought that the measurement results are due to the structure that the memory transistor MCTR is formed in the silicon layer lying over the buried oxide film BOX (refer to FIG. 2).

Next, FIG. 12 shows measurement results where the counter voltage is applied to the bit line upon the write-in operation. A graph A is a measurement result where as reference data, 6.5V is applied to the memory gate electrode and the counter voltage is not applied to the bit line. A graph B is a measurement result where 6.5V is applied to the memory gate electrode and −0.5V is applied to the bit line as the counter voltage.

It was understood that the read-out current was increased by applying the counter voltage to the bit line. That is, it is understood that as shown in the graph B, when the counter voltage of −0.5V is applied to the bit line, the read-out current is increased by two digits or so and exceeds a target read-out current as compared with the graph A (reference).

Now, a comparison is made of the differences between the potential of the memory gate electrode MCGE and the potential of the interface between the memory gate insulating film MCGI and the P type silicon layer MCPR. In the case of the graph A, the potential difference is 6.5V (6.5V−0V). On the other hand, in the case of the graph B, the potential difference is 7.0V (6.5V−(−0.5V)). There is a difference of 0.5V between the potential differences in the case of the graph A and the graph B.

Thus, in order to eliminate the difference (0.5V) between the potential differences, the potential difference was set to the same potential difference (6.5V) as the potential difference for reference, and the counter voltage was applied to the bit line to measure the read-out current. Its result of measurement is shown in a graph C. The graph C is the measurement result where 6.0V is applied to the memory gate electrode and −0.5V is applied to the bit line as the counter voltage. As shown in the graph C, even if there is provided a condition in which the potential difference is set to the same potential difference as the potential difference (6.5V) for reference, an increase in the read-out current by the application of the counter voltage to the bit line was configured, and an improvement in the breakdown efficiency of the memory gate insulating film by the application of the counter voltage to the bit line was demonstrated.

Figure 13:
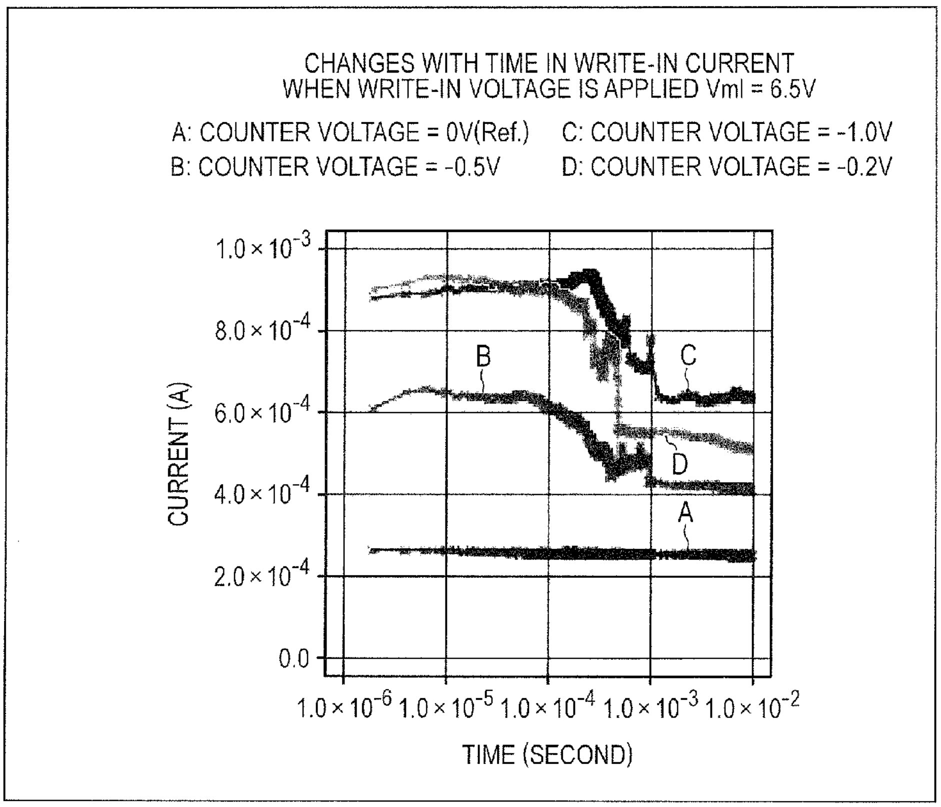
FIG. 13 is a first diagram showing changes with time in write-in current when a write-in voltage is applied in the same embodiment.

Next, the present inventors have measured changes with time in write-in current immediately after the application of a write-in voltage. Their measurement results are shown in FIG. 13. A horizontal axis of a graph indicates the time, and a vertical axis thereof indicates the value of a current that passes through the memory gate insulating film. A graph A is a measurement result where the counter voltage is not applied as a reference (0V). A graph B is a measurement result where −0.5V is applied as the counter voltage. A graph C is a measurement result where −1.0V is applied as the counter voltage. A graph D is a measurement result where −2.0V is applied as the counter voltage. Further, the voltage (Vml) applied to the memory gate electrode is 6.5V in any case.

It is understood in the graph A for reference that after the voltage (Vml) is applied to the memory gate electrode, the write-in current remains almost unchanged with time.

It is understood in the graphs B, C and D that after the voltage (Vml) is applied to the memory gate electrode, a write-in current equivalent to several times (two to four times) the write-in current in the case of the graph A flows during the order of about milliseconds as the time. This result shows that when the counter voltage is applied, gate coupling is suppressed and a large current transiently flows through the memory gate insulating film.

Increasing the write-in current (conduction amount) flowing through the memory gate insulating film shows that hot holes generated when the memory gate insulating film is dielectric broken become easy to pass through the bit line. The breakdown efficiency of the memory gate insulating film becomes high by increasing the write-in current flowing through the memory gate insulating film. When the memory gate insulating film is dielectric broken once, a dielectric broken point becomes a resistor. Therefore, after the dielectric breakdown is made, the write-in current flowing through the memory gate insulating film is saturated.

A description will next be made about the fact that the structure in which each memory cell MC is formed in the silicon layer of the SOI substrate makes it possible to obtain a desired effect by applying the counter voltage to the bit line BL.

Figure 14:
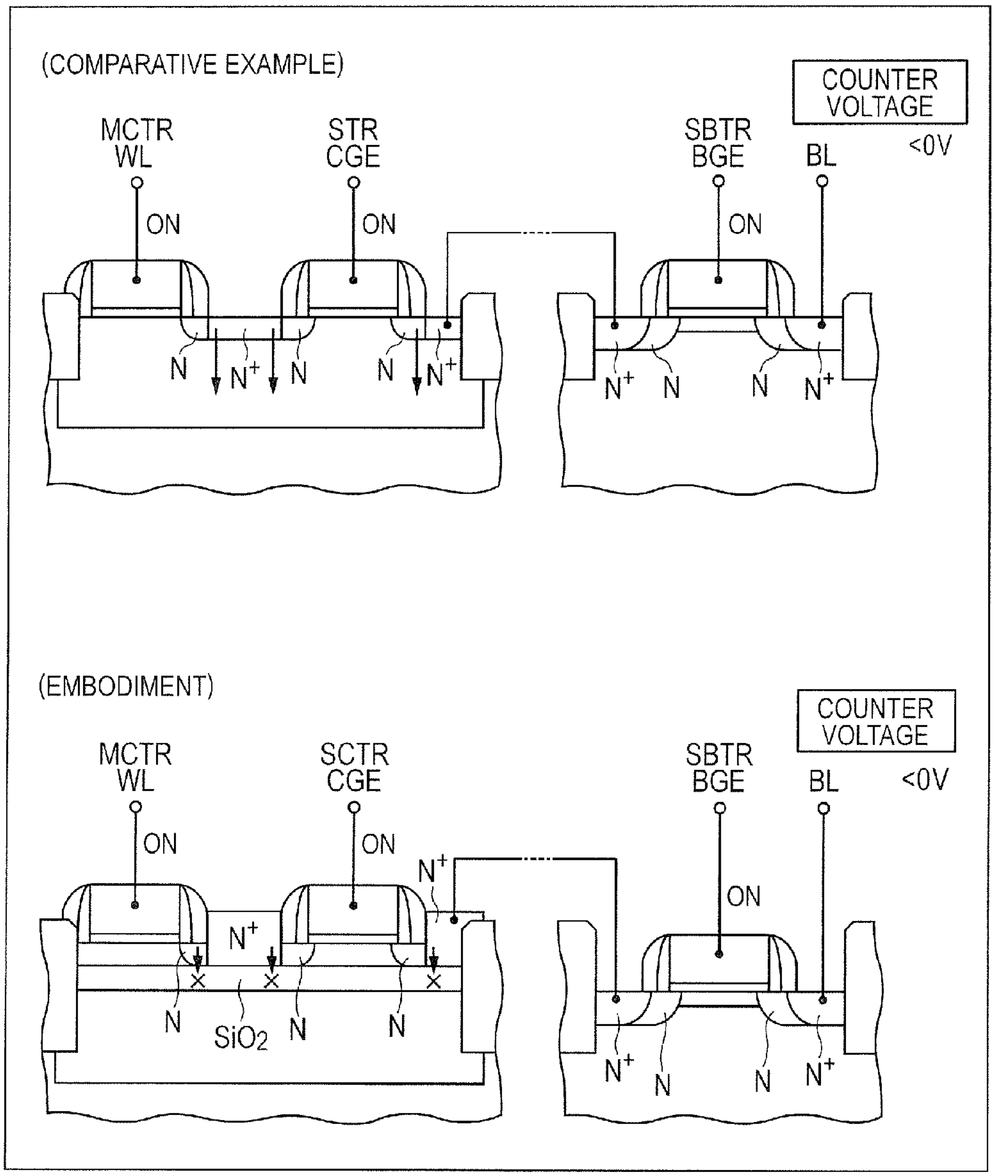
FIG. 14 is a diagram for describing the reason why a counter voltage is applicable to a bit line in the same embodiment.

A structure as a comparative example is shown in the upper drawing in FIG. 14, and a structure according to an embodiment is shown in the lower drawing in FIG. 14. While reference numerals are not given in FIG. 14 to avoid complexity of the drawing, the upper drawing corresponds to a structure in which the buried oxide film and the silicon layer are omitted from the structure shown in FIG. 5. Further, the lower drawing corresponds to the structure shown in FIG. 3.

First, assume a semiconductor device in which as shown in the upper drawing (comparative example) in FIG. 14, a memory transistor MCTR and a selection transistor STR are formed in a bulk region (semiconductor substrate). In the comparative example, a counter voltage (negative voltage) is applied to a bit line BL. In this case, in a PN junction between a source-drain region MCSD of the memory transistor MCTR and the semiconductor substrate BSUB, electrons flow from the source-drain region MCSD to the semiconductor substrate BSUB. The electrons become a leakage current. For that reason, it becomes difficult to guide the counter voltage to a part of the semiconductor substrate BSUB directly below the memory transistor MCTR.

On the other hand, in a semiconductor device in which a memory transistor MCTR and a selection core transistor SCTR are formed in a silicon layer SOI (P type silicon layer MCPR) as shown in the lower drawing (embodiment) in FIG. 14, a buried oxide film BOX is interposed between the P type silicon layer MCPR and a semiconductor substrate BSUB. Therefore, a PN junction between a source-drain region MCSD and the P type silicon layer MCPR and the semiconductor substrate BSUB are electrically shut down by the buried oxide film BOX.

Thus, even if the counter voltage (negative voltage) is applied to the bit line, a leakage current only rarely flows from the memory transistor MCTR to the semiconductor substrate BSUB. As a result, the difference in potential between a memory gate electrode MCGE and the P type silicon layer MCPR can be set to a desired potential difference by applying the counter voltage. The breakdown efficiency of the memory gate insulating film MCGI can be enhanced.

Figure 15:
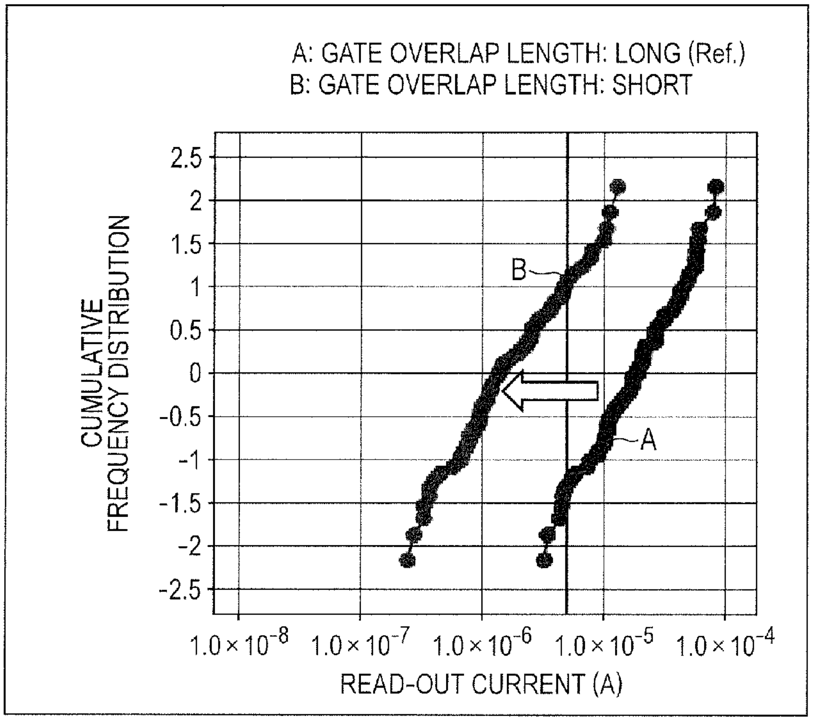
FIG. 15 is a diagram showing the dependency of the relation between the read-out current and the cumulative frequency distribution on a gate overlap length in the same embodiment.

A description will next be made about a relation between an overlap length between an extension region and a memory gate electrode, and a read-out current. The present inventors have performed a read-out operation after writing-in of information with respect to a memory transistor having a relatively short overlap length and a memory transistor having a relatively long overlap length and have measured read-out currents thereat. The measured results are shown in FIG. 15.

A horizontal axis indicates a read-out current, and a vertical axis indicates a cumulative frequency distribution. A graph A shows as a reference, a measurement result made on the memory transistor having the relatively long overlap length. A graph B is a measurement result made on the memory transistor having the relatively short overlap length.

As already mentioned, it has generally been known as the effective method of suppressing the leakage current that the gate overlap length between the extension region and the gate electrode is made short, and the gate induction drain leak (GIDL) assumed to be one offleak source is reduced.

There is however brought about a structure that when the gate overlap length is short, the voltage of the bit line BL acts on the memory gate electrode MCGE through the reversed layer formed directly below the memory gate electrode MCGE. Therefore, it becomes easy to receive the influence of the gate coupling of the memory gate electrode MCGE. The breakdown efficiency of the gate insulating film becomes low. As a result, it is understood that as apparent from the comparison between the graph A and the graph B, the read-out current becomes low when the gate overlap length is relatively short.

Figure 16:
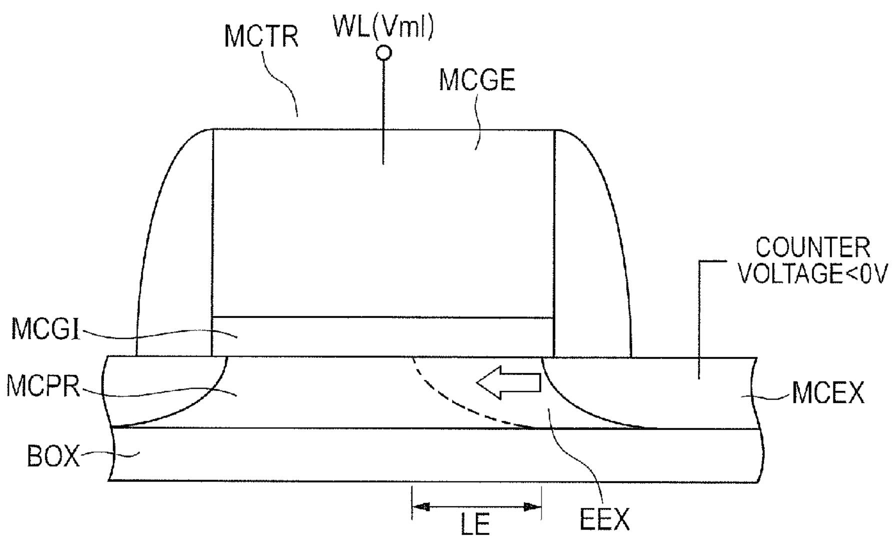
FIG. 16 is a sectional typical diagram showing the manner in which a depletion layer is extended at the time of the write-in operation in the same embodiment.

In the semiconductor device according to the embodiment 1, the counter voltage is applied to the bit line when the write-in operation is performed. As shown in FIG. 16, when the counter voltage is applied, a depletion layer EEX extends from the interface between the extension region and the P type silicon layer MCPR to the P type silicon layer MCPR. Therefore, even when the overlap length between the memory gate electrode MCGE and the extension region MCEX is short, the overlap length LE can be made long electrically.

Figure 17:
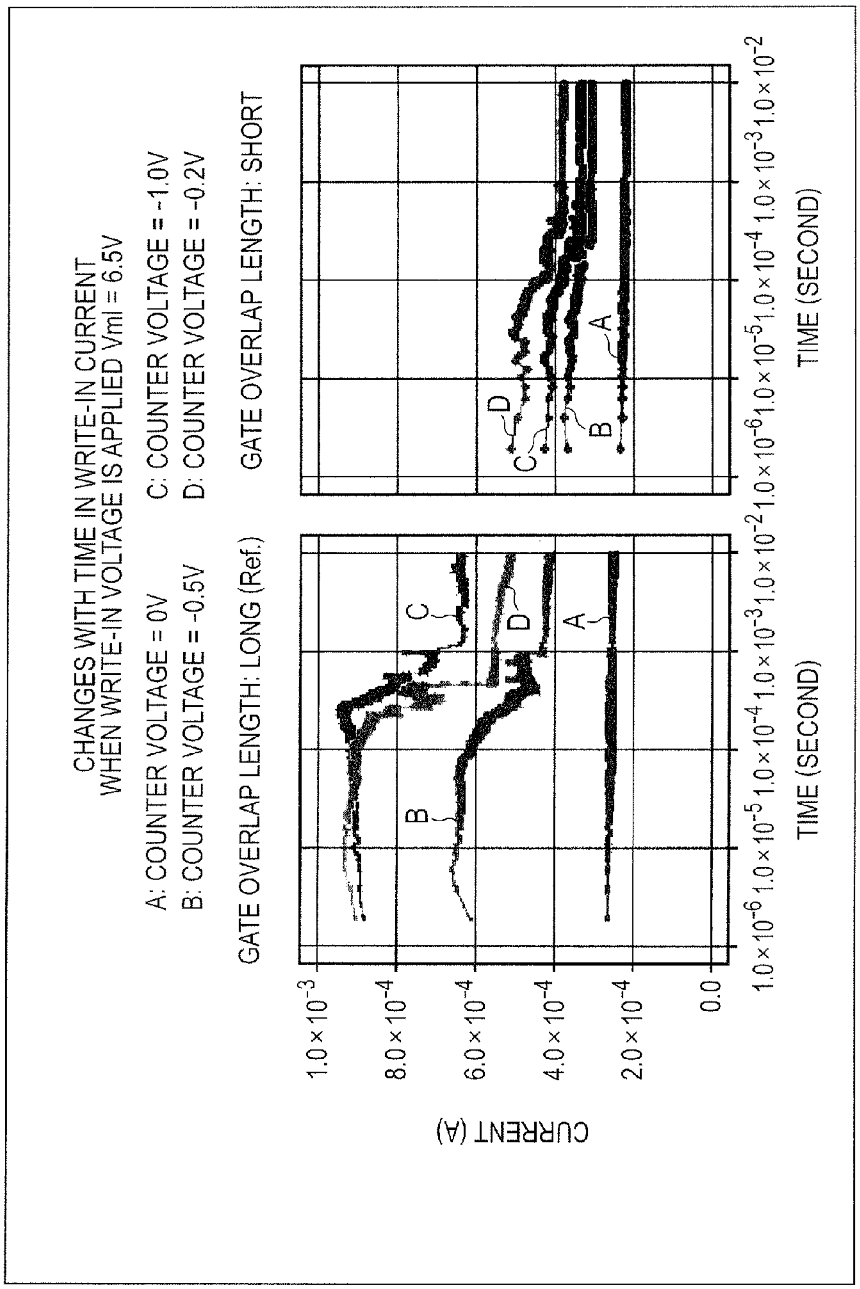
FIG. 17 is a second diagram showing changes with time in write-in current when a write-in voltage is applied in the same embodiment.

Now, the present inventors have measured changes with time in write-in current immediately after the application of a write-in voltage where physically, the gate overlap length is relatively long (case A: reference) and the gate overlap length is relatively short (case B: underlap). Graphs of their measurement results are shown in FIG. 17. The case A corresponds to the graphs shown in the left drawing. The case B corresponds to the graphs shown in the right drawing. A horizontal axis indicates the time, and a vertical axis indicates the value of a current passing through the gate insulating film.

The graph A is a measurement result where the counter voltage is not applied (0V). The graph B is a measurement result where −0.5V is applied as the counter voltage. The graph C is a measurement result where −1.0V is applied as the counter voltage. The graph D is a measurement result where −2.0V is applied as the counter voltage. Further, the voltage (Vml) applied to the memory gate electrode is 6.5V in any case.

As for both the case A and the case B, it is understood in the graphs A that after the write-in voltage is applied, the write-in current remains almost unchanged with time. Next, in the case A, when the counter voltage is increased, a write-in current equivalent to about several times (two to four times) the write-in current in the graph A flows for the order of about milliseconds after the application of the write-in voltage. After the write-in current flows and the gate insulating film is dielectric broken, the write-in current is saturated (graphs B to D).

On the other hand, it is understood in the case B that when the counter voltage is increased, the value of the write-in current is low as compared with the case A, but the write-in current flows for the order of about milliseconds after the application of the write-in voltage. It is understood that after the write-in current flows and the gate insulting film is dielectric broken, the write-in current is saturated (graphs B to D).

That is, it is understood that the changes with time in write-in current in the case of the case B show a tendency similar to the changes with time in write-in current in the case of the case A. This means that even when the overlap length is short (underlap), the depletion layer is electrically extended by raising the counter voltage so that the overlap length can be ensured.

Thus, in the semiconductor device AFM according to the embodiment 1, the breakdown efficiency of the memory gate insulating film MCGI can be enhanced by applying the counter voltage to the bit line BL. As a result, it is possible to increase the read-out current and improve the accuracy of reading out information.

(Manufacturing Method)

Figure 18:
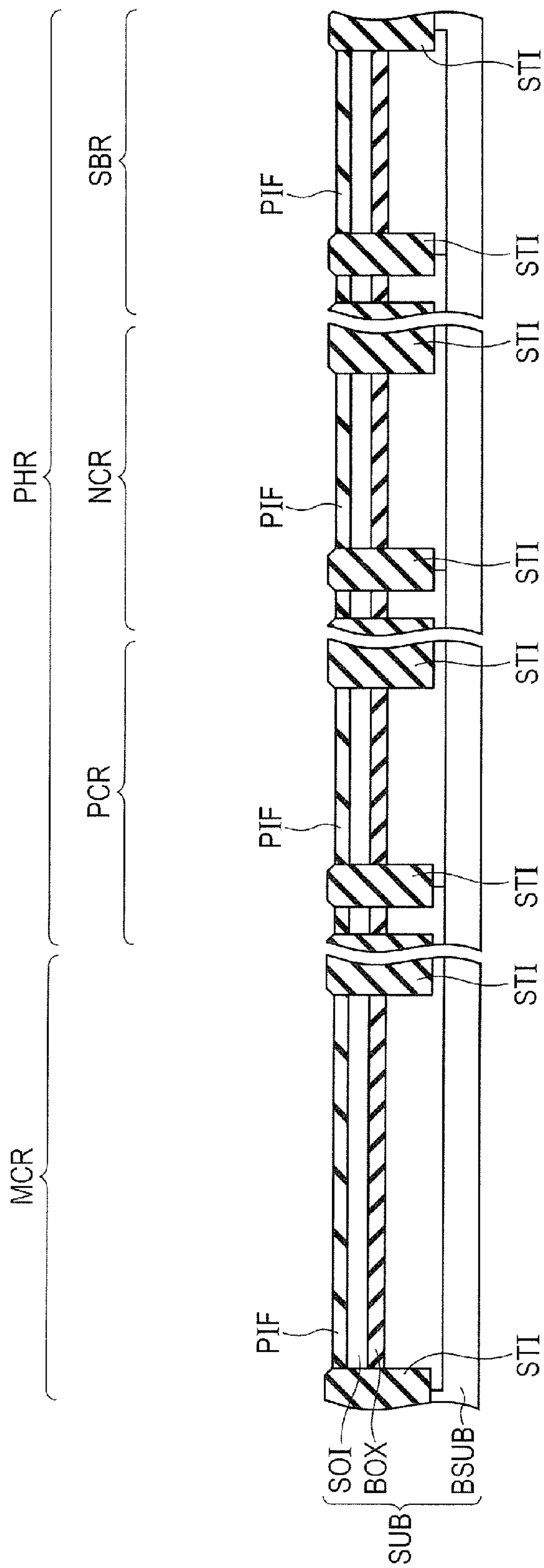
FIG. 18 is a sectional diagram showing one process of a manufacturing method of the semiconductor device in the same embodiment.

A description will next be made about one example of a method for manufacturing the above-described semiconductor device. First, an SOI substrate SUB is provided in which a silicon layer SOI is formed over a semiconductor substrate BSUB with a buried oxide film BOX interposed therebetween (refer to FIG. 18). Next, as shown in FIG. 18, a shallow trench isolation insulating film STI is formed in a predetermined region in the SOI substrate SUB.

A memory cell region MCR and a peripheral circuit region PHR are defined by the shallow trench isolation insulating film STI. Also, in the peripheral circuit region PHR, a selection bulk transistor region SBR, a P type core transistor region PCR, and an N type core transistor region NCR are further defined. Next, a pad oxide film PIF is formed at the surface of the silicon layer SOI.

Figure 19:
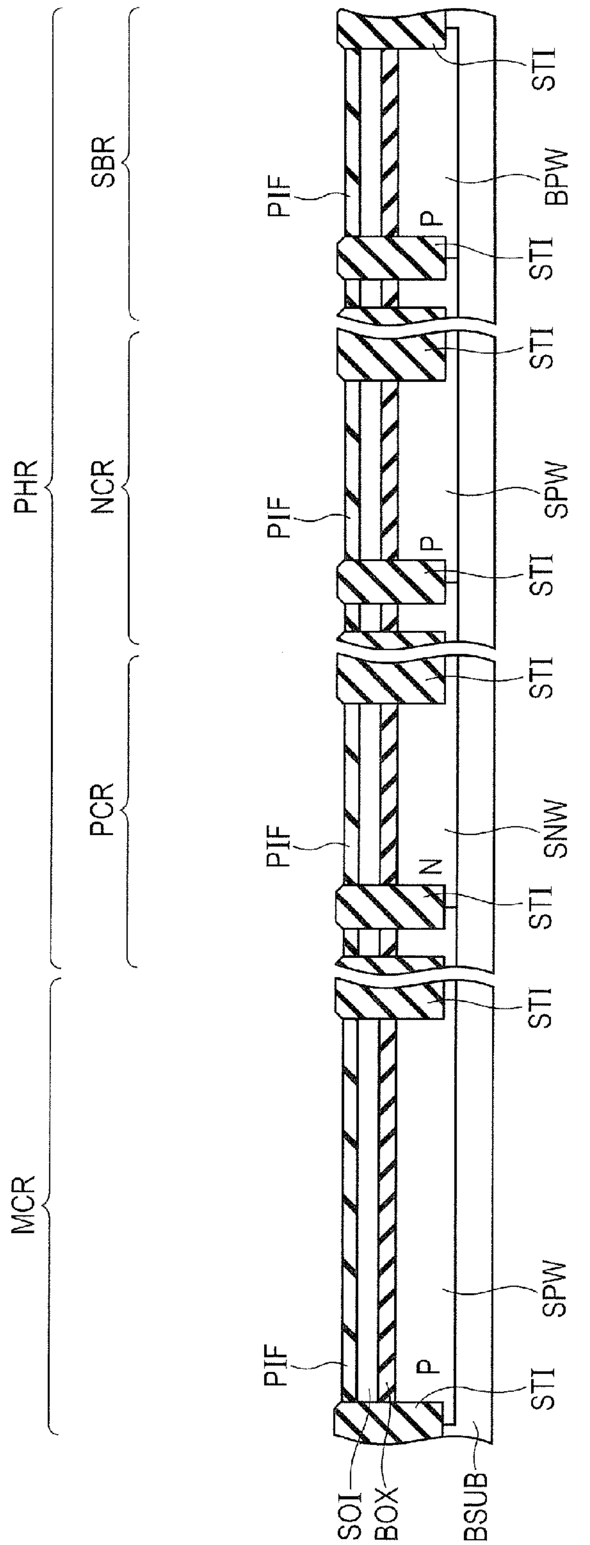
FIG. 19 is a sectional diagram showing a process performed after the process shown in FIG. 18 in the same embodiment.

Next, predetermined photoengraving processing and ion implantation processing are sequentially performed. Thus, as shown in FIG. 19, a P type well SPW is formed in the memory cell region MCR. A P type well BPW is formed in the selection bulk transistor region SBR. An N type well SNW is formed in the P type core transistor region PCR. A P type well SPW is formed in the N type core transistor region NCR.

Figure 20:
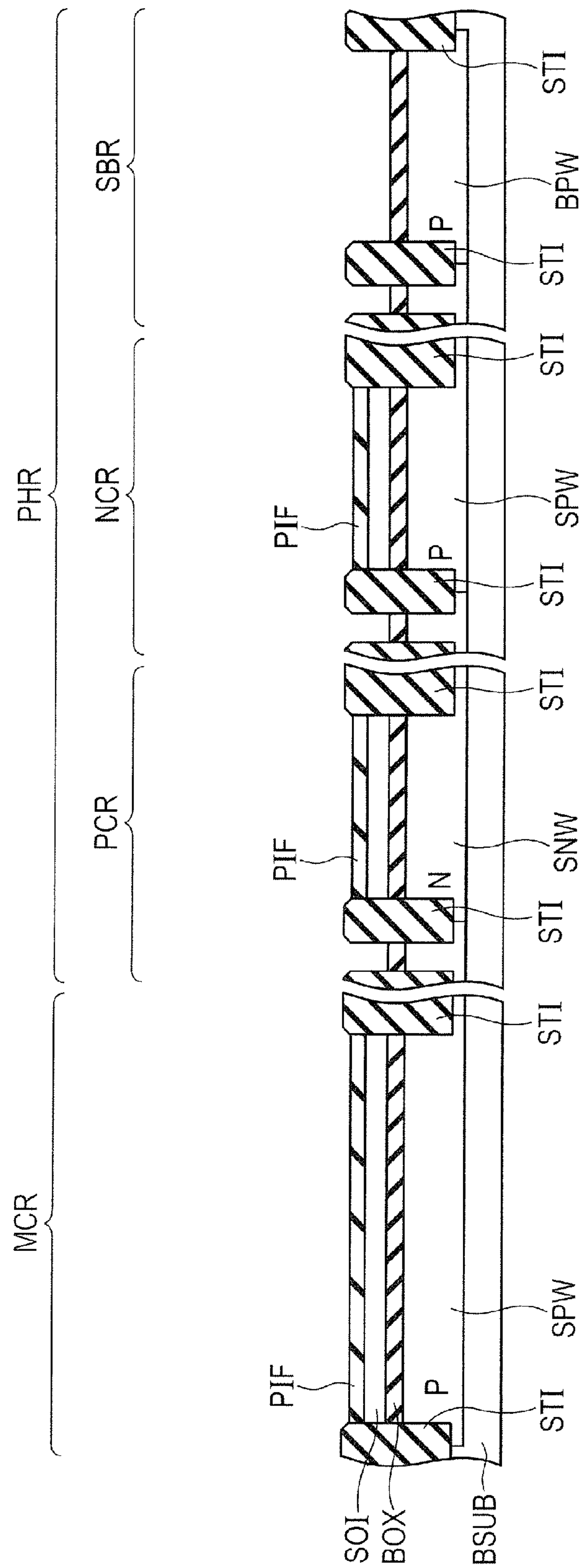
FIG. 20 is a sectional diagram showing a process performed after the process shown in FIG. 19 in the same embodiment.
Figure 21:
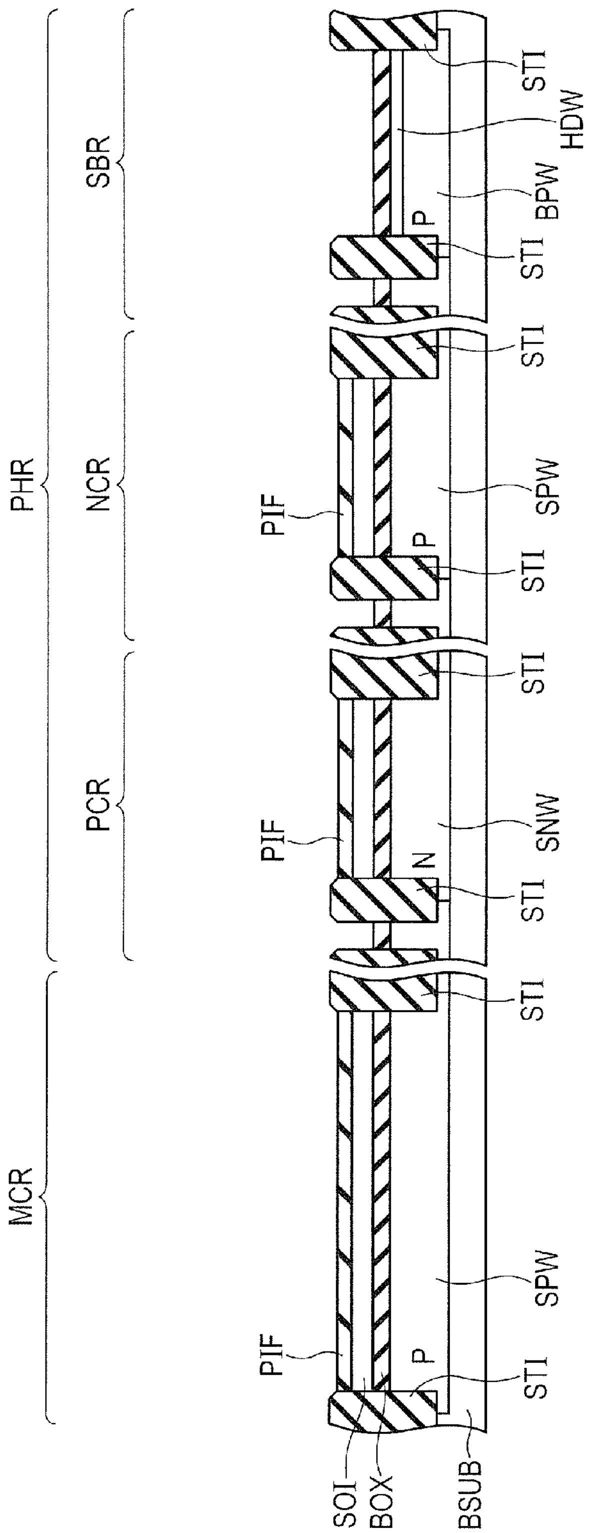
FIG. 21 is a sectional diagram showing a process performed after the process shown in FIG. 20 in the same embodiment.

Next, predetermined photoengraving processing and etching processing are performed to thereby remove the pad oxide film PIF and the silicon layer SOI positioned in the selection bulk transistor region SBR as shown in FIG. 20. Next, predetermined photoengraving processing and implantation processing are performed to thereby form a high concentration well HDW in the P type well BPW positioned in the selection bulk transistor region SBR as shown in FIG. 21.

Figure 22:
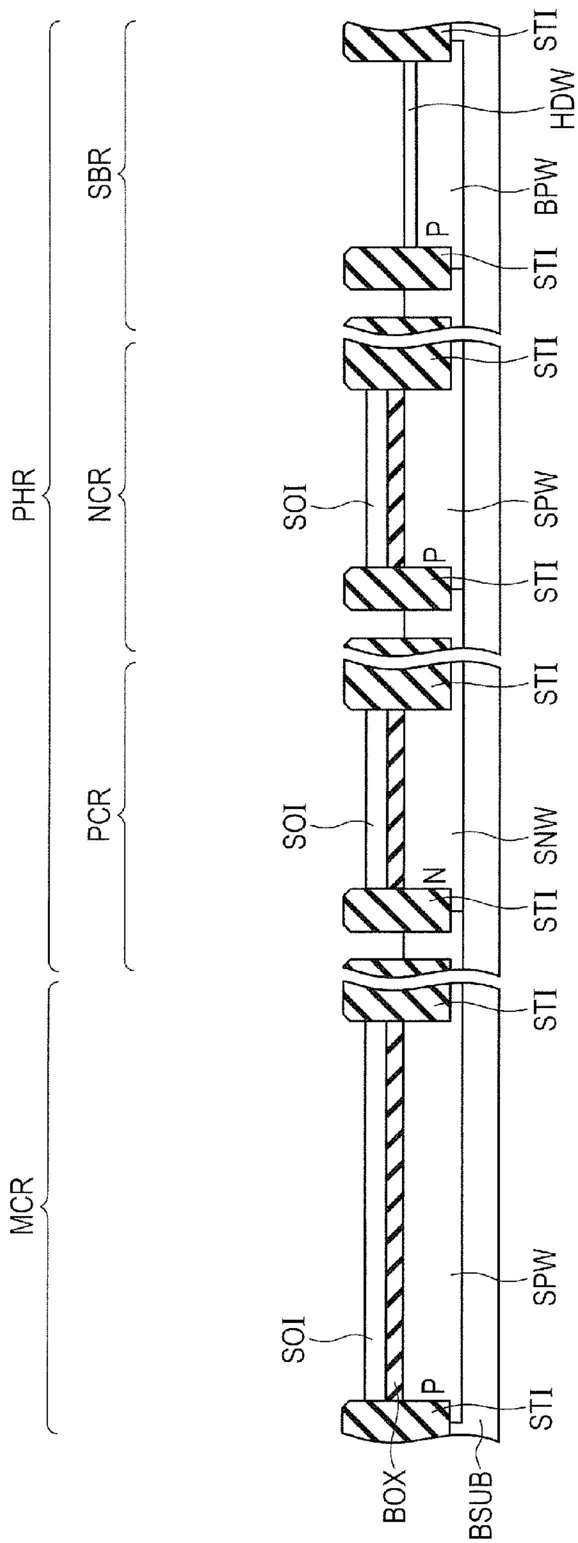
FIG. 22 is a sectional diagram showing a process performed after the process shown in FIG. 21 in the same embodiment.

Next, as shown in FIG. 22, predetermined etching processing is performed to thereby remove the pad oxide film PIF in each of the memory cell region MCR, the P type core transistor region PCR, and the N type core transistor region NCR. The buried oxide film BOX is removed in the selection bulk transistor region.

Figure 23:
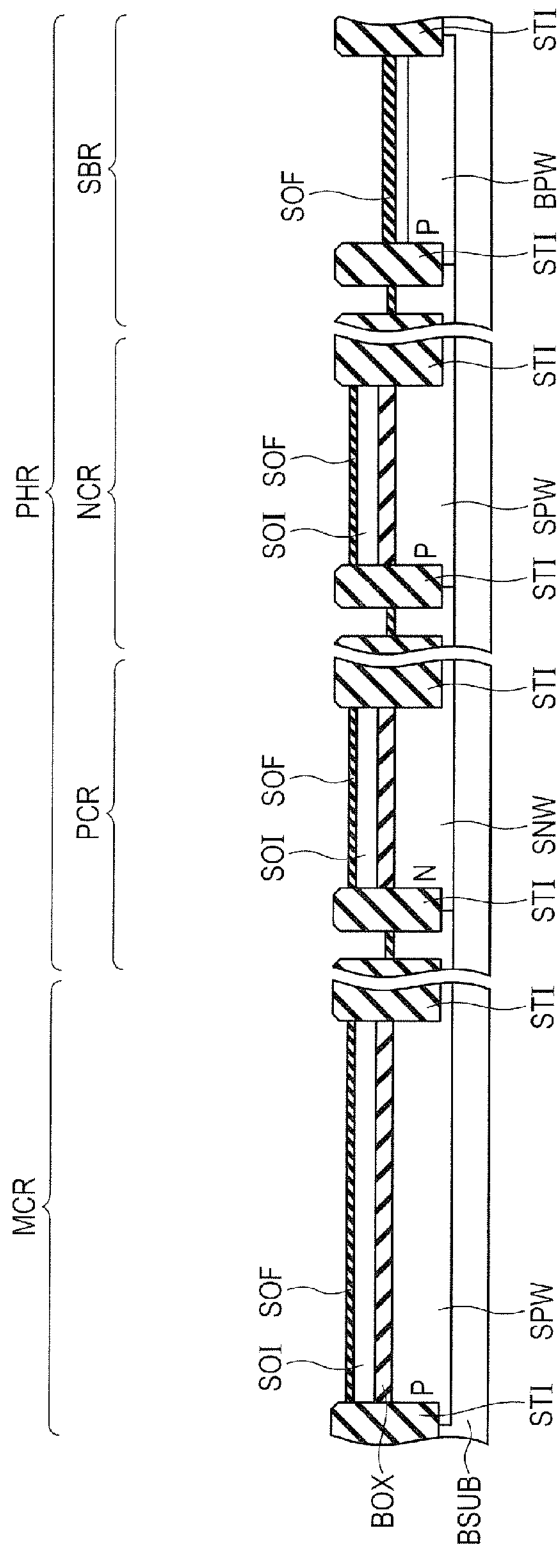
FIG. 23 is a sectional diagram showing a process performed after the process shown in FIG. 22 in the same embodiment.
Figure 24:
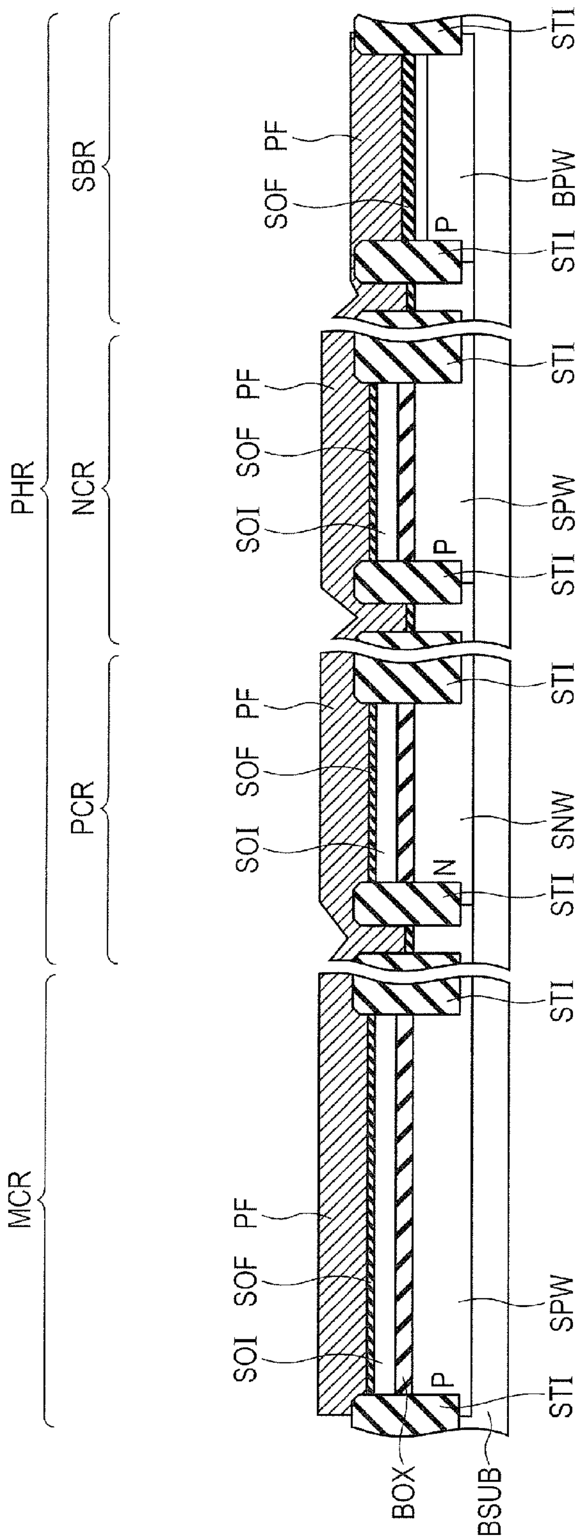
FIG. 24 is a sectional diagram showing a process performed after the process shown in FIG. 23 in the same embodiment.

Next, as shown in FIG. 23, thermal oxidation processing is performed to thereby form a silicon oxide film SOF at the surface of the exposed silicon layer SOI and the surface of the semiconductor substrate BSUB. Then, as shown in FIG. 24, a polysilicon film PF is formed so as to cover the silicon oxide film SOF by a CVD (Chemical Vapor Deposition) method. A conductivity type of the polysilicon film PF is assumed to be a P type.

Next, a silicon nitride film (not shown) to be a hard mask is formed so as to cover the polysilicon film PF. Then, predetermined photoengraving processing and etching processing are performed to thereby form a resist pattern (not shown) for patterning a gate electrode. Next, etching processing is performed on the silicon nitride film with the resist pattern as an etching mask to thereby form a hard mask HM (refer to FIG. 25) corresponding to the pattern for the gate electrode. Further, etching processing is performed on the polysilicon film PF and the like with the resist pattern and the hard mask as etching masks. Afterwards, the resist pattern is removed.

Figure 25:
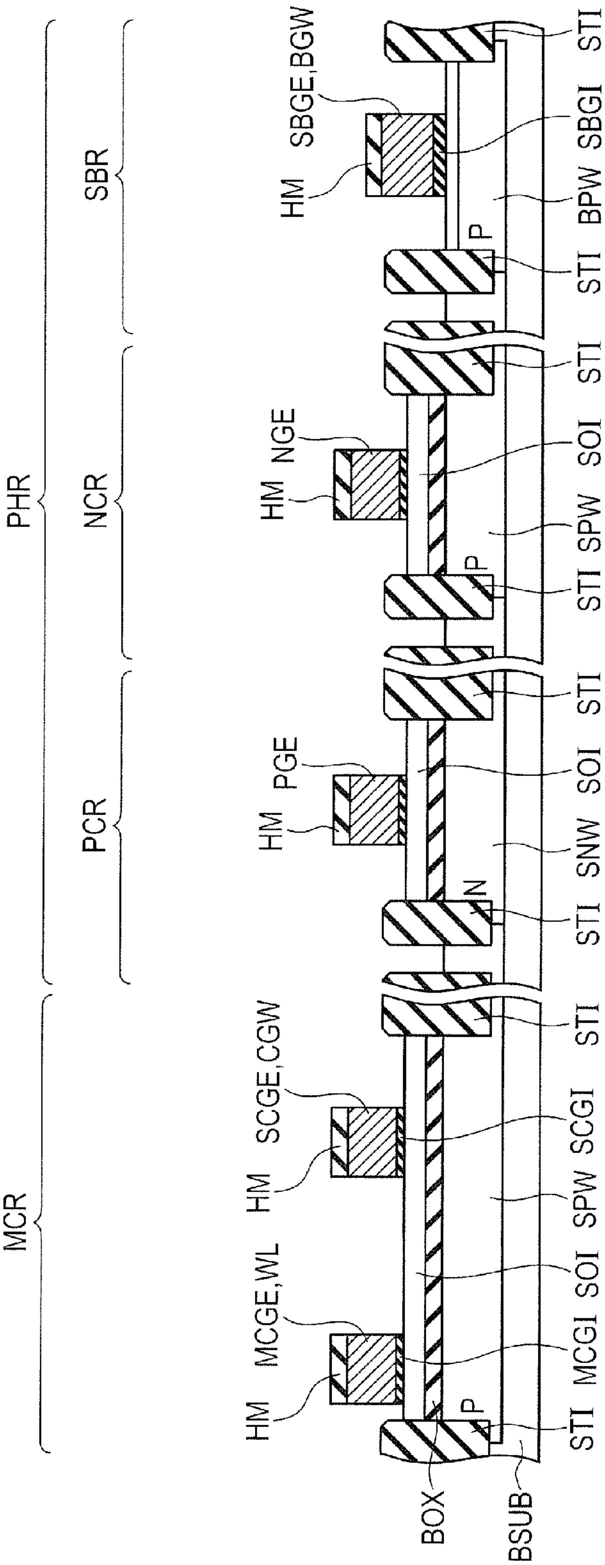
FIG. 25 is a sectional diagram showing a process performed after the process shown in FIG. 24 in the same embodiment.

Thus, as shown in FIG. 25, a memory gate electrode MCGE and a selection core gate electrode SCGE are formed in the memory cell region MCR. The memory gate electrode MCGE is formed over the silicon layer SOI with a memory gate insulating film MCGI interposed therebetween. The selection core gate electrode SCGE is formed over the silicon layer SOI with a selection core gate insulating film SCGI interposed therebetween. A gate electrode SBGE is formed in the selection bulk transistor region SBR. The gate electrode SBGE is formed over the semiconductor substrate BSUB with a gate insulating film SBGI interposed therebetween. A gate electrode PGE is formed in the P type core transistor region PCR. A gate electrode NGE is formed in the N type core transistor region NCR.

Figure 26:
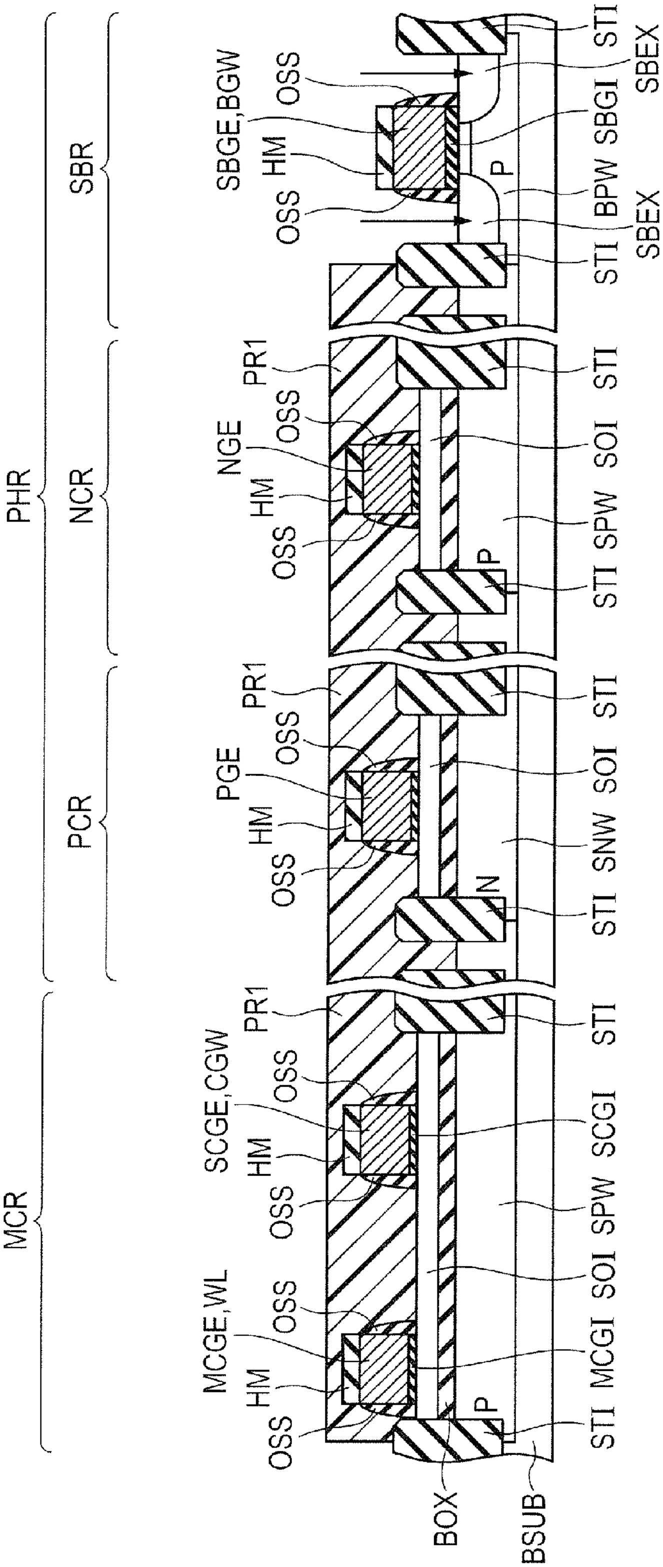
FIG. 26 is a sectional diagram showing a process performed after the process shown in FIG. 25 in the same embodiment.

Next, an offset spacer film OSS (refer to FIG. 26) is formed over the side faces of the memory gate electrode MCGE, the selection core gate electrode SCGE, and the gate electrode SBGE, etc. respectively. Then, as shown in FIG. 26, predetermined photoengraving processing is performed to thereby form a resist pattern PR1 which exposes the selection bulk transistor region SBR and covers other regions. Next, an N type impurity is implanted with the resist pattern PR1 as an implantation mask to thereby form an extension region SBEX. Afterwards, the resist pattern PR1 is removed.

Next, for example, a silicon nitride film (not shown) is formed so as to cover the offset spacer film OSS. Then, a part of the silicon nitride film which covers the selection bulk transistor region SBR is removed. Next, a resist pattern PR2 (refer to FIG. 27) which covers the selection bulk transistor region SBR is formed.

Figure 27:
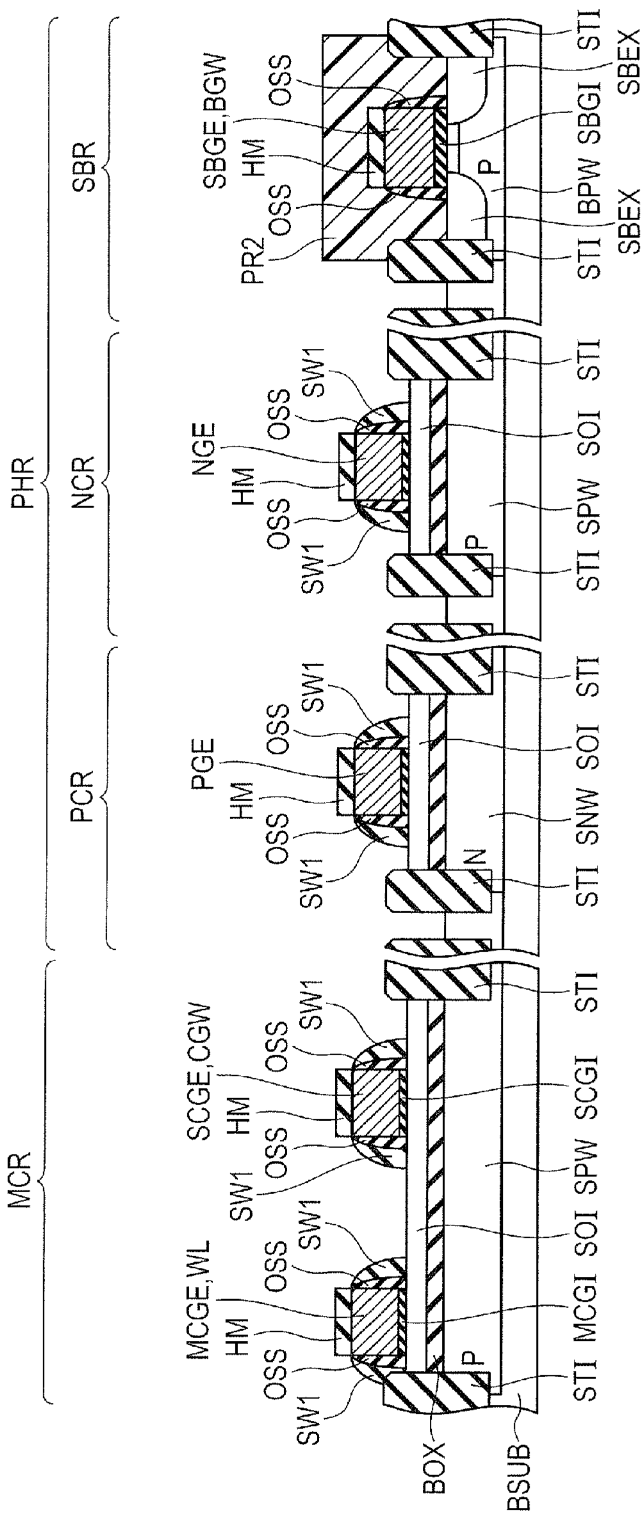
FIG. 27 is a sectional diagram showing a process performed after the process shown in FIG. 26 in the same embodiment.

Next, anisotropic etching processing is performed on the exposed silicon nitride film with the resist pattern PR2 as an etching mask. Thus, as shown in FIG. 27, a sidewall insulating film SW1 is formed so as to cover the offset spacer film OSS positioned at the side face of each of the memory gate electrode MCGE, the selection core gate electrode SCGE, and the gate electrodes PGE and NGE. Afterwards, the resist pattern PR2 is removed.

Figure 28:
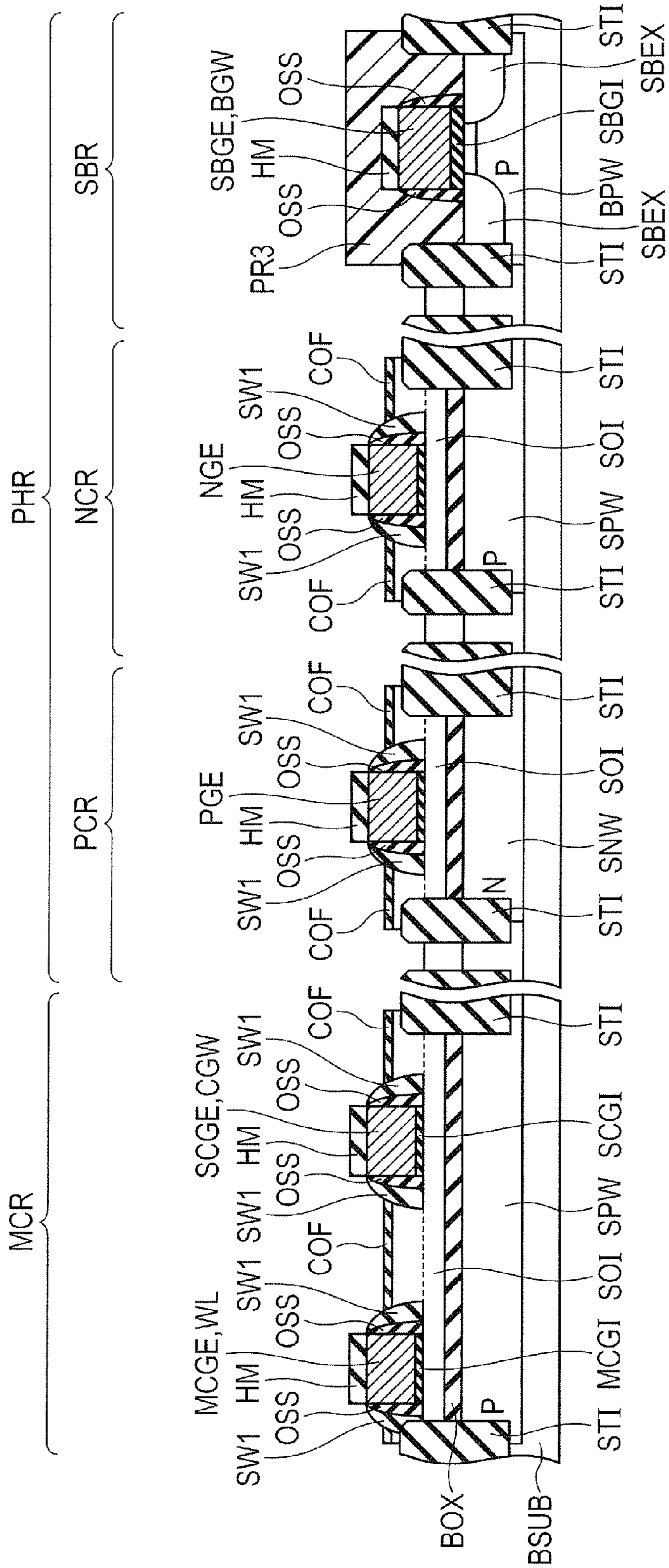
FIG. 28 is a sectional diagram showing a process performed after the process shown in FIG. 27 in the same embodiment.

Next, an elevated epitaxial layer (elevated portion (with no reference numeral)) is formed at the surface of the silicon layer SOI by an epitaxial growth method (refer to FIG. 28). Then, a silicon oxide film COF is formed so as to cover the surface of the elevated epitaxial layer. Next, as shown in FIG. 28, predetermined photoengraving processing is performed to thereby form a resist pattern PR3 which covers the selection bulk transistor region SBR and exposes other regions.

Figure 29:
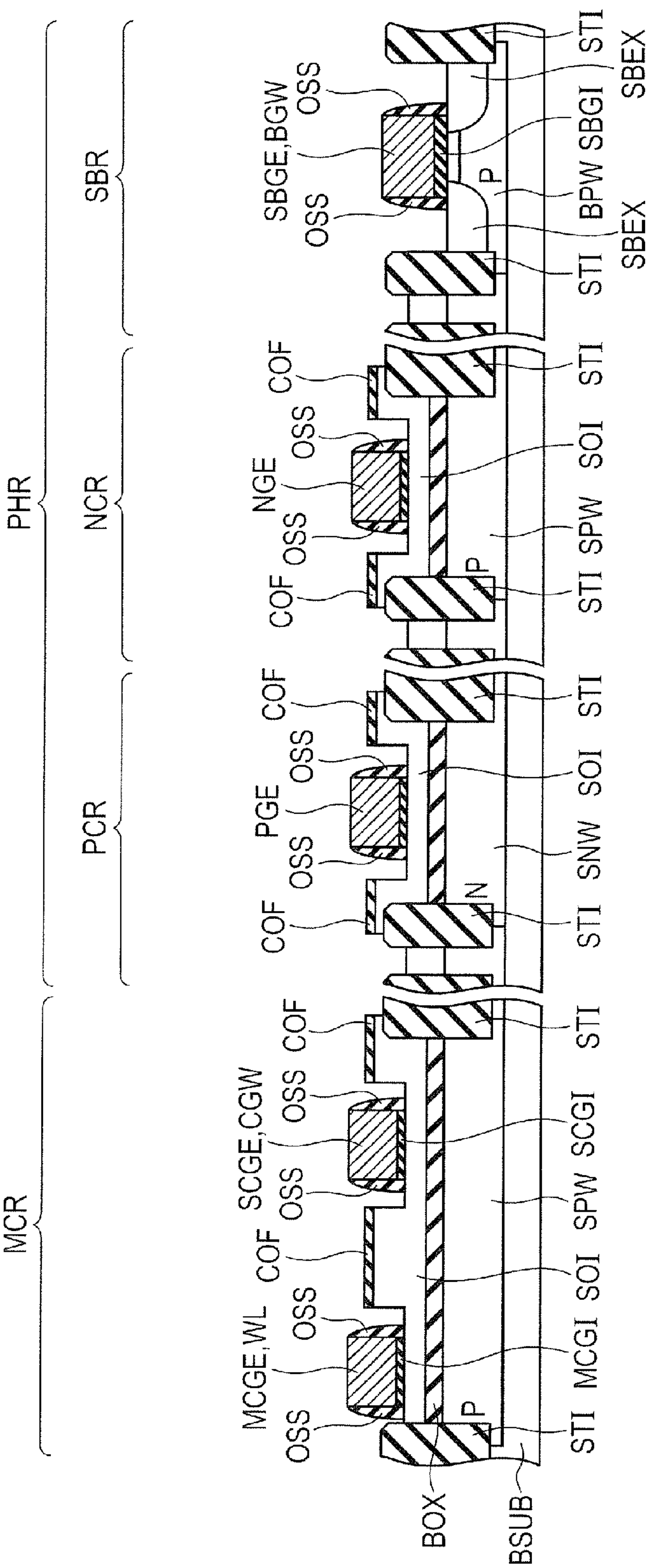
FIG. 29 is a sectional diagram showing a process performed after the process shown in FIG. 28 in the same embodiment.

Next, wet etching processing is performed with the resist pattern PR3 as an etching mask to thereby remove the sidewall insulting film SW1 as shown in FIG. 29. After the resist pattern PR3 is removed, the hard mask HM is further removed.

Next, a silicon nitride film (not shown) is formed so as to cover the gate electrode SBGE and the like. Then, a resist pattern (not shown) is formed which covers the selection bulk transistor region SBR and exposes other regions. Next, wet etching processing is performed with the resist pattern as an etching mask to thereby remove the silicon nitride film located in the regions other than the selection bulk transistor region SBR. Then, a resist pattern PR4 (refer to FIG. 30) which exposes the selection bulk transistor region SBR and over other regions is formed.

Figure 30:
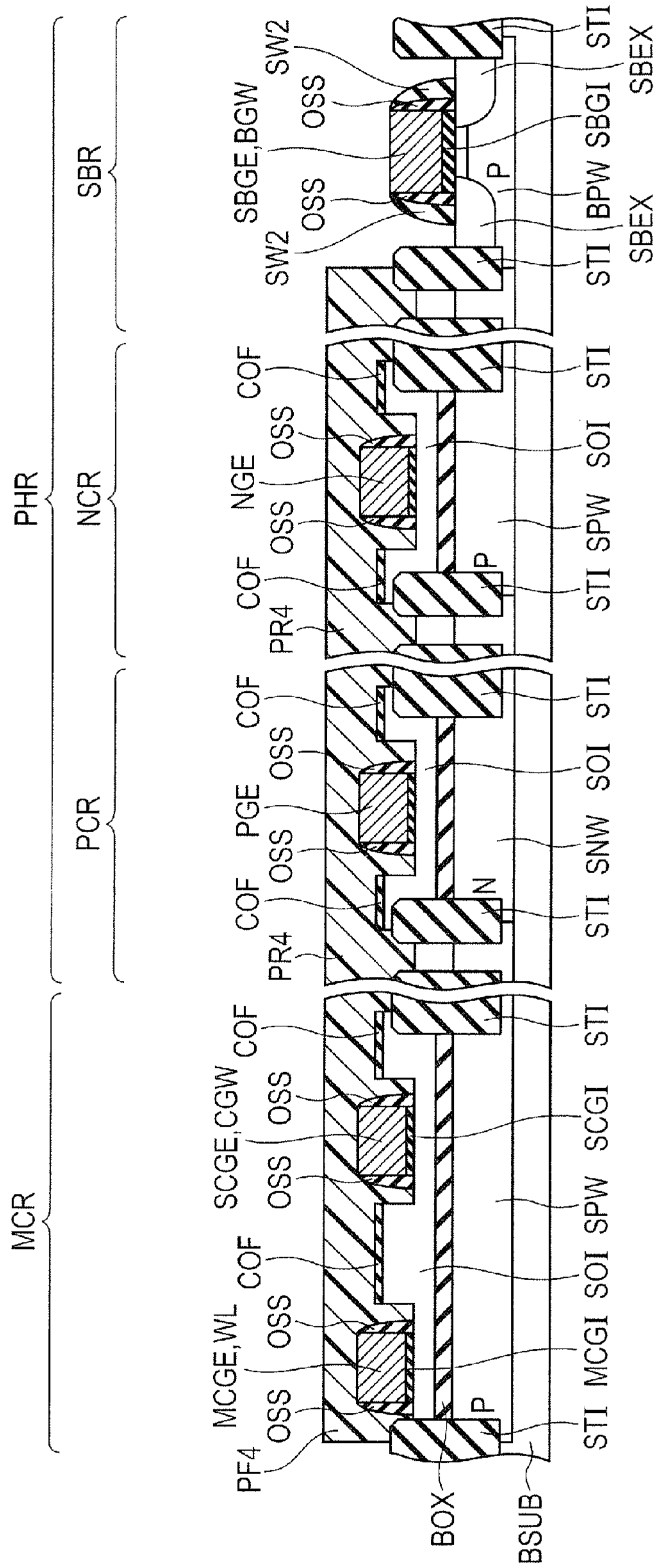
FIG. 30 is a sectional diagram showing a process performed after the process shown in FIG. 29 in the same embodiment.

Next, as shown in FIG. 30, anisotropic etching is performed on the silicon nitride film with the resist pattern PR4 as an etching mask to thereby form a sidewall insulating film SW2 so as to cover the offset spacer film OSS positioned at the side face of the gate electrode SBGE. Afterwards, the resist pattern PR4 is removed.

Figure 31:
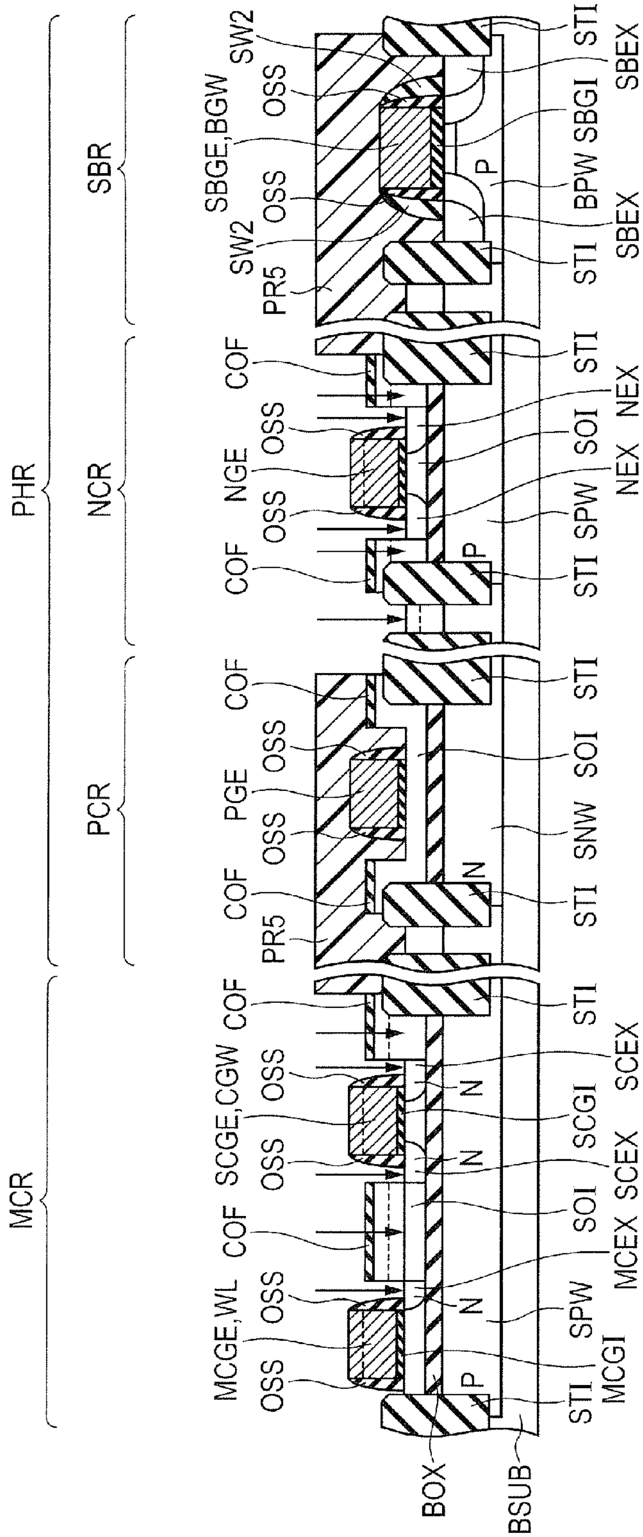
FIG. 31 is a sectional diagram showing a process performed after the process shown in FIG. 30 in the same embodiment.

Next, as shown in FIG. 31, predetermined photoengraving processing is performed to thereby form a resist pattern PR5 which exposes the memory cell region MCR and the N type core transistor region NCR and covers the P type core transistor region PCR and the selective bulk transistor region SBR. Then, an N type impurity is implanted with the resist pattern PR5 as an implantation mask to thereby form an extension region MCEX and an extension region SCEX in the memory cell region MCR. An extension region NEX is formed in the N type core transistor region NCR. Afterwards, the resist pattern PR5 is removed.

Figure 32:
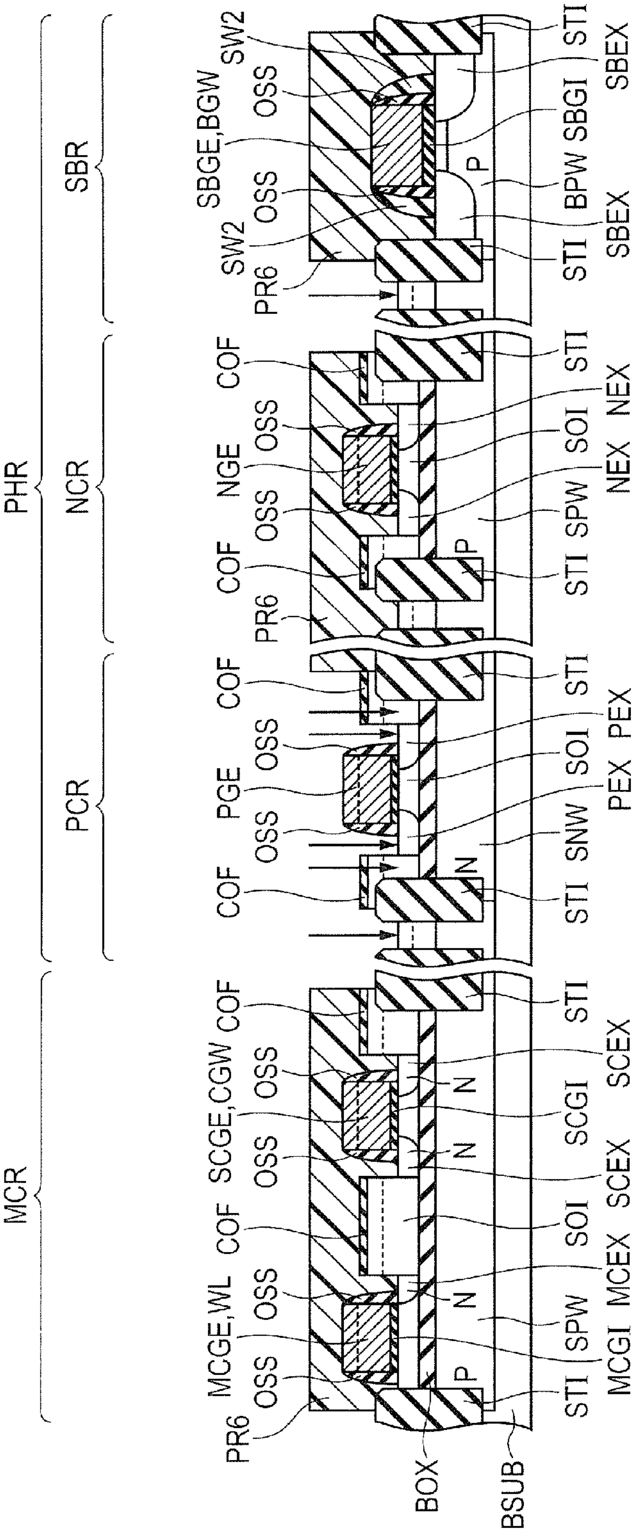
FIG. 32 is a sectional diagram showing a process performed after the process shown in FIG. 31 in the same embodiment.

Next, as shown in FIG. 32, predetermined photoengraving processing is performed to thereby form a resist pattern PR6 which exposes the P type core transistor region PCR and covers other regions. Then, a P type impurity is implanted with the resist pattern PR6 as an implantation mask to thereby form an extension region PEX in the P type core transistor region PCR. Afterwards, the resist pattern PR6 is removed.

Figure 33:
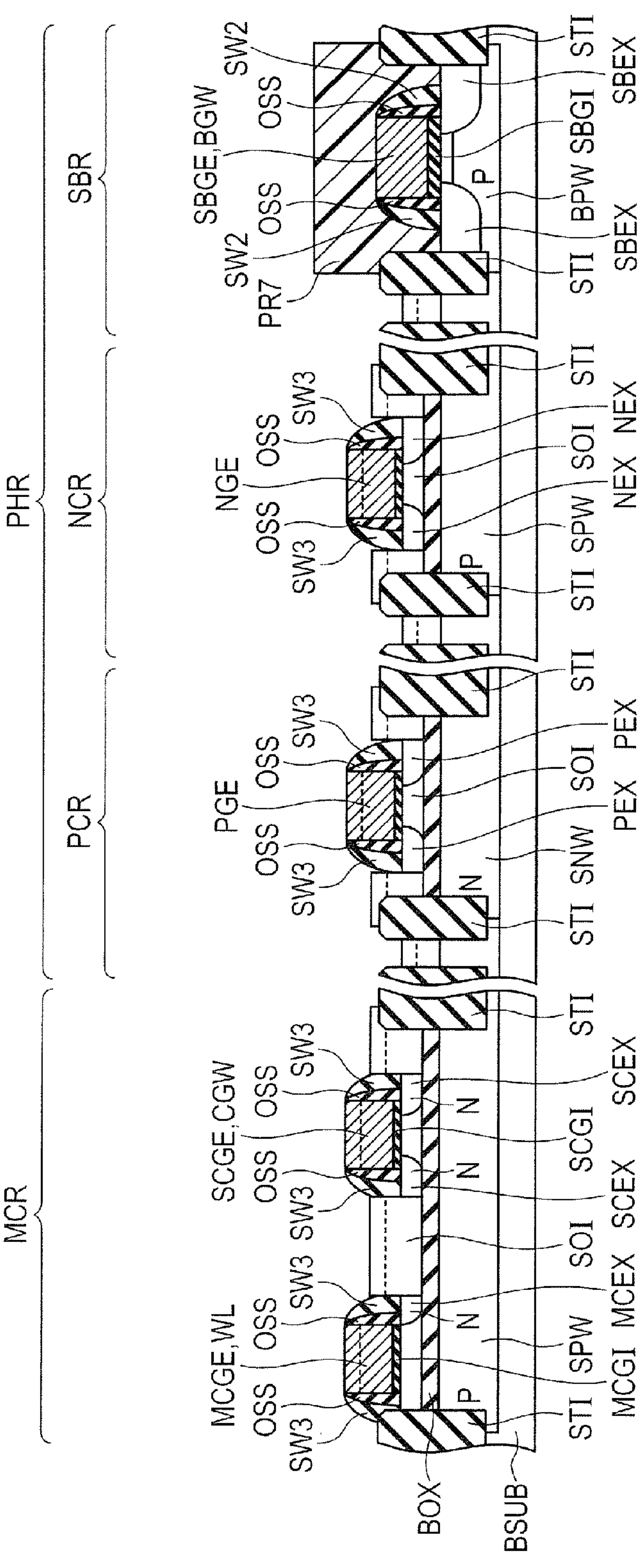
FIG. 33 is a sectional diagram showing a process performed after the process shown in FIG. 32 in the same embodiment.

Next, for example, a silicon nitride film (not shown) is formed so as to cover the memory gate electrode MCGE or the like. Then, predetermined photoengraving processing and etching processing are performed to thereby remove the silicon nitride film positioned in the selection bulk transistor region SBR. Next, predetermined photoengraving processing is performed to thereby form a resist pattern PR7 (refer to FIG. 33) which covers the selection bulk transistor region SBR and exposes other regions. Then, anisotropic etching processing is performed on the exposed silicon nitride film to thereby form a sidewall insulating film SW3 so as to cover the offset spacer film OSS positioned at the side face of the memory gate electrode MCGE or the like as shown in FIG. 33. Afterwards, the resist pattern PR7 is removed.

Figure 34:
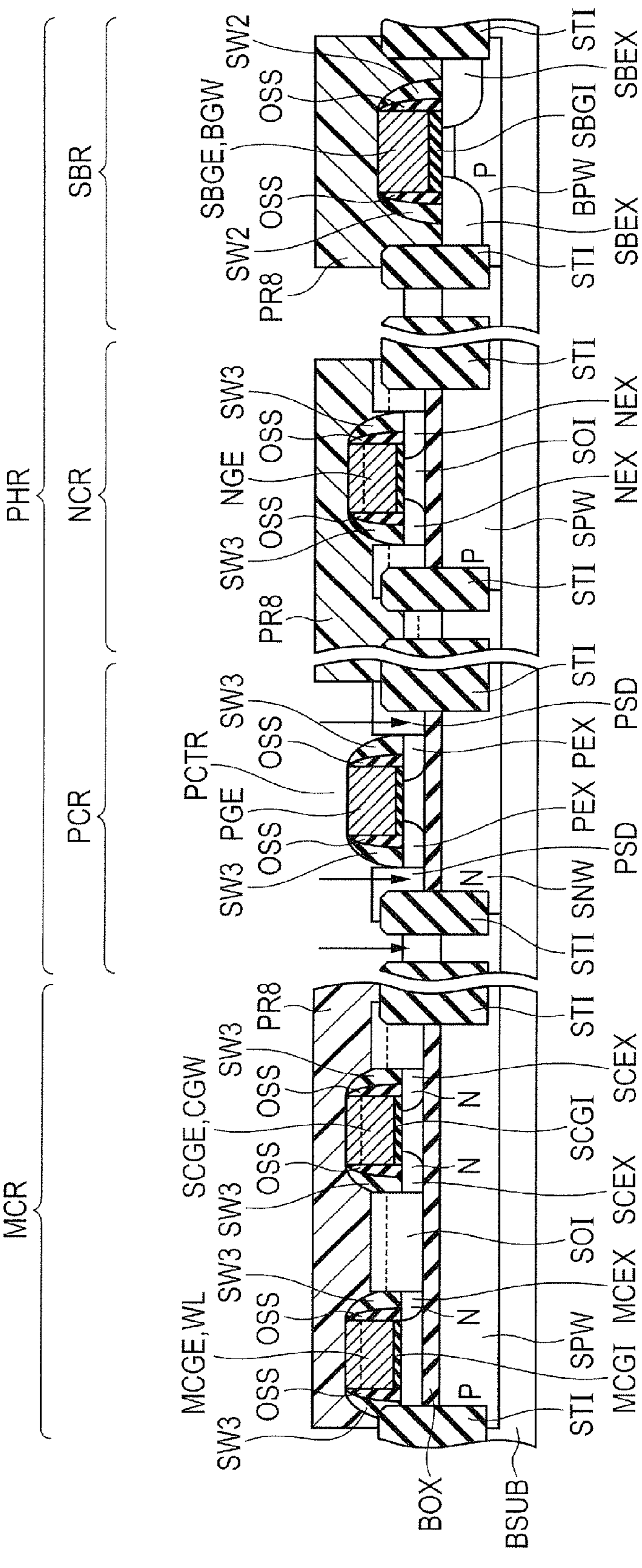
FIG. 34 is a sectional diagram showing a process performed after the process shown in FIG. 33 in the same embodiment.

Next, as shown in FIG. 34, predetermined photoengraving processing is performed to thereby form a resist pattern PR8 which exposes the P type core transistor region PCR and covers other regions. Then, a P type impurity is implanted with the resist pattern PR8 as an implantation mask to thereby form a source-drain PSD. Afterwards, the resist pattern PR8 is removed.

Figure 35:
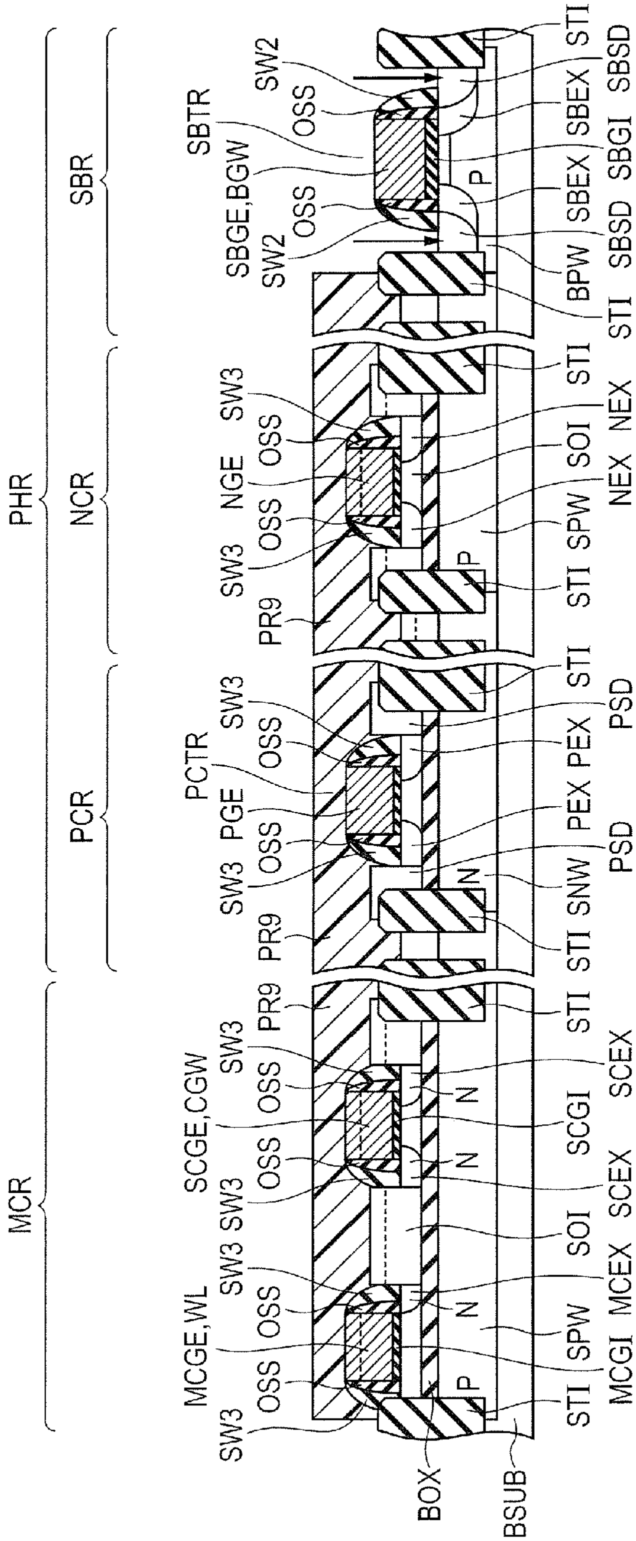
FIG. 35 is a sectional diagram showing a process performed after the process shown in FIG. 34 in the same embodiment.

Next, as shown in FIG. 35, predetermined photoengraving processing is performed to thereby form a resist pattern PR9 which exposes the selection bulk transistor region SBR and covers other regions. Then, an N type impurity is implanted with the resist pattern PR9 as an implantation mask to thereby form a source-drain SBSD. Afterwards, the resist pattern PR9 is removed.

Figure 36:
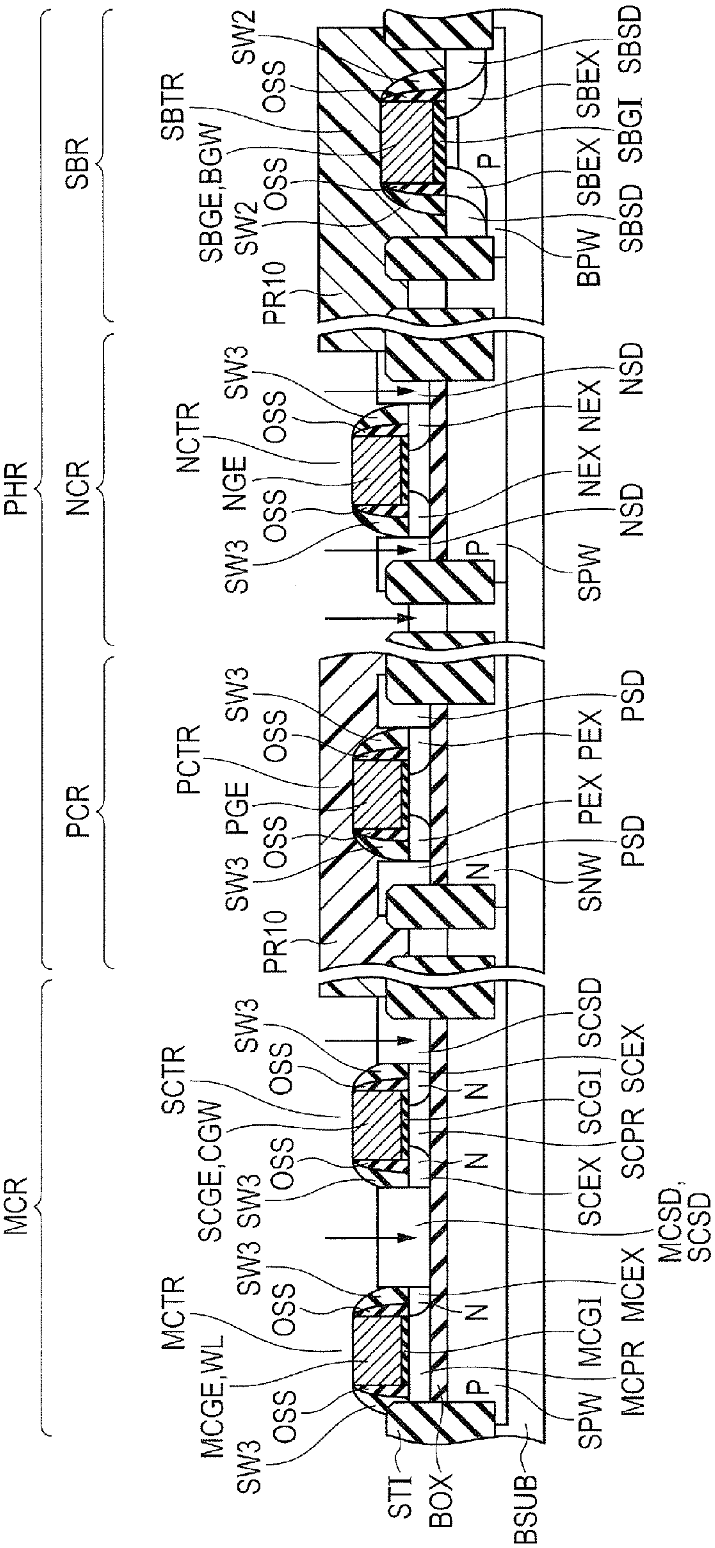
FIG. 36 is a sectional diagram showing a process performed after the process shown in FIG. 35 in the same embodiment.

Next, as shown in FIG. 36, predetermined photoengraving processing is performed to thereby form a resist pattern PR10 which exposes the memory cell region MCR and the N type core transistor region NCR and covers the P type core transistor region PCR and the selection bulk transistor region SBR. Then, an N type impurity is implanted with the resist pattern PR10 as an implantation mask to thereby form a source-drain region MCSD and a source-drain region SCSD in the memory cell region MCR. A source-drain region NSD is formed in the N type core transistor region NCR. Afterwards, the resist pattern PR10 is removed.

Figure 37:
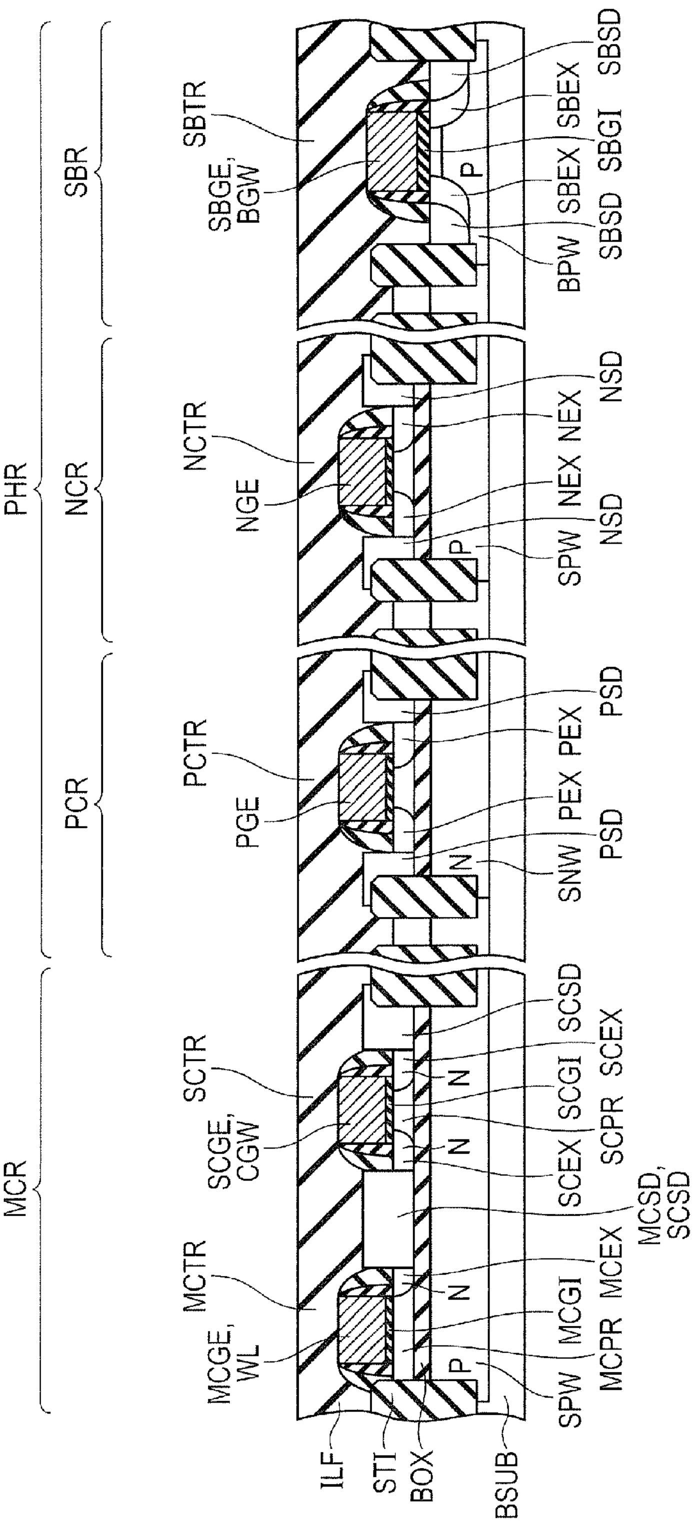
FIG. 37 is a sectional diagram showing a process performed after the process shown in FIG. 36 in the same embodiment.

Thus, a memory transistor MCTR and a selection core transistor SCTR are formed in the memory cell region MCR. A selection bulk transistor SBTR is formed in the selection bulk transistor region SBR. A P channel type core transistor PCTR is formed in the P type core transistor region PCR. An N channel type core transistor NCTR is formed in the N type core transistor region NCR Next, as shown in FIG. 37, an interlayer insulating film ILF such as a silicon oxide film is formed by, for example, the CVD method so as to cover the memory transistor MCTR and the like. Afterwards, a contact plug SCCP and the like (refer to FIG. 2) are formed so as to penetrate through the interlayer insulating film ILF. Further, a multilayer wiring structure including a plurality of wiring layers and an interlayer insulating film which insulates between the wiring layers is formed and the main part of the semiconductor device shown in FIG. 2 is completed.

As described above, in the semiconductor device equipped with the completed anti-fuse memory cells, the counter voltage is applied to the bit line upon execution of the write-in operation to make it possible to enhance the breakdown efficiency of the memory gate insulating film MCGI of the memory transistor MCTR. As a result, the read-out current at the read-out operation is increased to enable read-out accuracy to be improved.

Embodiment 2

A description will be made here about a semiconductor device equipped with anti-fuse memory cells, which reduces variations in read-out current in addition to the improvement in the breakdown efficiency.

(Structure of Memory Cell or the Like)

Figure 38:
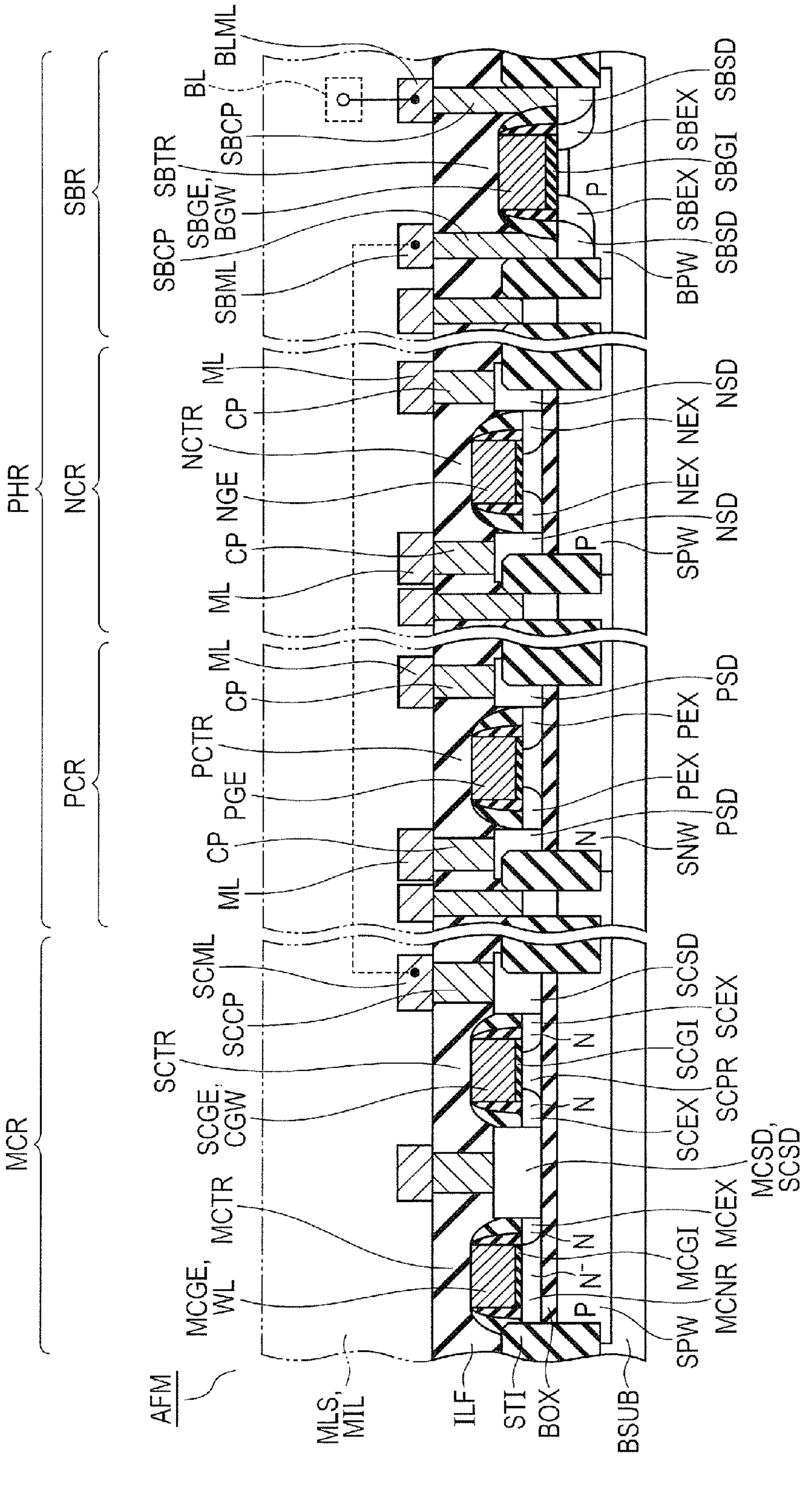
FIG. 38 is a sectional diagram of a semiconductor device according to an embodiment 2.

As shown in FIG. 38, in a semiconductor device AFM, an N type impurity region MCNR is formed in a silicon layer positioned directly below a memory gate electrode MCGE of a memory transistor MCTR. Incidentally, since the present semiconductor device is similar to the semiconductor device shown in FIG. 2 in terms of the configurations other than the above, the same reference numerals are respectively attached to the same members, and their description will not be repeated unless otherwise required.

(Operation of Semiconductor Device)

A description will next be made about the operation of the semiconductor device AFM equipped with the above-mentioned memory cells MC. Since conditions for its operation are the same as the conditions shown in FIG. 4 described in the embodiment 1, they will be described in brief.

(Write-in Operation)

Figure 39:
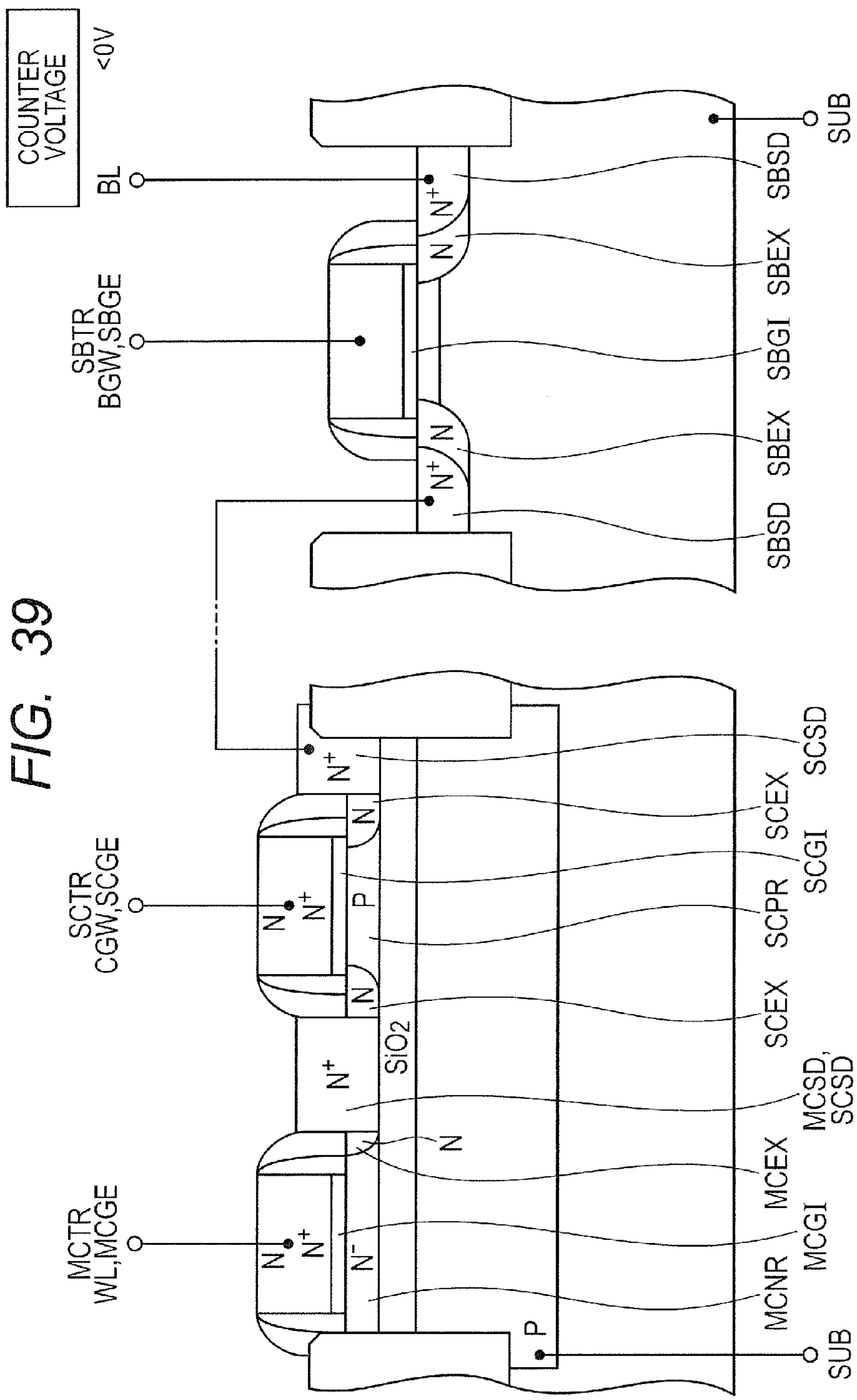
FIG. 39 is a sectional typical diagram for describing the operation of the semiconductor device in the same embodiment.

As shown in FIG. 4 and FIG. 39, when information is written in the memory cell MCA of the four memory cells MC, a voltage of about 6.5V or so is applied to the word line WL1. A voltage of about 3.0V or so is applied to the core gate wiring CGW1. A voltage of −0.5V is applied to the bit line BL1 as a counter voltage. A voltage of about 1.5V or so is applied to the bulk gate wiring BGW.

A voltage of 0V is applied to the word line WL2. The voltage of 0V is applied to the core gate wiring CGW2. The voltage of 0V is applied to the bit line BL2. The voltage of 0V is applied to the P type well SPW of the memory cell region MCR and the P type well BPW of the selection bulk transistor region SBR.

In the selected memory cell MCA, the difference between the potential of the memory gate insulating film MCGI (interface) and the potential of the memory gate electrode MCGE becomes a desired potential difference, and the memory gate insulating film MCGI is dielectric broken, so that writing-in of information is performed.

(Read-Out Operation)

As shown in FIG. 4, when the information of the memory cell MCA of the four memory cells MC, in which the information is written by the write-in operation is read, a voltage of about 1.0V or so is applied to the word line WL1. A voltage of about 1.0V or so is applied to the core gate wiring CGW1. A voltage of 0V is applied to the bit line BL1. A voltage of about 3.3V or so is applied to the bulk gate wiring BGW.

The voltage of 0V is applied to the word line WL2. The voltage of 0V is applied to the core gate wiring CGW2. The voltage of 0V is applied to the bit line BL2. The voltage of 0V is applied to the P type well SPW of the memory cell region MCR and the P type well BPW of the selection bulk transistor region SBR.

In the memory cell MCA, a substantial read-out current flows from the memory gate electrode MCGE to the bit line BL1 through the resistor, the selection bulk transistor SBTR, and the selection core transistor SCTR. Information ("0" or "1") is readout according to the ratio of the read-out current after writing-in to the read-out current based on the FN tunnel current before writing-in. The above-described semiconductor device AFM is operated as described above.

(Operative Effect, Etc.)

In the above-described semiconductor device AFM, the N type impurity region MCNR is formed in the silicon layer positioned directly below the memory gate electrode MCGE. That is, the arrangement structure is provided in which the N type impurity region MCNR and the memory gate electrode MCGE of the same conductivity type as that of the extension region MCEX are physically completely overlapped. Thus, as described in the embodiment 1, the gate coupling is suppressed, thereby making it possible to enhance the breakdown efficiency of the memory gate insulating film MCGI and increase the read-out current.

Further, since the above-described semiconductor device is adapted to have the arrangement structure in which the N type impurity region MCNR and the memory gate electrode MCGE are physically completely overlapped, variations in the read-out current can be suppressed. This will be described.

Figure 40:
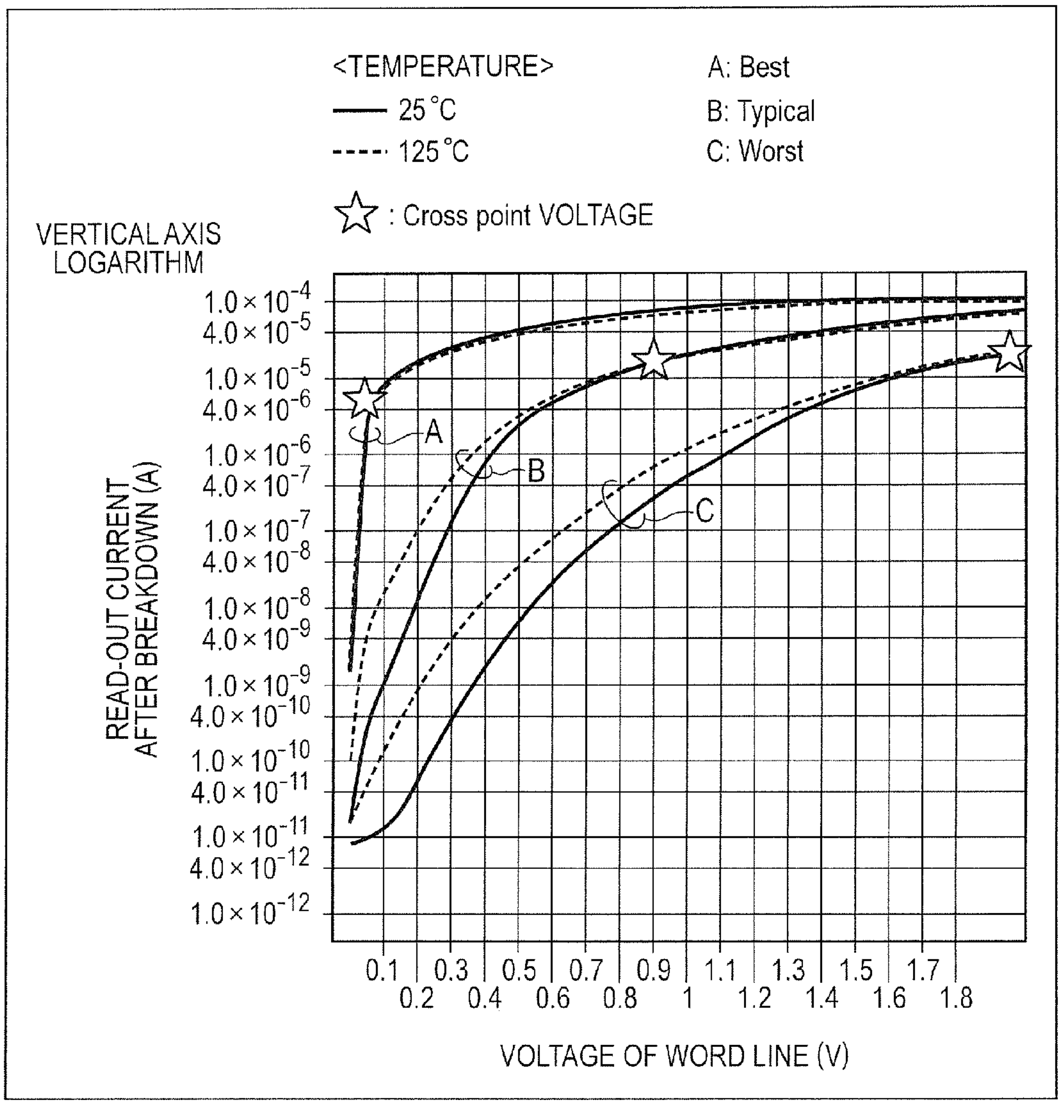
FIG. 40 is a first diagram for describing that a memory transistor has a parasitic MOS transistor in the same embodiment.
Figure 41:
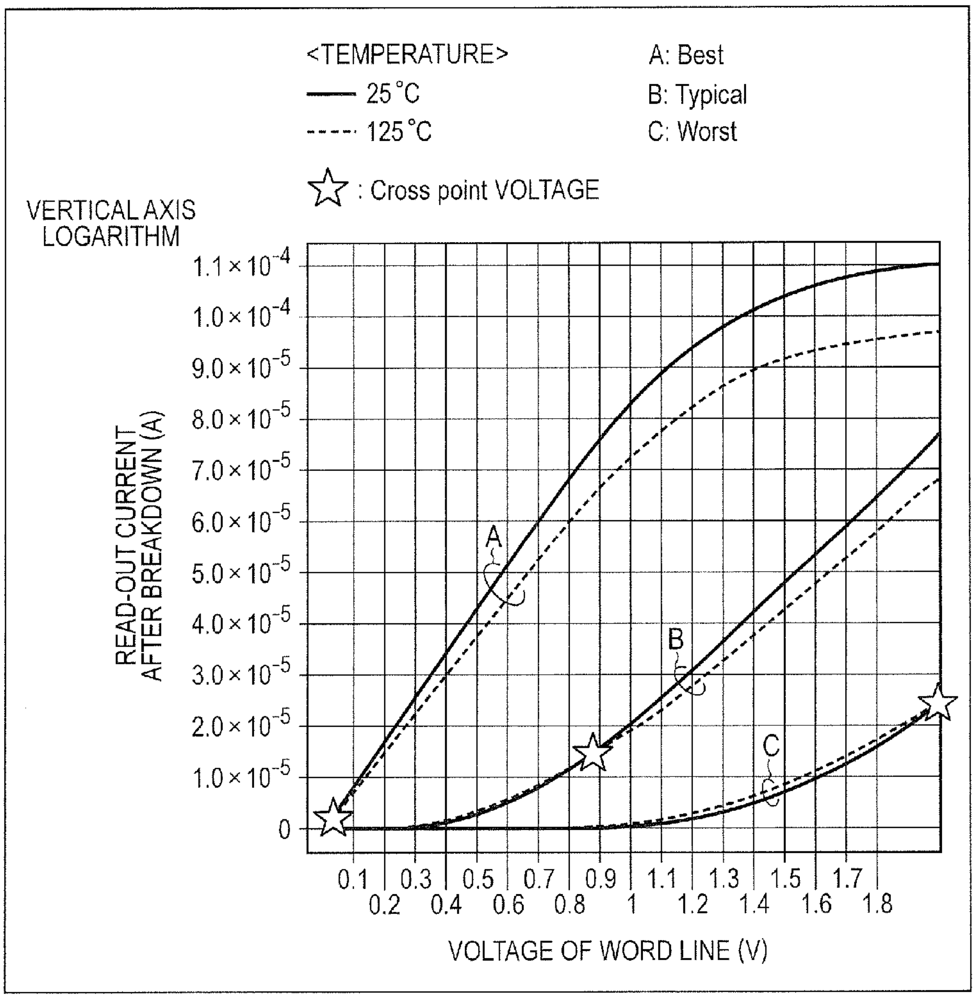
FIG. 41 is a second diagram for describing that the memory transistor has the parasitic MOS transistor in the same embodiment.

The embodiment 1 has described that the dielectric breakdown of the memory gate insulating film MCGI in the memory transistor MCTR is local. The present inventors have evaluated the relation between the dielectric breakdown of the gate insulating film and the parasitic MOS transistor. Evaluation results thereof are shown in FIGS. 40 and 41. FIGS. 40 and 41 are graphs showing the relation between the read-out current at the read-out operation and the voltage applied to the word line after the write-in operation is performed. A horizontal axis indicates the voltage applied to the word line. A vertical axis indicates the read-out current. Incidentally, the vertical axis is displayed in logarithm in FIG. 40 and displayed in linearity in FIG. 41.

A graph A is a measurement result in the case where the gate insulating film is completely dielectric broken, or the breakdown point in the gate insulating film is closest to the extension region MCEX, etc. (Best). A graph B is a measurement result in the case where the gate insulating film is not completely dielectric broken, or the breakdown point in the gate insulating film is a little bit away from the extension region MCEX, etc. (Typical). A graph C is a measurement result in the case where the gate insulating film is not completely dielectric broken, or the breakdown point in the gate insulating film is farthest from the extension region MCEX, etc. (Worst). Further, measurement results where measurements are done under a temperature of 25° C. are indicated by solid lines. Measurement results where measurement are done under a temperature of 125° C. are indicated by dotted lines.

It is understood in the graph A that as the voltage applied to the word line becomes higher, the read-out current increases linearly. This trend means that the dielectric broken breakdown point serves as a resistor.

In the graph B, while the read-out current increases as the voltage applied to the word line becomes higher, the voltage of the word line at which the graph of the read-out current rises is higher than in the case of the graph A. Also, the read-out current does not increase linearly but increases gently. In the graph C, the voltage of the word line at which the graph of the read-out current rises is further higher than in the case of the graph B. Further, the read-out current does not increase linearly, but increases more gently than in the case of the graph B. These trends mean that a function as an insulating film remains in the gate insulating film.

Also, generally, in the MOS transistor, the reversed layer (channel) becomes easy to be formed directly below the gate electrode as the temperature becomes higher. Therefore, a threshold voltage at the temperature of 125° C. becomes lower than a threshold voltage at the temperature of 25° C. A read-out current under the temperature of 125° C. starts to flow at a voltage at which the voltage applied to the word line is lower, as compared with the read-out current under the temperature of 25° C. This is understood from the fact that in each of the graphs A to C, the graph indicated by a dotted line (125° C.) is located upwardly of the graph indicated by a solid line (25° C.).

Further, as the voltage applied to the word line is increased, a strong inversion region is formed directly below the gate electrode. In this state, carriers become difficult to flow due to a scattering effect as the temperature becomes higher. For that reason, the read-out current under the temperature of 125° C. becomes lower than the read-out current under the temperature of 25° C. That is, a magnitude relationship between the read-out currents is switched. Cross points shown in FIGS. 40 and 41 indicate voltages at which the magnitude relationship of the read-out currents is replaced. The existence of such cross points means that the memory transistor in which the writing-in is done has the parasitic MOS transistor in addition to the dielectric broken resistor.

As described in the embodiment 1, the parasitic MOS transistor exists between the resistor and the extension region (refer to FIGS. 9 and 10). Therefore, variations occur in the resistance value of the reversed layer by the parasitic MOS transistor according to the position of the breakdown point in the memory gate insulating film. Since the breakdown point of the gate insulating film is random in the planar type MOS transistor, it is difficult to control variations in the read-out current.

In the above-described semiconductor device, the N type impurity region MCNR is formed in the silicon layer positioned directly below the N channel type memory gate electrode MCGE. Thus, the resistance value can be made lower than that of the reversed-layer resistance of the reversed layer by the parasitic MOS transistor. That is, even if the breakdown point is formed at random in the memory gate insulating film MCGI, it is possible to suppress variations in the resistance value from the breakdown point to the extension region MCEX. As a result, variations in the read-out current can be suppressed, and the accuracy of reading-out can be enhanced.

(First Example of Manufacturing Method)

Figure 42:
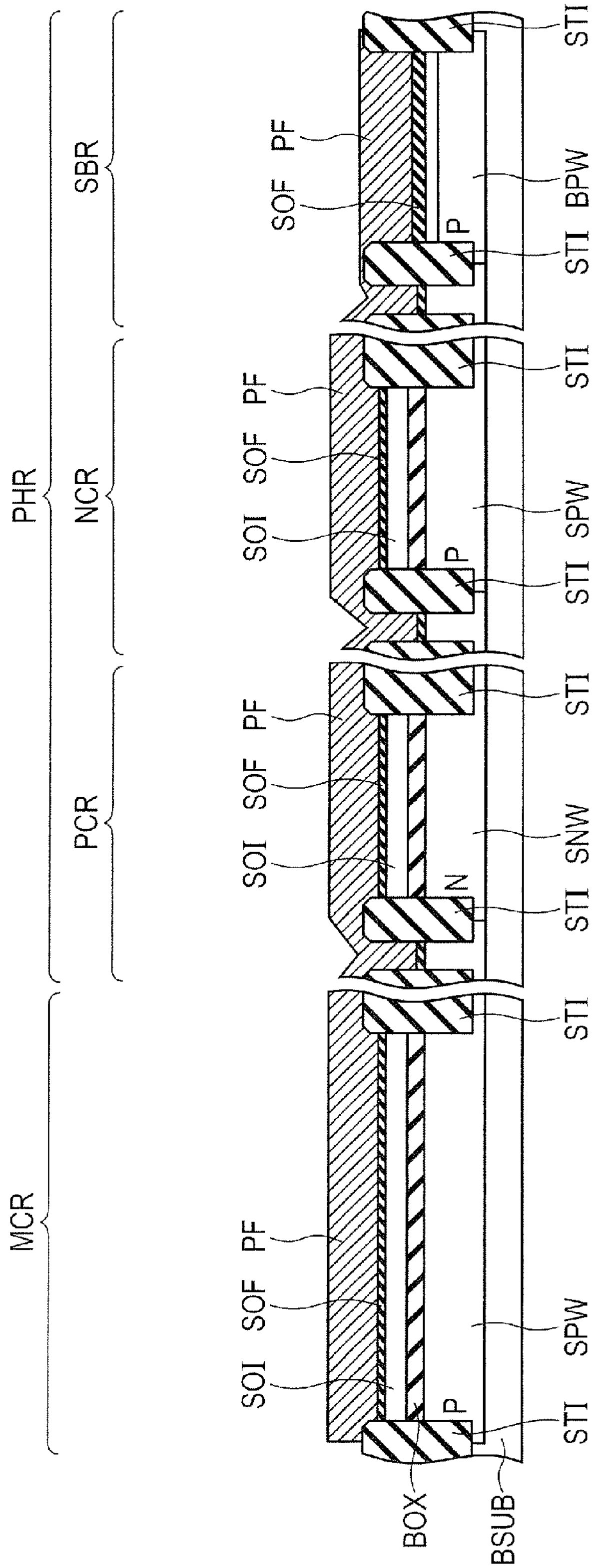
FIG. 42 is a sectional diagram showing one process of a manufacturing method according to a first example, of the semiconductor device in the same embodiment.
Figure 43:
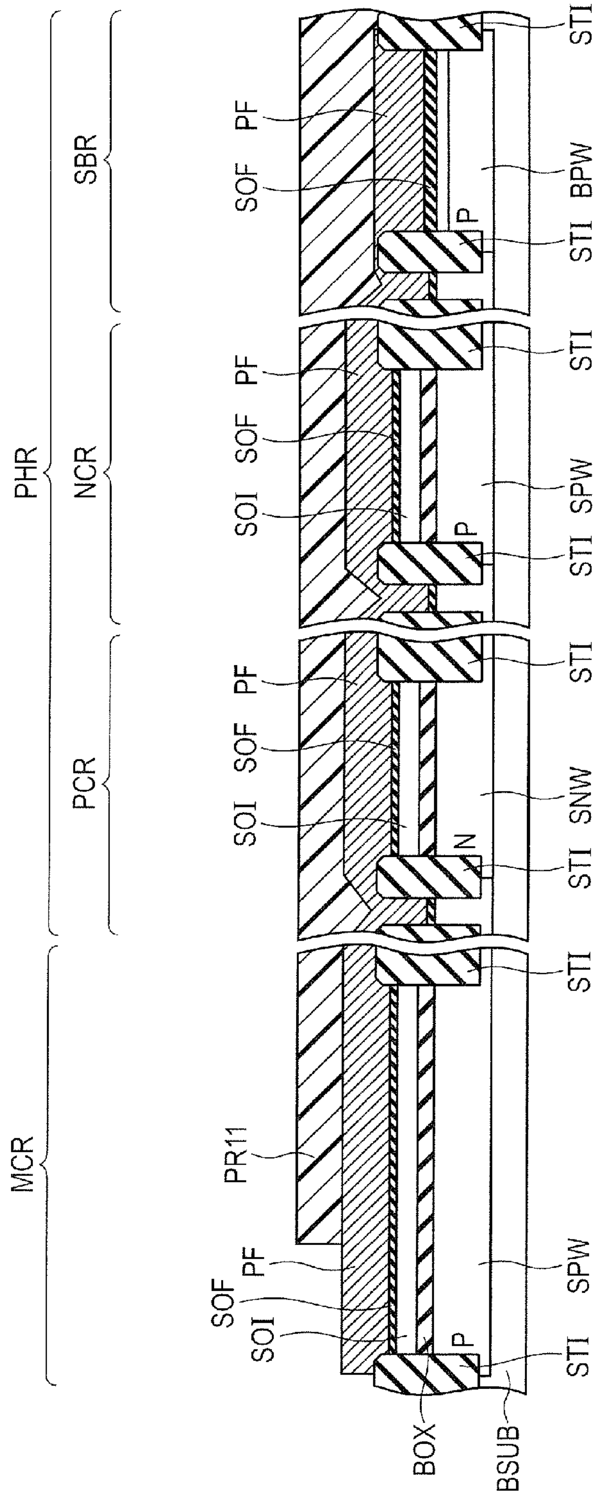
FIG. 43 is a sectional diagram showing a process performed after the process shown in FIG. 42 in the same embodiment.

A description will next be made about a first example of the method for manufacturing the above-described semiconductor device. First, as shown in FIG. 42, a polysilicon film PF is formed so as to cover a silicon oxide film SOF through processes similar to the processes illustrated in FIGS. 18 to 24. Next, as shown in FIG. 43, predetermined photoengraving processing is performed to thereby form a resist pattern PR11 which exposes a region formed with a memory gate electrode MCGE (refer to FIG. 38) and covers other regions.

Figure 44:
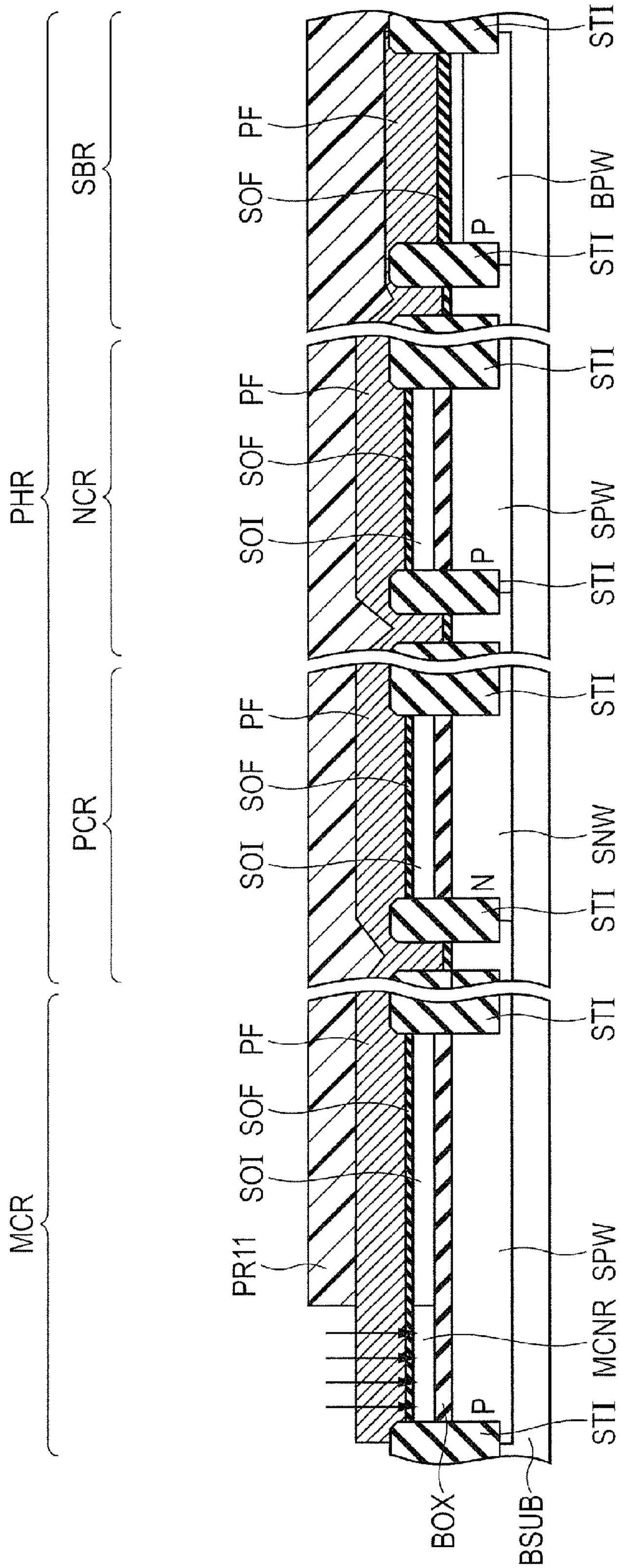
FIG. 44 is a sectional diagram showing a process performed after the process shown in FIG. 43 in the same embodiment.
Figure 45:
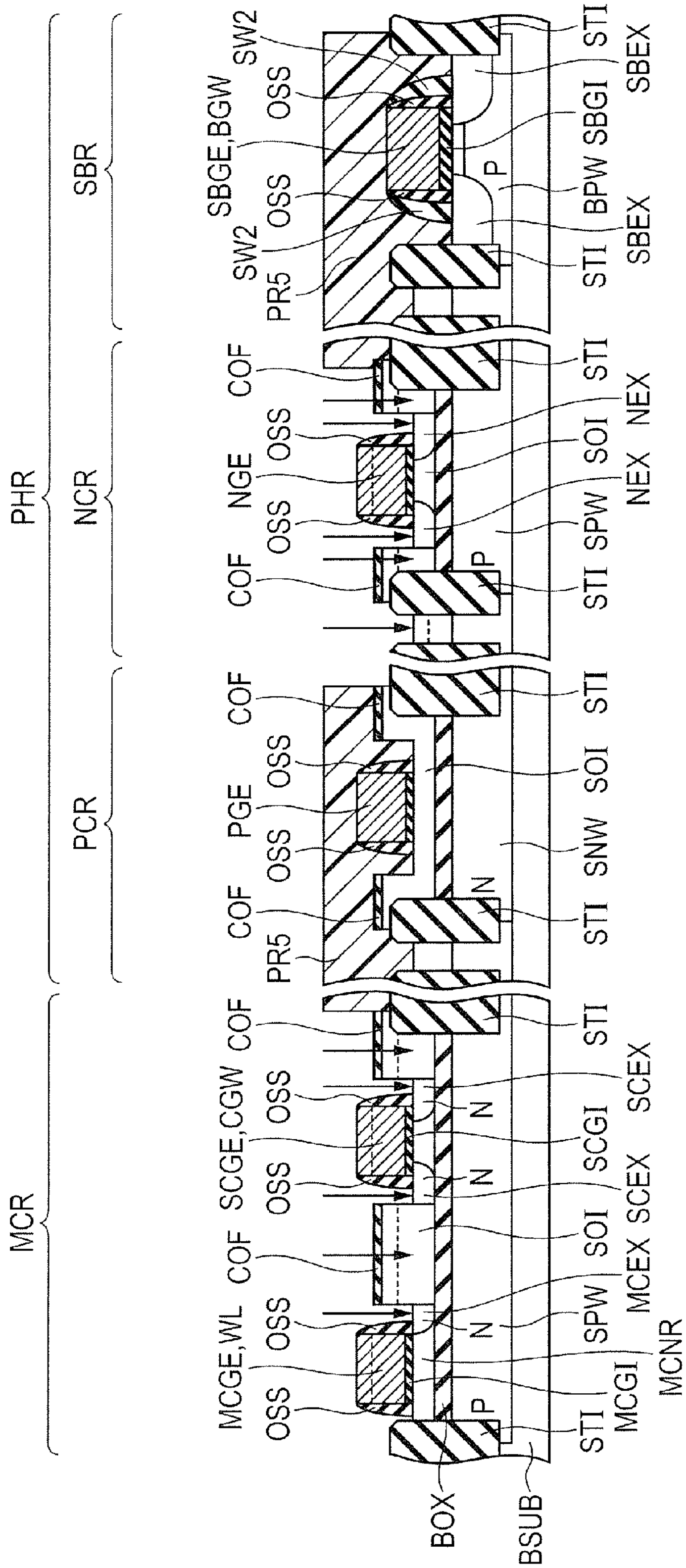
FIG. 45 is a sectional diagram showing a process performed after the process shown in FIG. 44 in the same embodiment.

Next, as shown in FIG. 44, an N type impurity is implanted with the resist pattern PR11 as an implantation mask to thereby form an N type impurity region MCNR in a silicon layer. Thereafter, the resist pattern PR11 is removed. Next, as shown in FIG. 45, extension regions MCEX and SCEX are formed in a memory cell region MCR through processes similar to the processes shown in FIGS. 25 to 31. An extension region NEX is formed in an N type core transistor region NCR. Afterwards, a main part of the semiconductor device shown in FIG. 38 is completed through processes and the like similar to the processes and the like shown in FIGS. 32 to 37.

It is considered that in the above-described manufacturing method, the impurity implanted for the N type impurity region MCNR is thermally diffused by heat treatment after the N type impurity region MCNR is formed. Therefore, the thermally-diffused impurity is assumed to influence a selection core transistor SCTR located next to a memory transistor MCTR. In order to avoid this, there is a need to sufficiently ensure the interval (pitch between the memory gate electrode MCGE and the selection core gate electrode SCGE) between the memory transistor MCTR and the selection core transistor SCTR.

(Second Example of Manufacturing Method)

Figure 46:
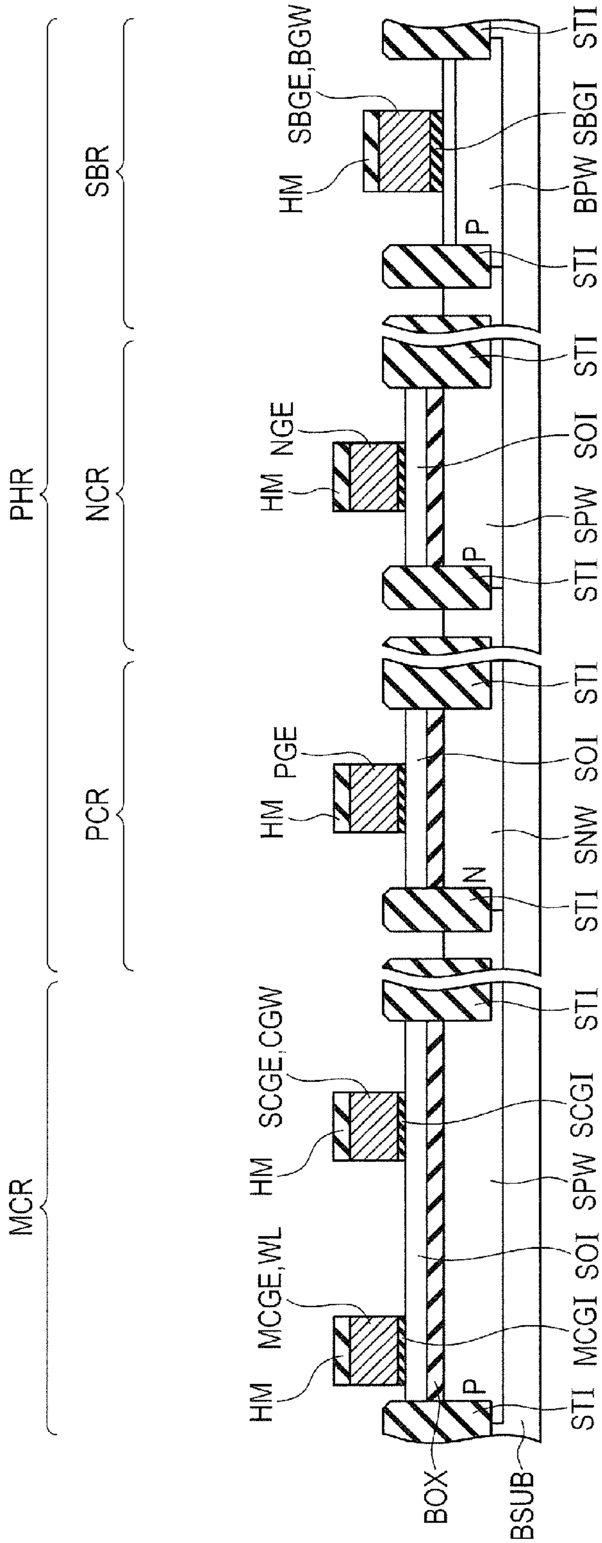
FIG. 46 is a sectional diagram showing one process of a manufacturing method according to a second example, of the semiconductor device in the same embodiment.
Figure 47:
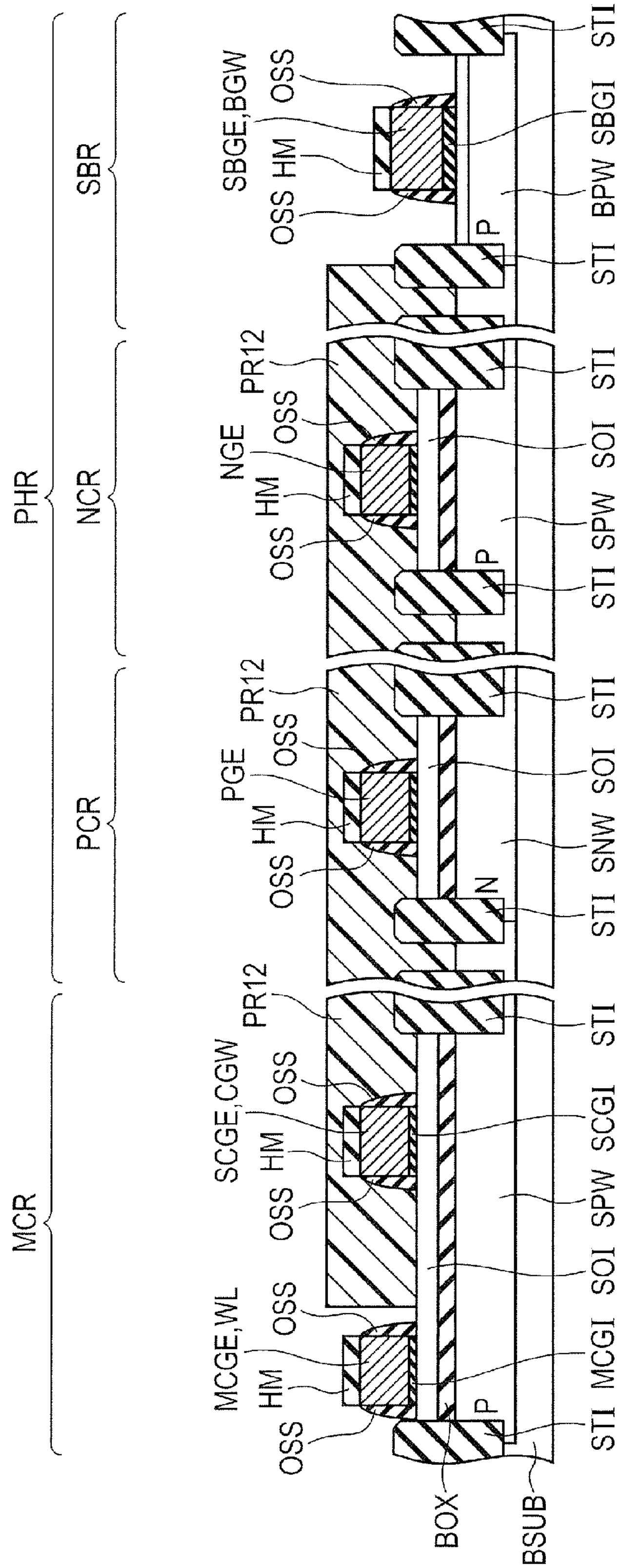
FIG. 47 is a sectional diagram showing a process performed after the process shown in FIG. 46 in the same embodiment.

A description will next be made about a second example of the method for manufacturing the above-described semiconductor device. First, a memory gate electrode MCGE and the like are formed as shown in FIG. 46 through processes similar to the processes shown in FIGS. 18 to 25. Thereafter, an offset spacer film OSS (refer to FIG. 47) is formed at the side face of each of the memory gate electrode MCGE and the like. Next, as shown in FIG. 47, predetermined photoengraving processing is performed to thereby form a resist pattern PR12 which exposes a region in which the memory gate electrode MCGE is formed, and a selection bulk transistor region SBR and covers other regions.

Figure 48:
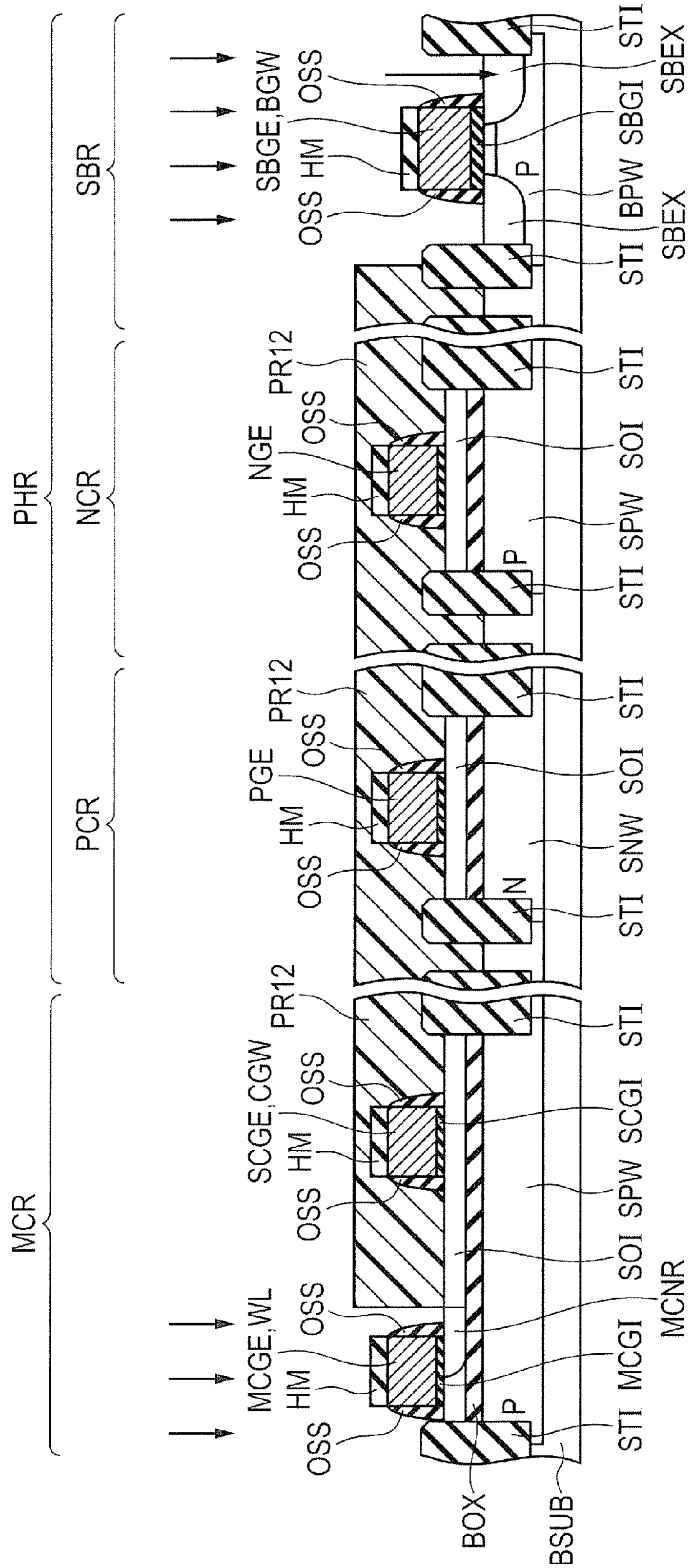
FIG. 48 is a sectional diagram showing a process performed after the process shown in FIG. 47 in the same embodiment.

Next, as shown in FIG. 48, an N type impurity is implanted with the resist pattern PR12 as an implantation mask to thereby form an extension region SBEX in the selection bulk transistor region SBR. At this time, the N type impurity is implanted (obliquely implanted) even in the memory cell region MCR.

Here, an I/O transistor (selection bulk transistor SBTR) having a withstand voltage higher than that of a core transistor is formed in the selection bulk transistor region SBR. An N type impurity for forming the high withstand voltage I/O transistor is implanted even in the memory cell region MCR so that a punch-through state is brought about in the memory cell region MCR. Thus, in a manner similar to the first example, the second example becomes equivalent to a state in which an N type impurity region MCNR is formed in a silicon layer positioned directly below the memory gate electrode MCGE. Afterwards, the resist pattern PR12 is removed.

Figure 49:
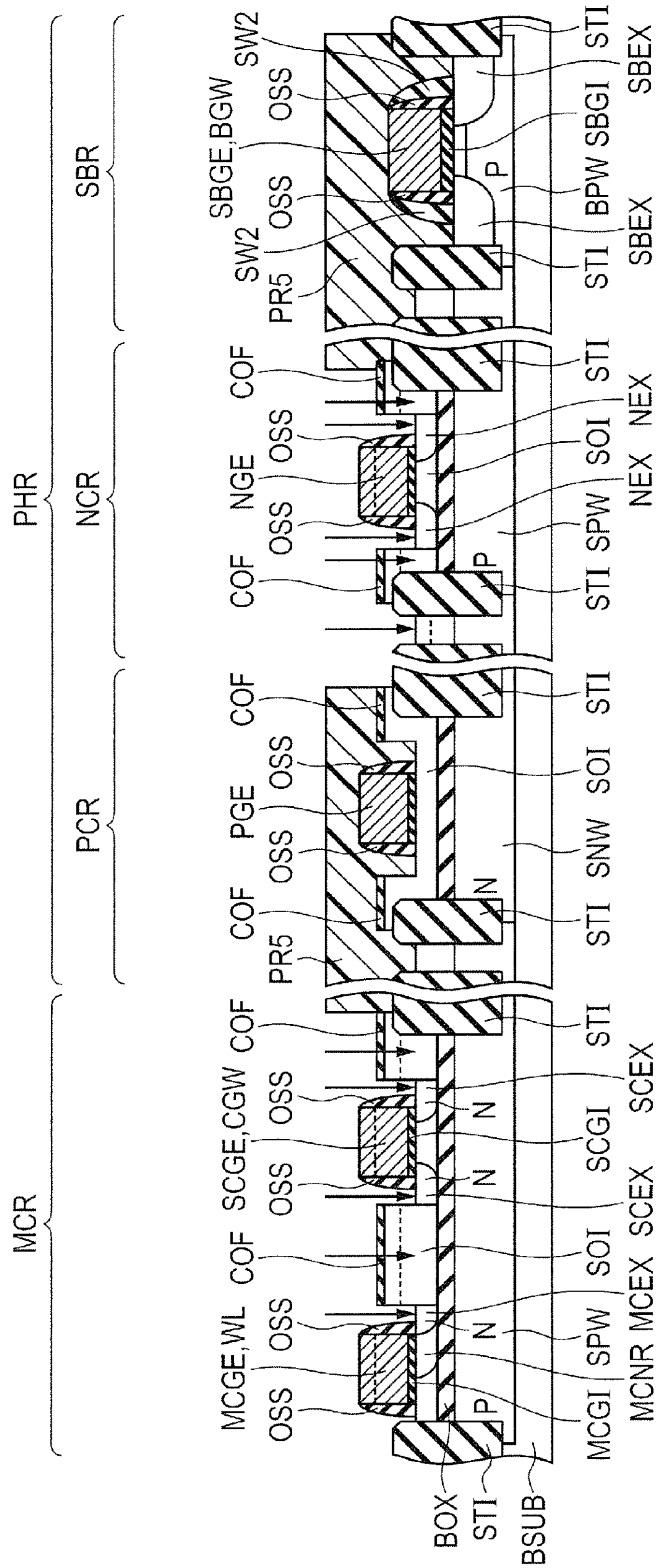
FIG. 49 is a sectional diagram showing a process performed after the process shown in FIG. 48 in the same embodiment.
Figure 50:
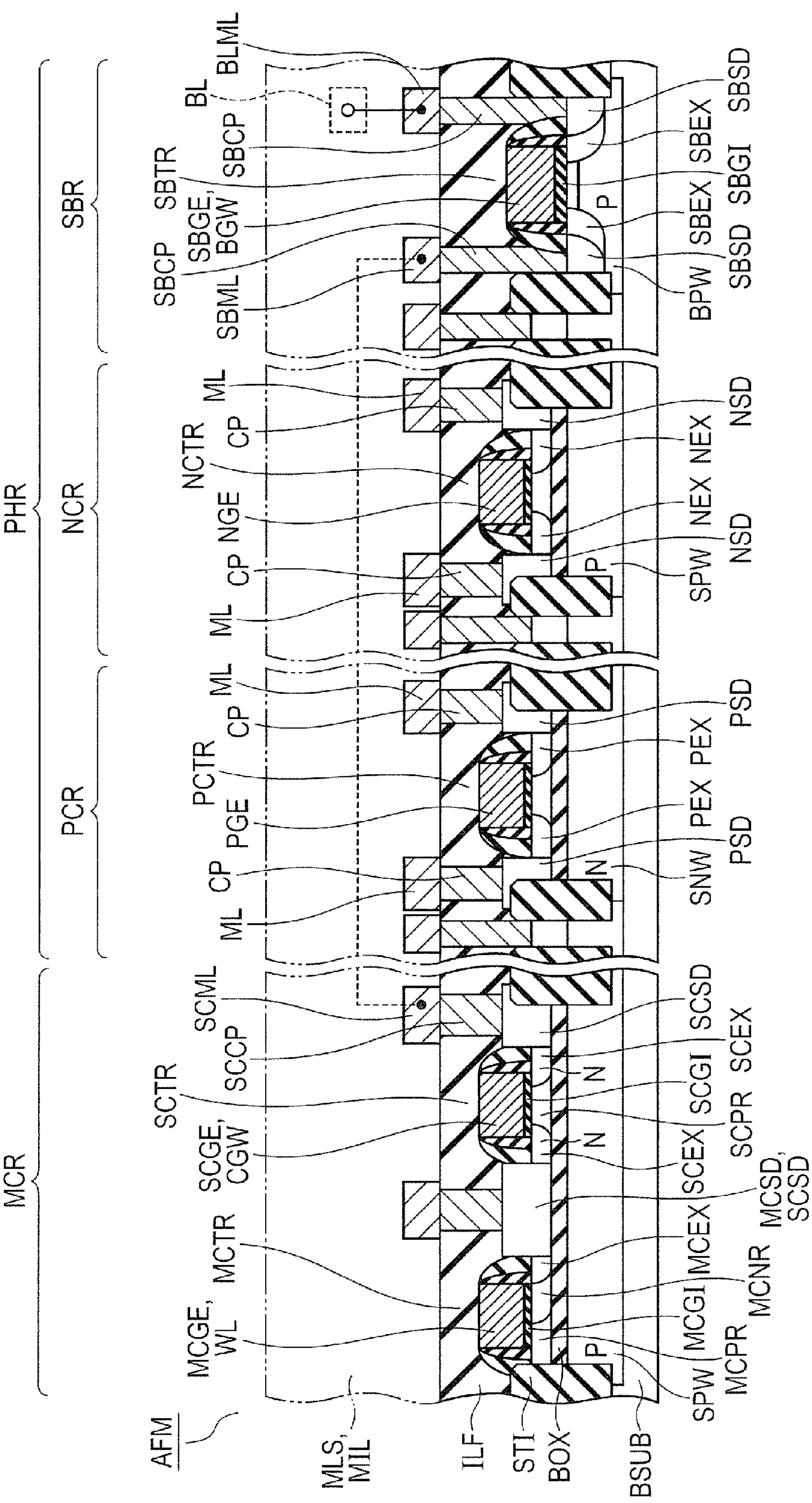
FIG. 50 is a sectional diagram of the semiconductor device manufactured by the manufacturing method according to the second example in the same embodiment.

Next, extension regions MCEX and SCEX are formed in the memory cell region MCR as shown in FIG. 49 through processes similar to the processes shown in FIGS. 27 to 31. An extension region NEX is formed in an N type core transistor region NCR. Thereafter, a main part of the semiconductor device is completed as shown in FIG. 50 through processes and the like similar to the processes and the like shown in FIGS. 32 to 37.

In the above-described manufacturing method, similarly to the case of the first example, there is a need to sufficiently ensure the interval (pitch between the memory gate electrode MCGE and the selection core gate electrode SCGE) between a memory transistor MCTR and a selection core transistor SCTR for the purpose of avoiding the influence of the diffusion of the N type impurity with heat treatment after the formation of the N type impurity region MCNR.

Also, in order to prevent the core transistor such as the selection core transistor SCTR from becoming the punch-through state, there is a need to separately provide a process of forming the resist pattern PR12 in a region where the selection core transistor SCTR or the like is formed, in such a manner that the impurity is prevented from being implanted (refer to FIG. 47).

Embodiment 3

A description will now be made about a semiconductor device equipped with anti-fuse memory cells, which is capable of raising a withstand voltage of a selection core transistor in addition to an improvement in breakdown efficiency.

(Structure of Memory Cell or the Like)

Figure 51:
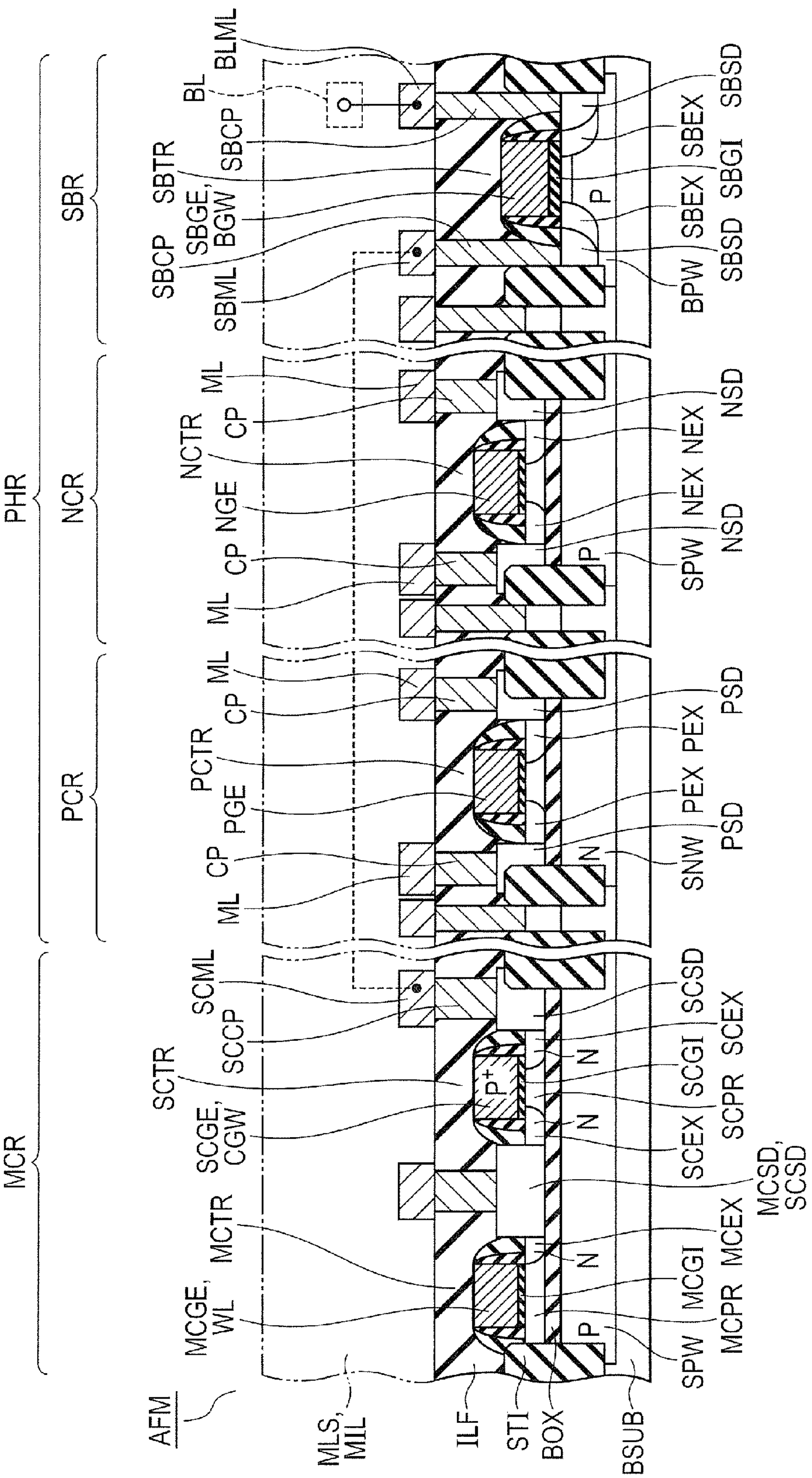
FIG. 51 is a sectional diagram of a semiconductor device according to an embodiment 3.

As shown in FIG. 51, in a semiconductor device AFM, a selection core gate electrode SCGE whose conductivity type is a P type is formed as a selection core gate electrode SCGE of an N channel type selection core transistor SCTR. Incidentally, since the present semiconductor device is similar to the semiconductor device shown in FIG. 2 in terms of the configurations other than the above, the same reference numerals are respectively attached to the same members, and their description will not be repeated unless otherwise required.

(Operation of Semiconductor Device)

A description will next be made about the operation of the semiconductor device AFM equipped with the above-mentioned memory cells MC. Since conditions for its operation are the same as the conditions shown in FIG. 4 described in the embodiment 1, they will be described in brief.

(Write-in Operation)

Figure 52:
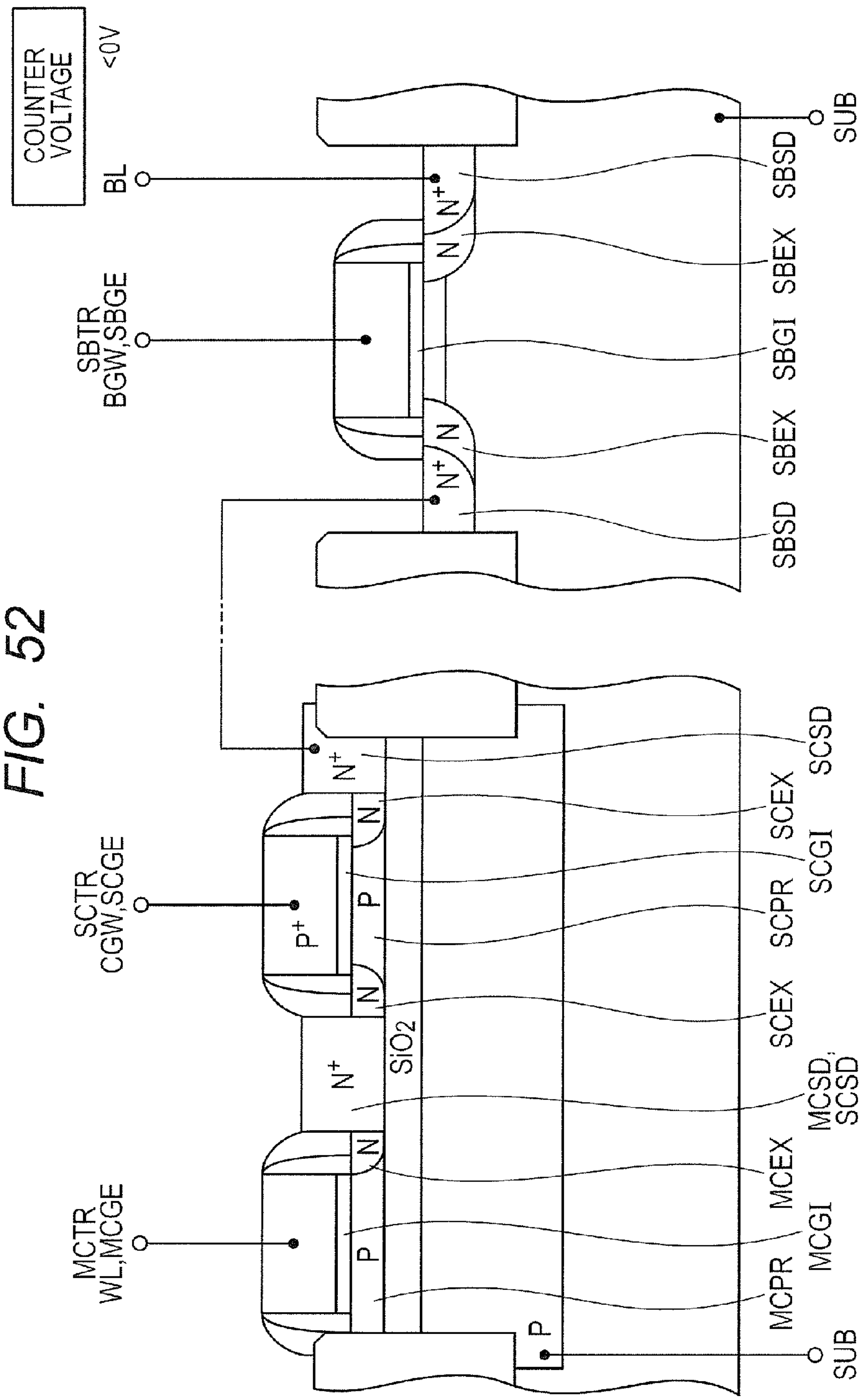
FIG. 52 is a sectional typical diagram for describing the operation of the semiconductor device in the same embodiment.

As shown in FIG. 4 and FIG. 52, when information is written in the memory cell MCA of the four memory cells MC, a voltage of about 6.5V or so is applied to the word line WL1. A voltage of about 3.0V or so is applied to the core gate wiring CGW1. A voltage of −0.5V is applied to the bit line BL1 as a counter voltage. A voltage of about 1.5V or so is applied to the bulk gate wiring BGW.

A voltage of 0V is applied to the word line WL2. The voltage of 0V is applied to the core gate wiring CGW2. The voltage of 0V is applied to the bit line BL2. The voltage of 0V is applied to the P type well SPW of the memory cell region MCR and the P type well BPW of the selection bulk transistor region SBR.

In the selected memory cell MCA, the difference between the potential of the memory gate insulating film MCGI (interface) and the potential of the memory gate electrode MCGE becomes a desired potential difference, and the memory gate insulating film MCGI is dielectric broken so that writing-in of information is carried out.

(Read-Out Operation)

As shown in FIG. 4, when the information of the memory cell MCA of the four memory cells MC, in which the information is written by the write-in operation is read, a voltage of about 1.0V or so is applied to the word line WL1. A voltage of about 1.0V or so is applied to the core gate wiring CGW1. A voltage of 0V is applied to the bit line BL1. A voltage of about 3.3V or so is applied to the bulk gate wiring BGW.

The voltage of 0V is applied to the word line WL2. The voltage of 0V is applied to the core gate wiring CGW2. The voltage of 0V is applied to the bit line BL2. The voltage of 0V is applied to the P type well SPW of the memory cell region MCR and the P type well BPW of the selection bulk transistor region SBR.

In the memory cell MCA, a substantial read-out current flows from the memory gate electrode MCGE to the bit line BL1 through the resistor, the selection bulk transistor SBTR, and the selection core transistor SCTR. Information ("0" or "1") is read out according to the ratio of the read-out current after writing-in to the read-out current based on the FN tunnel current before writing-in. The above-described semiconductor device AFM is operated as described above.

(Operative Effect, Etc.)

In the above-described semiconductor device AFM, the conductivity type of the selection core gate electrode SCGE of the N channel type selection core transistor SCTR is set as a P type. It is thus possible to raise the withstand voltage of the selection core transistor SCTR. This will be described.

As described in the embodiment 1, the difference in potential between the memory gate electrode MCGE and the memory gate insulating film MCGI (P type silicon layer MCPR) is brought to a desired potential difference (potential difference A) by applying the counter voltage to the bit line. Thus, the breakdown efficiency of the memory gate insulating film MCGI can be enhanced.

When the counter voltage is applied to the bit line, the counter voltage affects even the selection core transistor SCTR positioned next to the memory transistor MCTR. That is, the difference in potential between the selection core gate electrode SCGE and the selection core gate insulating film SCGI (P type silicon layer SCPR) is also brought to a potential difference (potential difference B) at which the counter voltage (absolute value) is added to the voltage applied to the selection core gate electrode SCGE.

Figure 53:
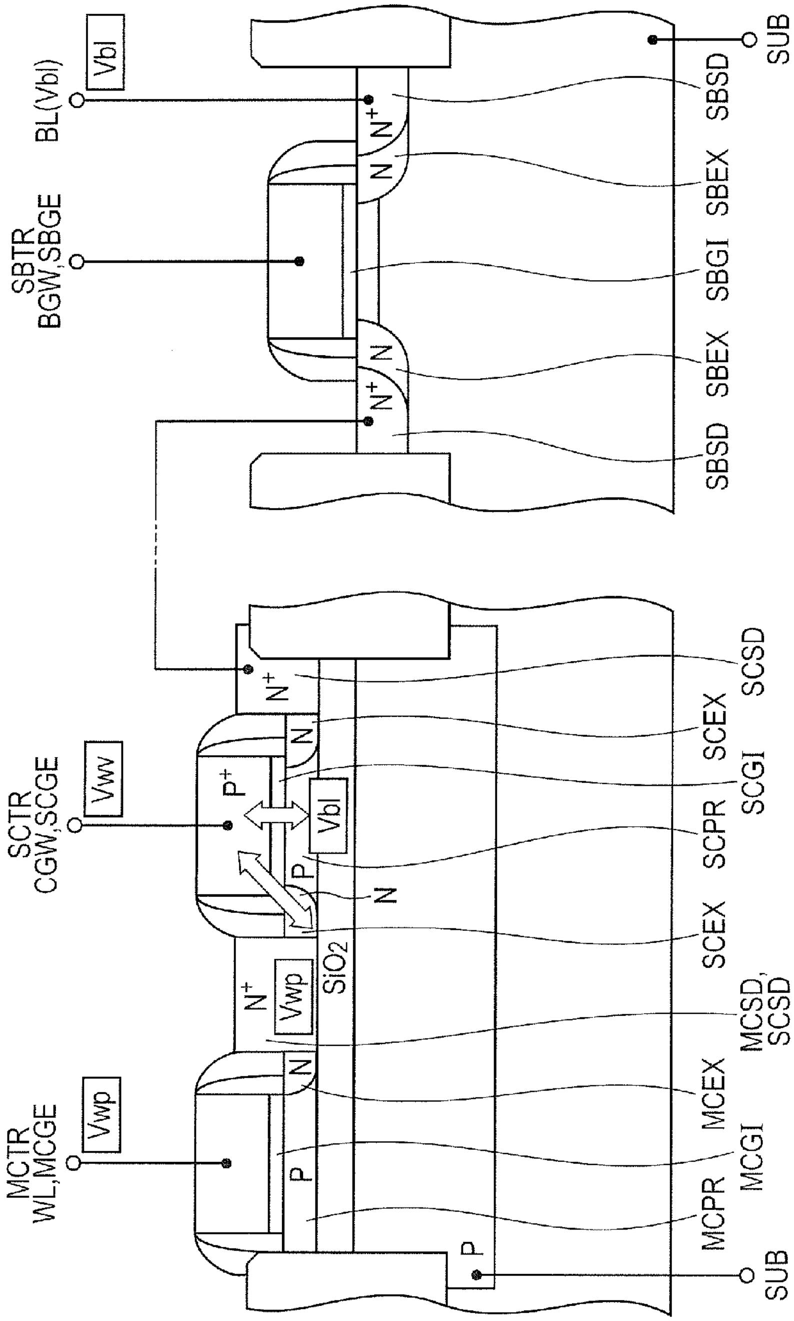
FIG. 53 is a sectional typical diagram for describing conditions required for a selection core gate insulating film of a selection core transistor in the same embodiment.

Now assume that as shown in FIG. 53, upon the write-in operation, the voltage applied to the memory gate electrode MCGE is Vwp, the voltage applied to the selection core gate electrode SCGE is Vwr, and the counter voltage is Vbl. The memory transistor MCTR is placed under a condition that upon the write-in operation, the potential difference A (Vwp−Vbl) is higher than the breakdown voltage of the memory gate insulating film MCGI. On the other hand, the selection core transistor SCTR is placed under a condition that the potential difference B (Vwr−Vbl) is lower than the breakdown voltage of the selection core gate insulating film SCGI or an operating time thereof is sufficiently longer than a TDDB (Time Dependent Dielectric Breakdown) lifetime of the memory gate insulating film SCGI.

Further, after the information is written, the memory transistor MCTR becomes a resistor in the selection core transistor SCTR. Therefore, a condition is required that a potential difference C (Vwp−Vwr) between the voltage applied to the memory gate electrode MCGE and the voltage applied to the selection core gate electrode SCGE is lower than the breakdown voltage of the selection core gate insulating film SCGI or an operating time is sufficiently longer than a TDDB lifetime of the memory gate insulating film MCGI.

From the above conditions, the upper limits of the voltages respectively applied to the memory gate electrode MCGE, the selection core gate electrode SCGE, and the bit line are rate-controlled by the breakdown voltage or TDDB lifetime of the selection core gate insulating film SCGI. This means that there is a need to raise the withstand voltage of the selection core gate insulating film SCGI in order to apply a higher voltage (absolute value) as the counter voltage for the purpose of enhancing the breakdown efficiency of the memory gate insulating film.

Figure 54:
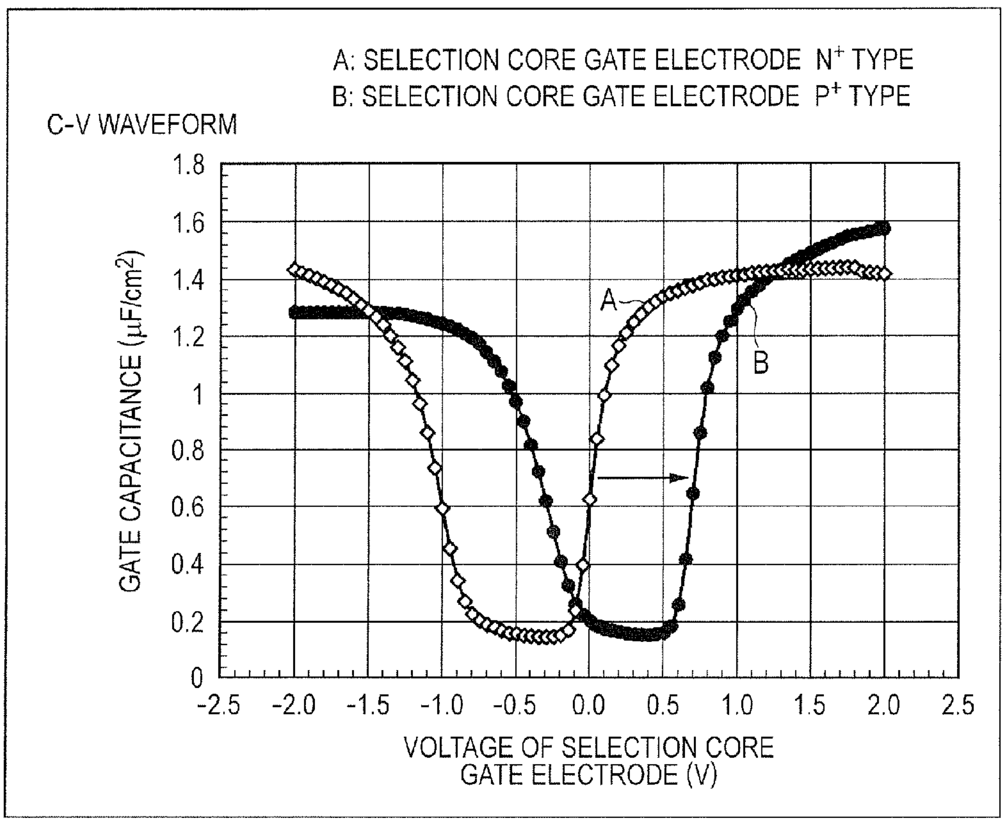
FIG. 54 is a diagram showing a relation between a voltage applied to a selection core gate electrode and a gate capacitance in the same embodiment.

Therefore, the present inventors have attempted to set the conductivity type of the selection core gate electrode SCGE of the N channel type selection core transistor SCTR from an N type to a P type in order to increase the withstand voltage of the selection core gate insulating film SCGI to thereby adjust a work function to raise the threshold voltage. A C-V waveform of the selection core transistor SCTR was measured to confirm that the adjustment in the work function has been made. A measurement result thereof is shown in FIG. 54. A graph A indicates a C-V waveform where the conductivity type of the selection core gate electrode is an $N^+$type. A graph B indicates a C-V waveform where the conductivity type of the selection core gate electrode is a P type ($P^+$type). A horizontal axis is a gate voltage applied to the selection core gate electrode SCGE. A vertical axis is a gate capacitance.

It is understood in the graph B that as shown in FIG. 54, the gate voltage is shifted to a high side with respect to the graph A. In terms of silicon, an energy barrier of 1.1 eV exists between a balance band and a conductive band. The graph B in which the conductivity type of the selection core gate electrode and the conductivity type of the silicon layer formed with the channel are the same conductivity type (P type) is shifted by an amount corresponding to the energy barrier of the silicon with respect to the graph A.

It is estimated from this amount of shift that the threshold voltage where the conductivity type of the selection core gate electrode is of the P type ($P^+$type) is higher by about 1V or so than the threshold voltage where the conductivity type of the selection core gate electrode is of the N type ($N^+$type).

In other words, if a voltage higher than in the case of the N type ($N^+$type) is not applied to the selection core gate electrode SCGE with switching of the conductivity type of the selection core gate electrode from the N type ($N^+$type) to the P type ($P^+$type), the selection core transistor SCTR cannot be turned ON.

This means that the withstand voltage of the selection core gate insulating film SCGI is raised by the increase in the threshold voltage, and the TDDB lifetime becomes long. That is, this means that the counter voltage can be raised by the increase in the threshold voltage. By raising the counter voltage, the difference in potential between the memory gate electrode MCGE and the memory gate insulating film MCGI (interface) can be set higher. As a result, the breakdown efficiency of the memory gate insulating film MCGI can be enhanced, and the read-out accuracy of information can be improved.

(Manufacturing Method)

Figure 55:
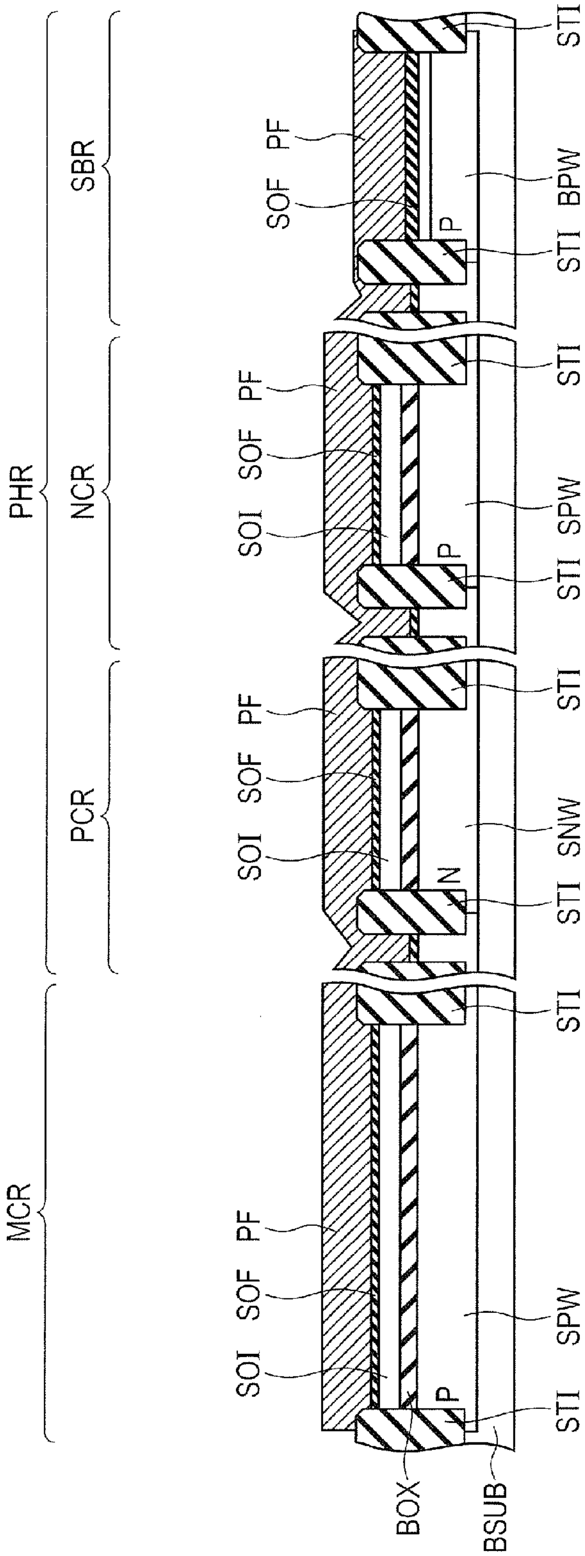
FIG. 55 is a sectional diagram showing one process of a manufacturing method of the semiconductor device in the same embodiment.

A description will next be made about one example of the method for manufacturing the above-described semiconductor device. First, as shown in FIG. 55, a polysilicon film PF is formed so as to cover a silicon oxide film SOF through processes similar to the processes shown in FIGS. 18 to 24. Here, a conductivity type of the polysilicon film PF is assumed to be a P type.

Figure 56:
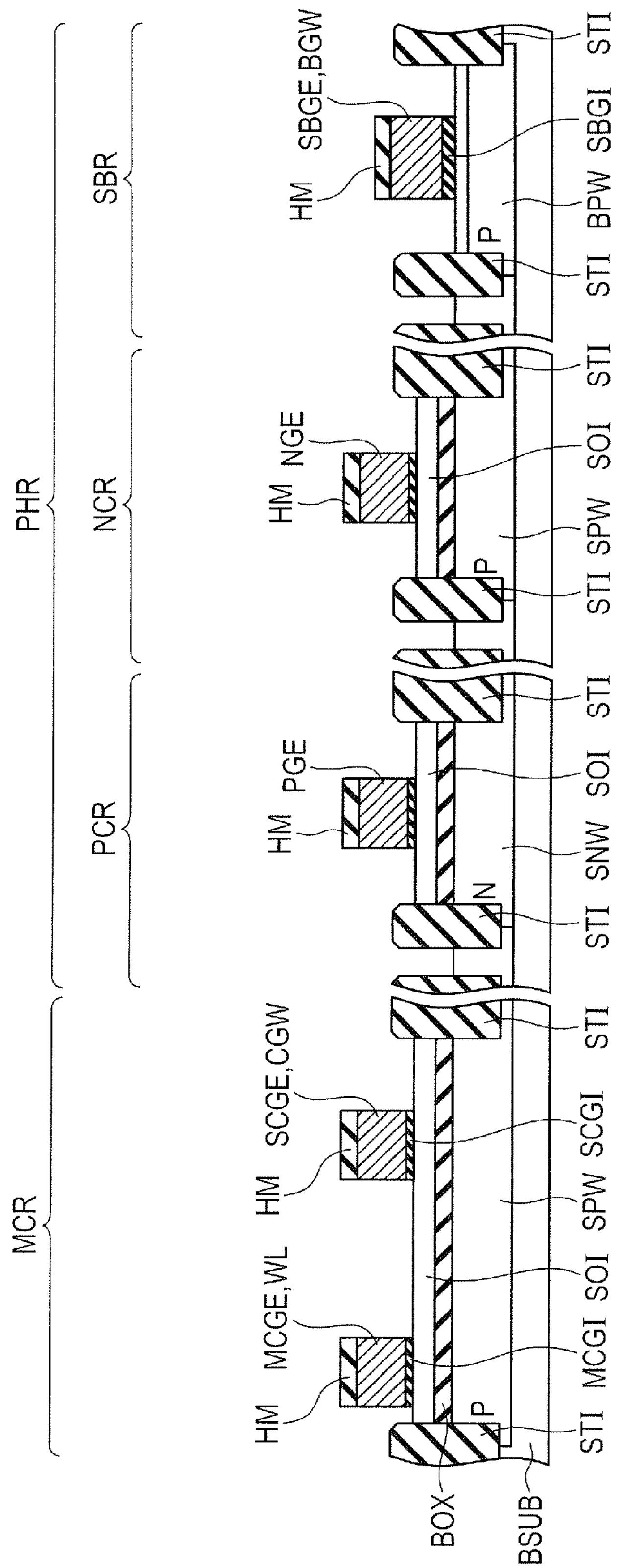
FIG. 56 is a sectional diagram showing a process performed after the process shown in FIG. 55 in the same embodiment.
Figure 57:
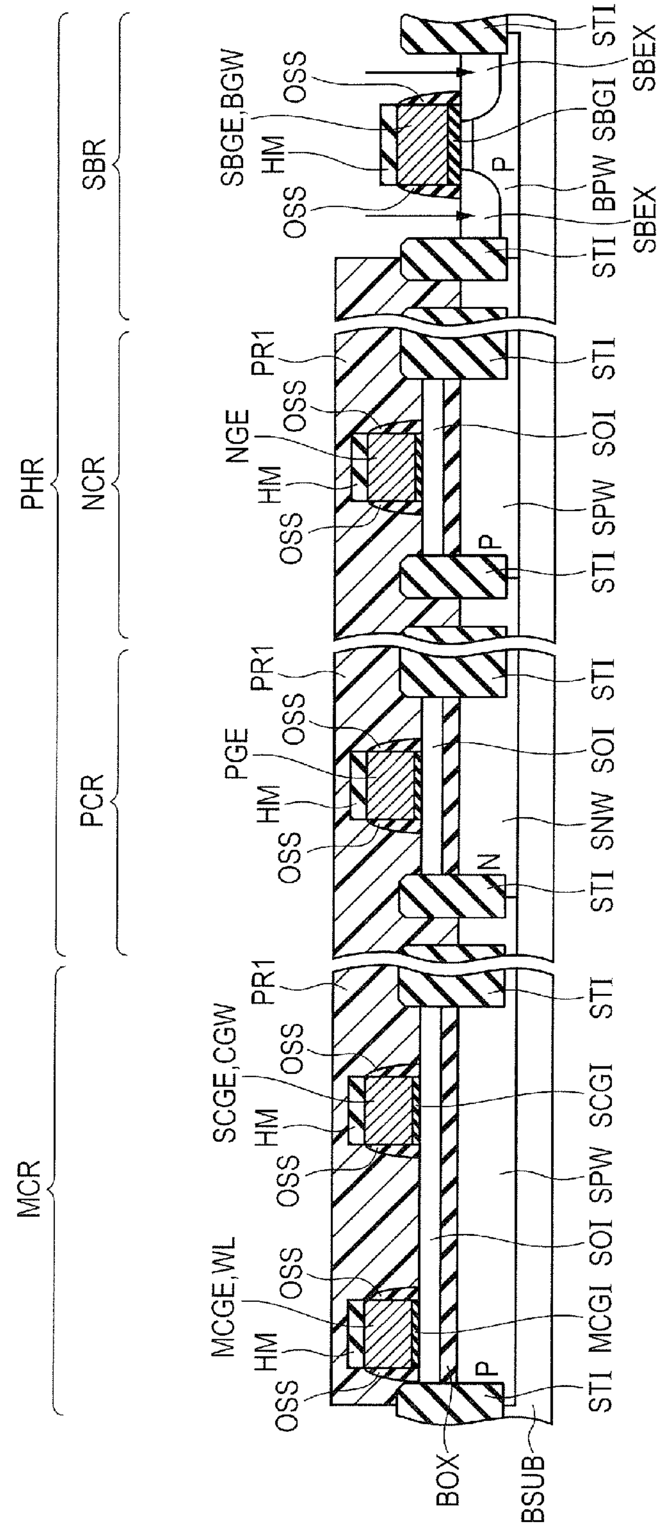
FIG. 57 is a sectional diagram showing a process performed after the process shown in FIG. 56 in the same embodiment.

Next, a selection core gate electrode SCGE and the like are formed in a memory cell region MCR as shown in FIG. 56 through a process similar to the process shown in FIG. 25. Then, an extension region SBEX is formed in a selection bulk transistor region SBR as show in FIG. 57 through a process similar to the process shown in FIG. 26.

Figure 58:
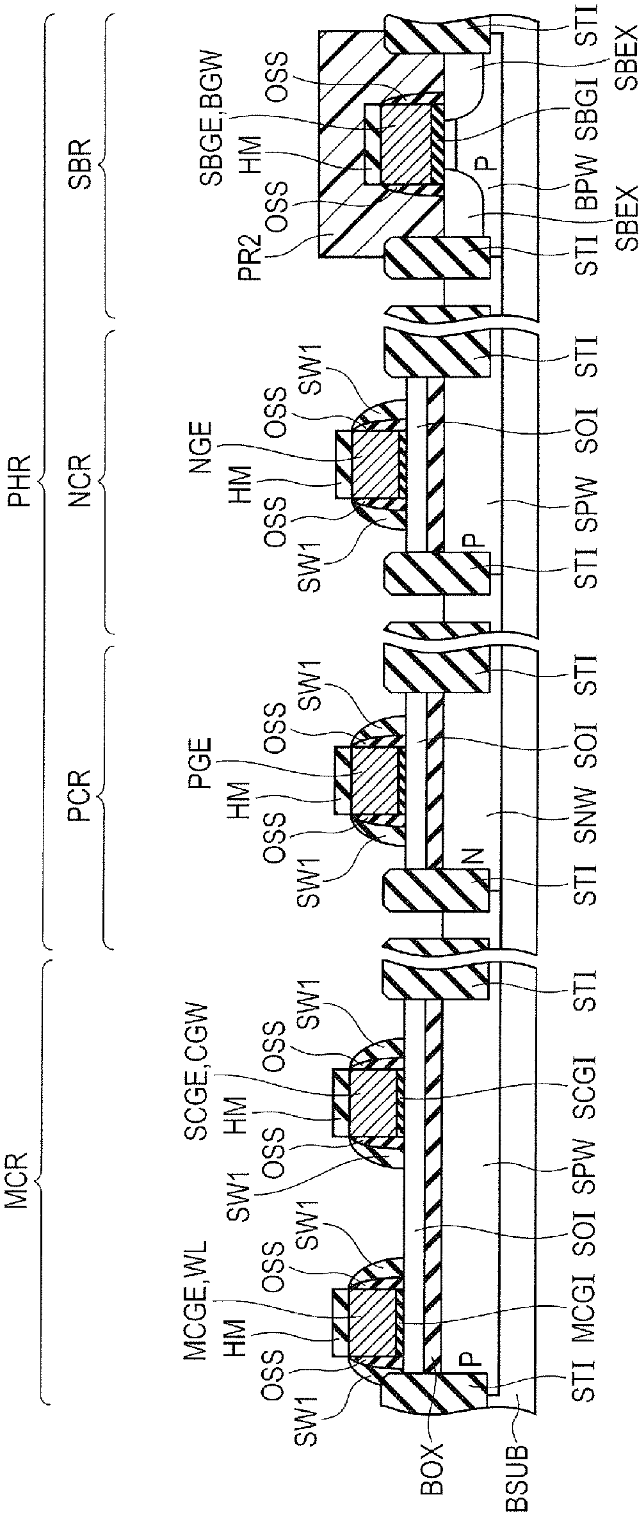
FIG. 58 is a sectional diagram showing a process performed after the process shown in FIG. 57 in the same embodiment.
Figure 59:
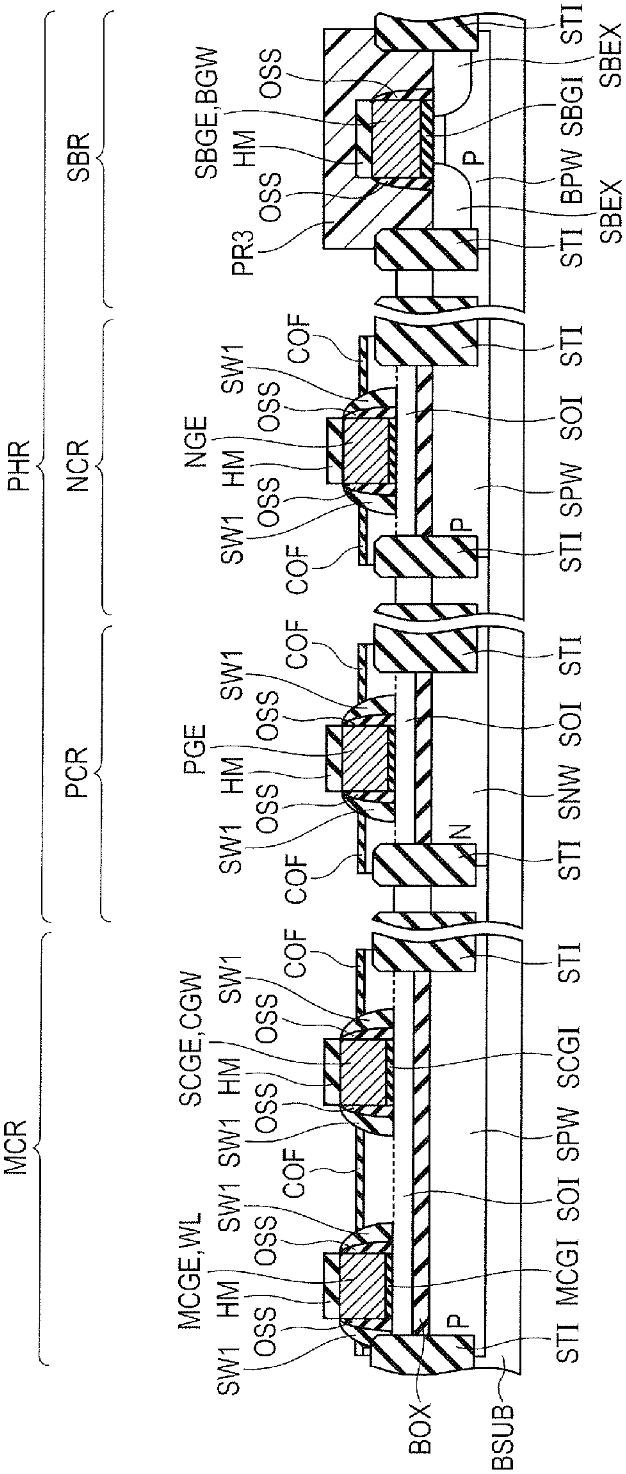
FIG. 59 is a sectional diagram showing a process performed after the process shown in FIG. 58 in the same embodiment.

Next, a sidewall insulating film SW1 is formed as shown in FIG. 58 through a process similar to the process shown in FIG. 27. Then, as shown in FIG. 59, through a profess similar to the process shown in FIG. 28, an elevated epitaxial layer is formed at the surface of a silicon layer SOI, and a silicon oxide film COF is formed so as to cover the elevated epitaxial layer.

Figure 60:
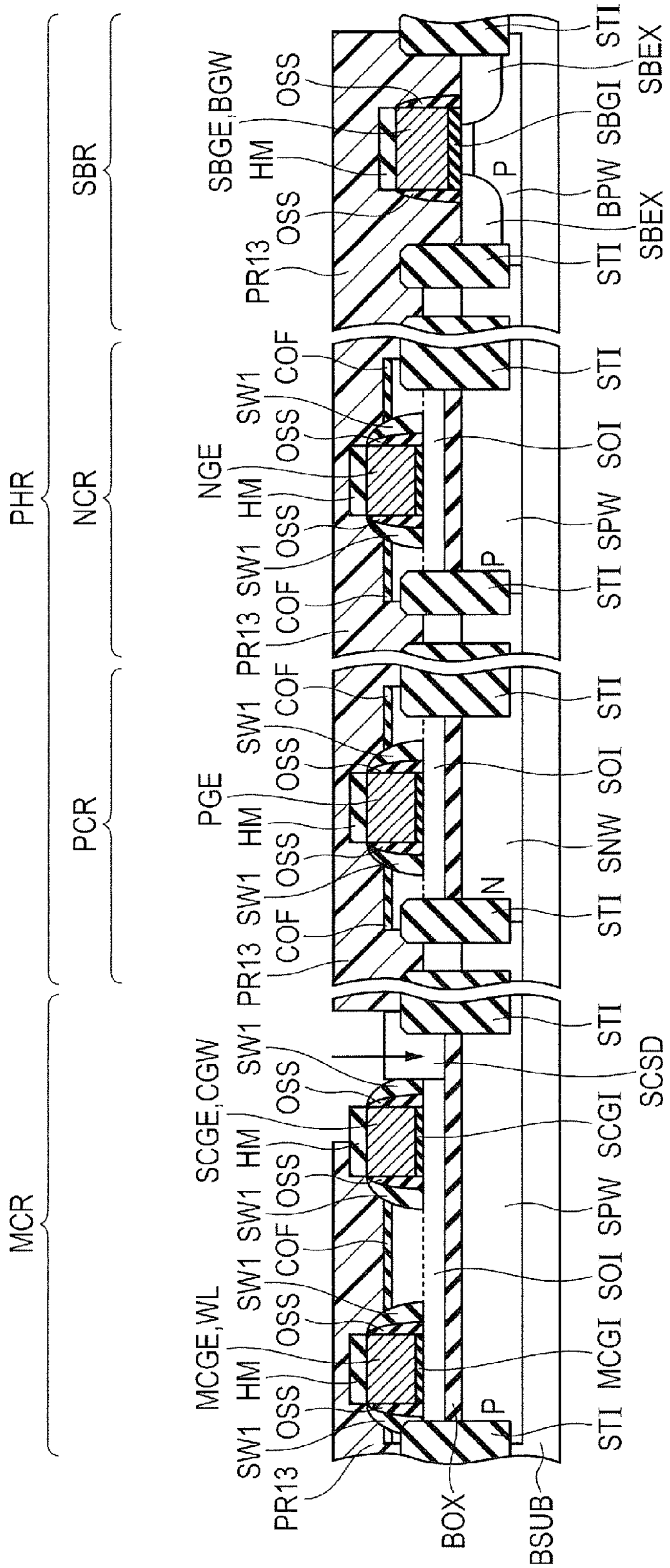
FIG. 60 is a sectional diagram showing a process performed after the process shown in FIG. 59 in the same embodiment.

Next, as shown in FIG. 60, predetermined photoengraving processing is performed to thereby form a resist pattern PR13 which exposes the region for the silicon layer (including elevated portion) formed with one of a pair of source-drain regions of a selection core transistor and covers other regions. Then, an N type impurity is implanted with the resist pattern PR13 and a hard mask HM as implantation masks to thereby form one source-drain region SCSD.

At this time, since the upper surface of the selection core gate electrode SCGE is covered by the hard mask HM, no N type impurity is introduced into the selection core gate electrode SCGE. Thus, the conductivity type of the selection core gate electrode SCGE is kept at a P type. Afterwards, the resist pattern PR13 is removed.

Figure 61:
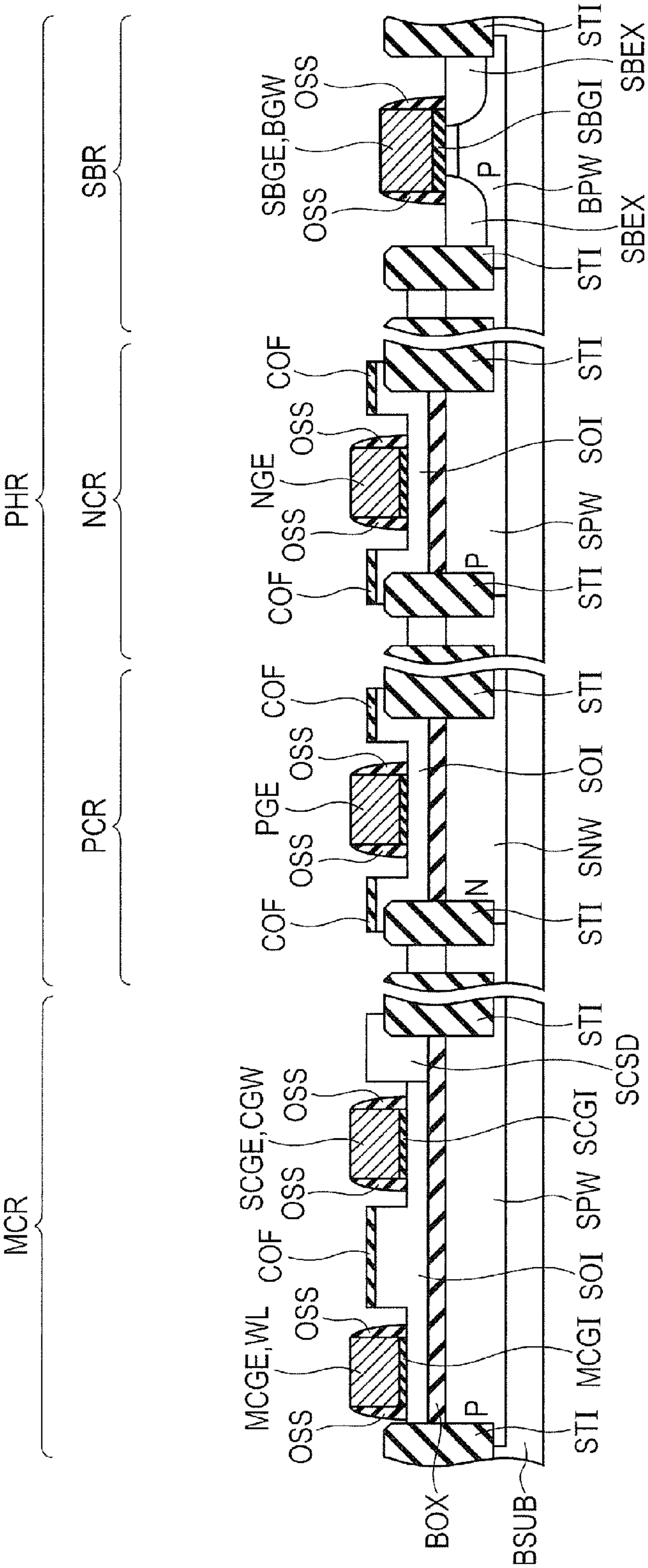
FIG. 61 is a sectional diagram showing a process performed after the process shown in FIG. 60 in the same embodiment.
Figure 62:
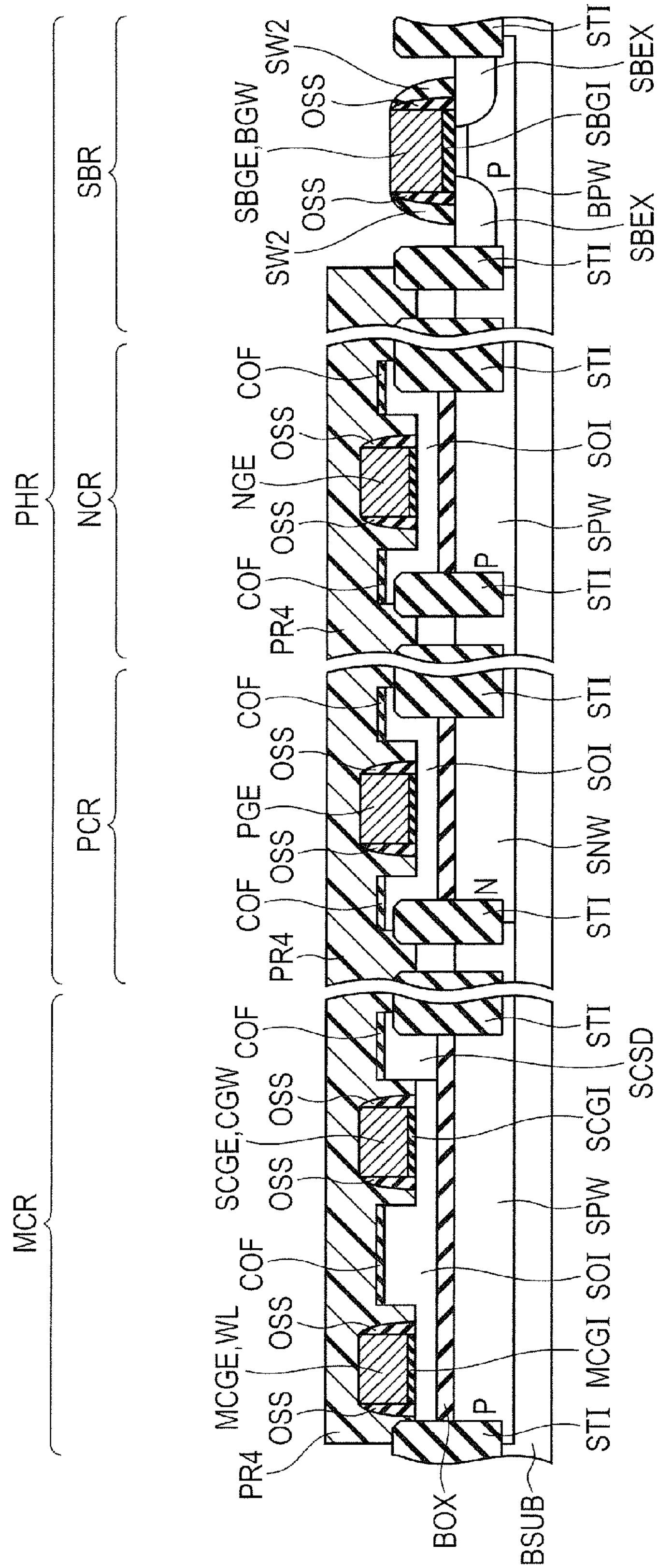
FIG. 62 is a sectional diagram showing a process performed after the process shown in FIG. 61 in the same embodiment.

Next, the sidewall insulating film SW1 and the hard mask HM are removed as shown in FIG. 61 through a process similar to the process shown in FIG. 29. Then, a sidewall insulating film SW2 is formed at a gate electrode SBGE of a selection bulk transistor as shown in FIG. 62 through a process similar to the process shown in FIG. 30.

Figure 63:
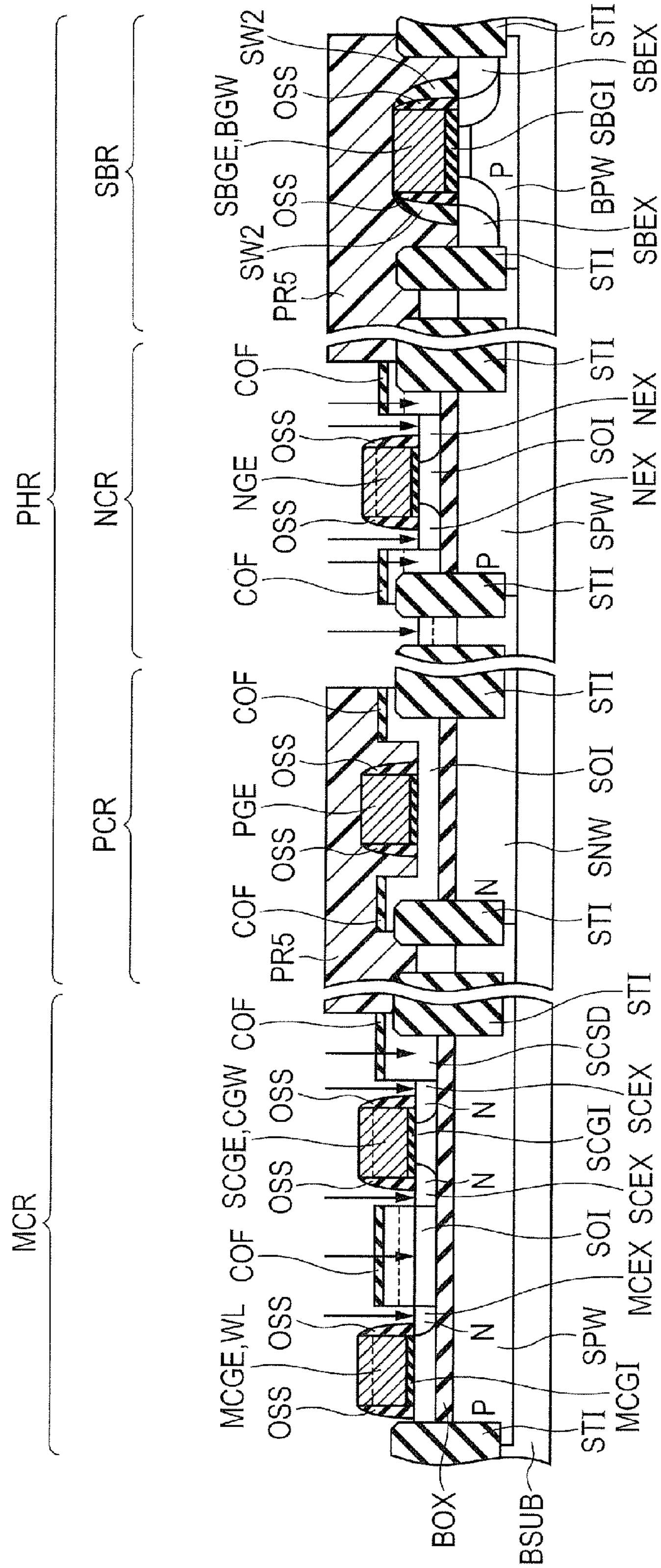
FIG. 63 is a sectional diagram showing a process performed after the process shown in FIG. 62 in the same embodiment.

Next, a resist pattern PR5 is formed as shown in FIG. 63 through a process similar to the process shown in FIG. 31. Then, an N type impurity is implanted with the resist pattern PR5 as an implantation mask to thereby form an extension region MCEX and an extension region SCEX in the memory cell region MCR. An extension region NEX is formed in an N type core transistor region NCR.

Although, at this time, the N type impurity is implanted into the selection core gate electrode SCGE, its impurity concentration is lower than an impurity concentration at the time that the source-drain region is formed. Therefore, the net conductivity type of the selection core gate electrode SCGE is kept at the P type. Thereafter, the resist pattern PR5 is removed.

Figure 64:
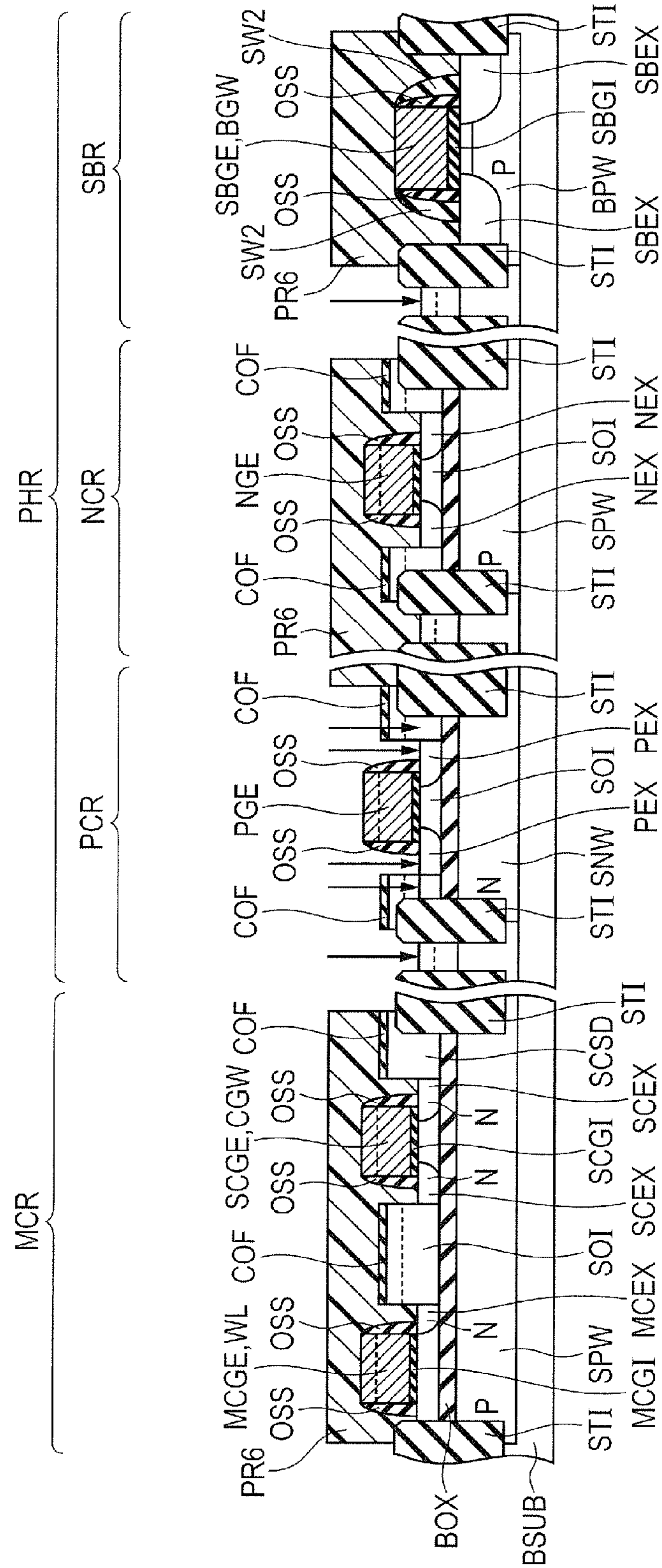
FIG. 64 is a sectional diagram showing a process performed after the process shown in FIG. 63 in the same embodiment.

Next, a resist pattern PR6 is formed as shown in FIG. 64 through a process similar to the process shown in FIG. 32. Then, a P type impurity is implanted with the resist pattern PR6 as an implantation mask to thereby form an extension region PEX in a P type core transistor region PCR. Afterwards, the resist pattern PR6 is removed.

Figure 65:
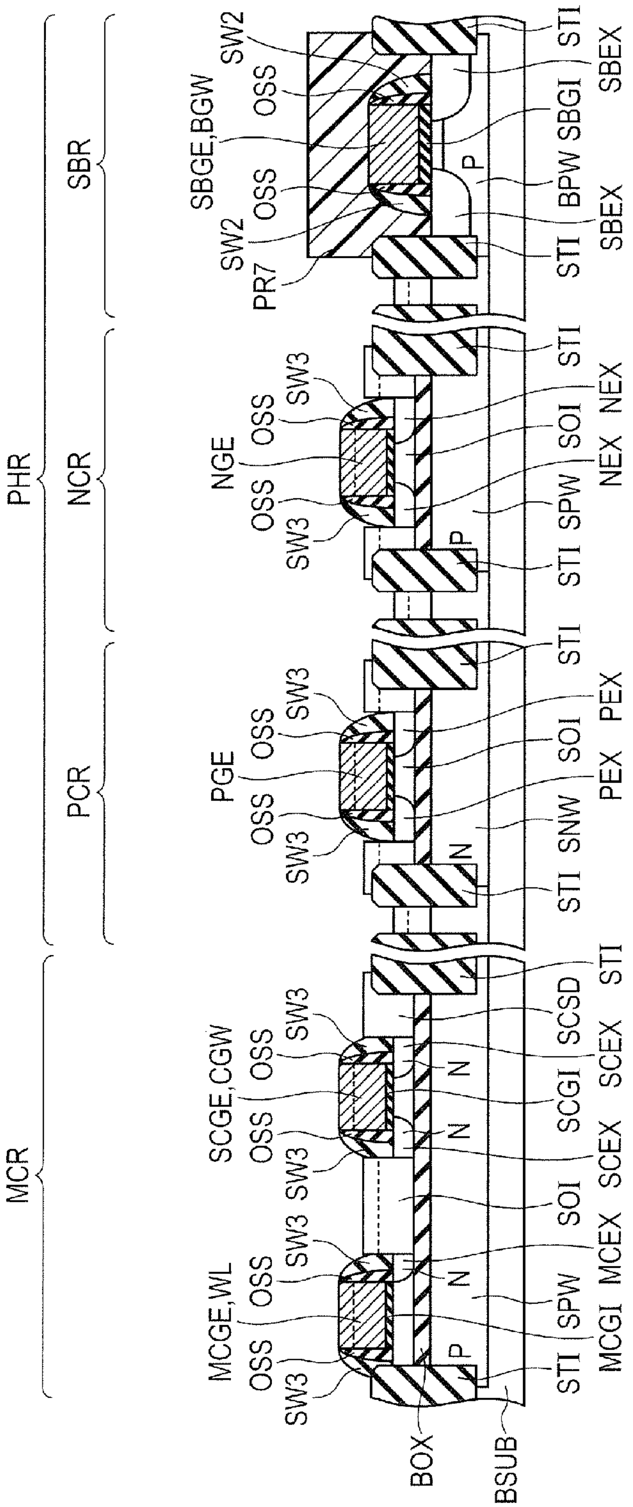
FIG. 65 is a sectional diagram showing a process performed after the process shown in FIG. 64 in the same embodiment.
Figure 66:
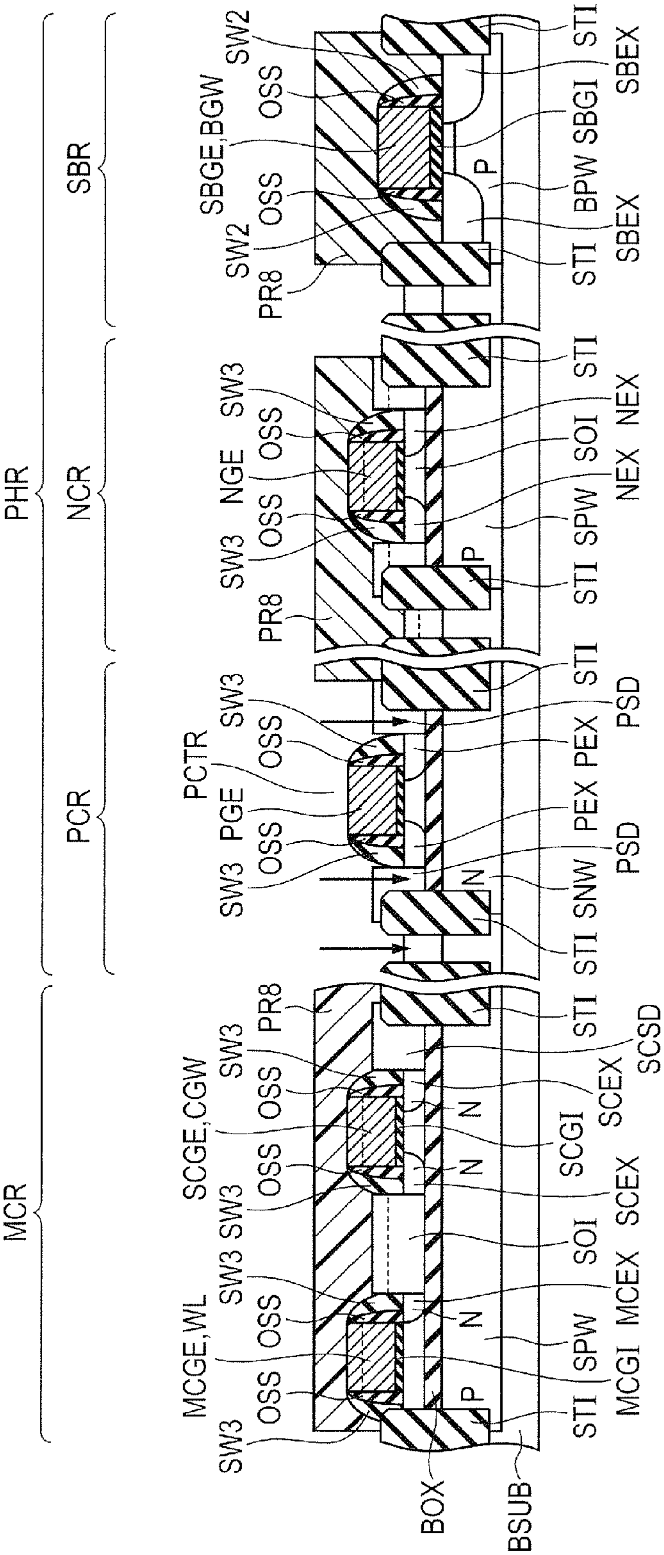
FIG. 66 is a sectional diagram showing a process performed after the process shown in FIG. 65 in the same embodiment.

Next, a sidewall insulating film SW3 is formed as shown in FIG. 65 through a process similar to the process shown in FIG. 33. Then, a resist pattern PR8 is formed as shown in FIG. 66 through a process similar to the process shown in FIG. 34. Next, a P type impurity is implanted with the resist pattern PR8 as an implantation mask to thereby form a source-drain PSD. Thereafter, the resist pattern PR8 is removed.

Figure 67:
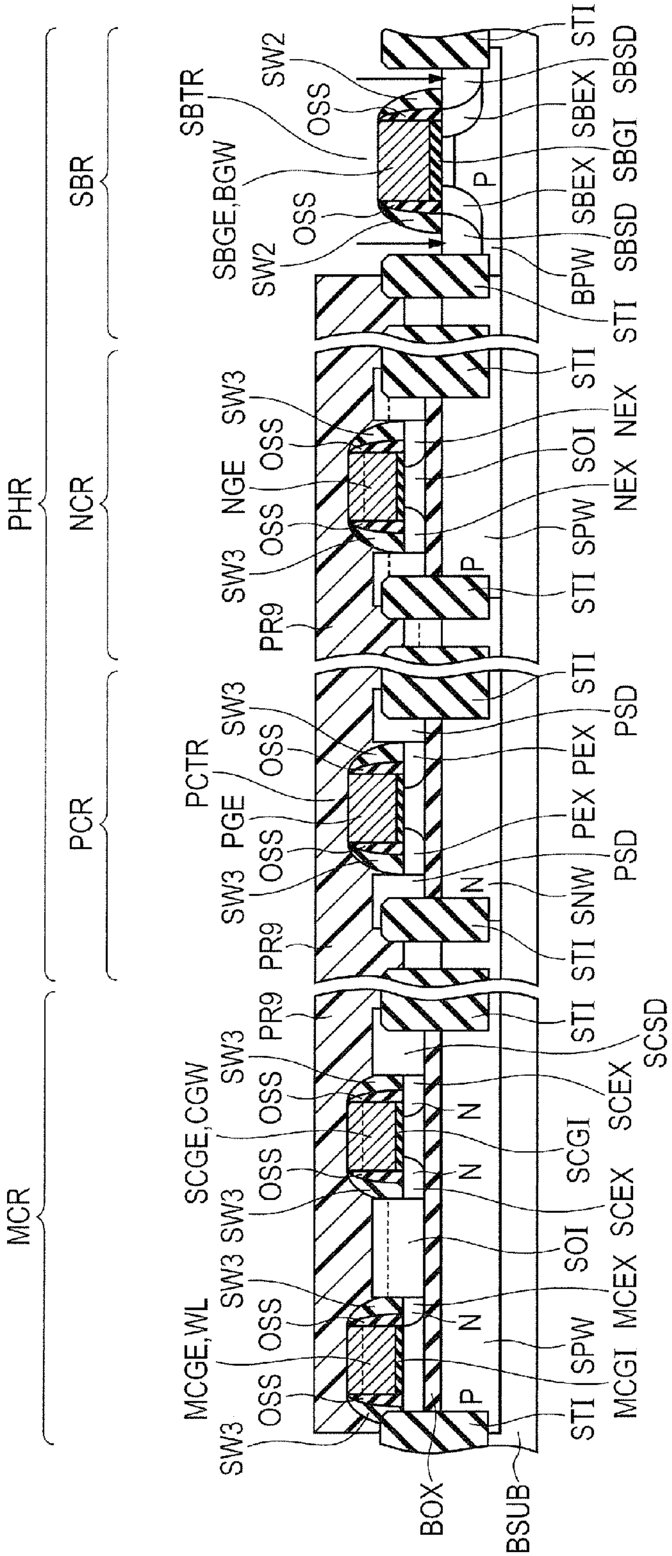
FIG. 67 is a sectional diagram showing a process performed after the process shown in FIG. 66 in the same embodiment.
Figure 68:
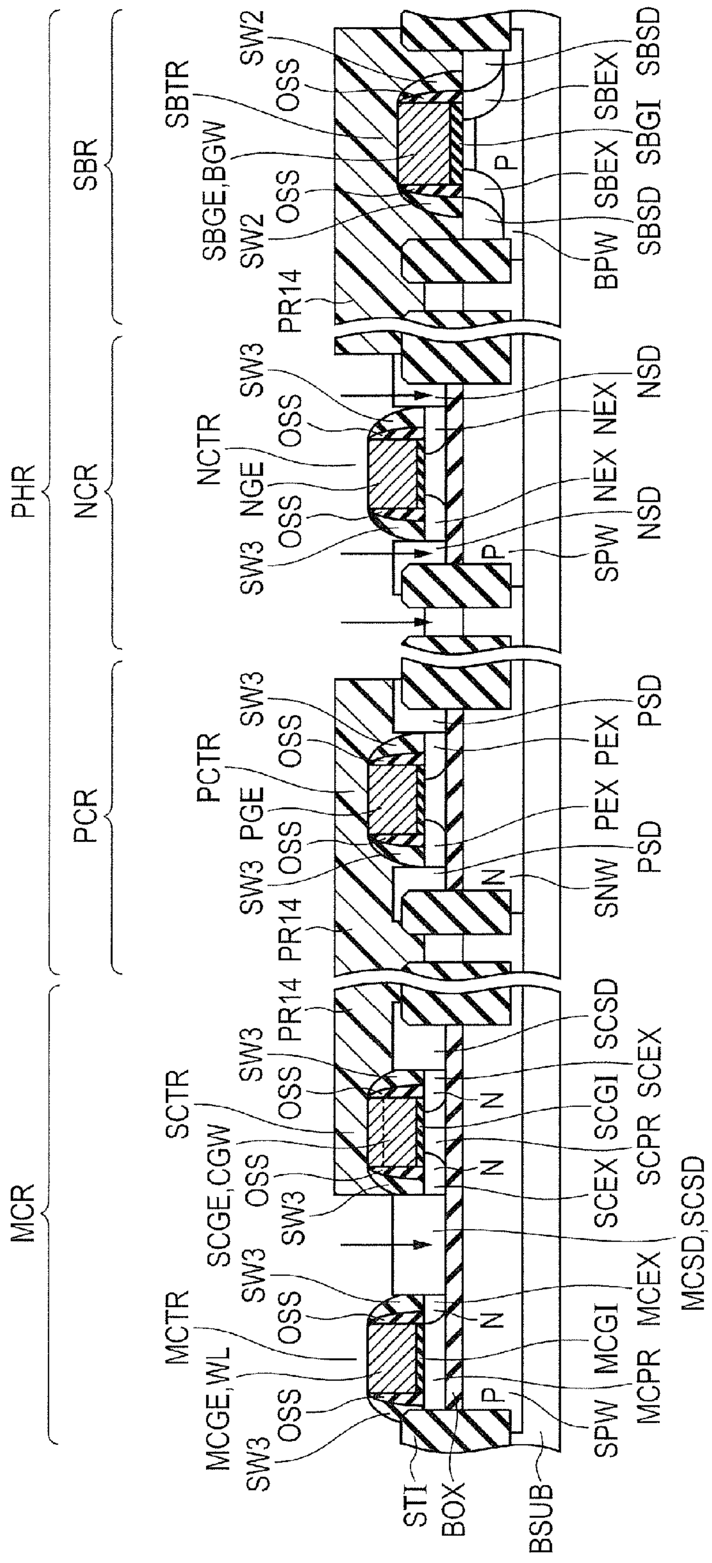
FIG. 68 is a sectional diagram showing a process performed after the process shown in FIG. 67 in the same embodiment.

Next, a resist pattern PR9 is formed as shown in FIG. 67 through a process similar to the process shown in FIG. 35. Then, an N type impurity is implanted with the resist pattern PR9 as an implantation mask to thereby form a source-drain region SBSD. Afterwards, the resist pattern PR9 is removed.

Next, predetermined photoengraving processing is performed to thereby form a resist pattern PR14 which exposes the regions of the silicon layer in which the other source-drain region of the selection core transistor and the source-drain region of a memory transistor are formed, and the N type core transistor region NCR, and which covers the P type core transistor region PCR and the selection bulk transistor region SBR.

Next, an N type impurity is implanted with the resist pattern PR14 as an implantation mask to thereby form a source-drain region MCSD and the other source-drain region SCSD in the memory cell region MCR. A source-drain region NSD is formed in the N type core transistor region NCR.

At this time, since the selection core gate electrode SCGE is covered by the resist pattern PR14, no N type impurity is introduced into the selection core gate electrode SCGE. Thus, the conductivity type of the selection core gate electrode SCGE is kept at the P type. Thereafter, the resist pattern PR14 is removed.

Figure 69:
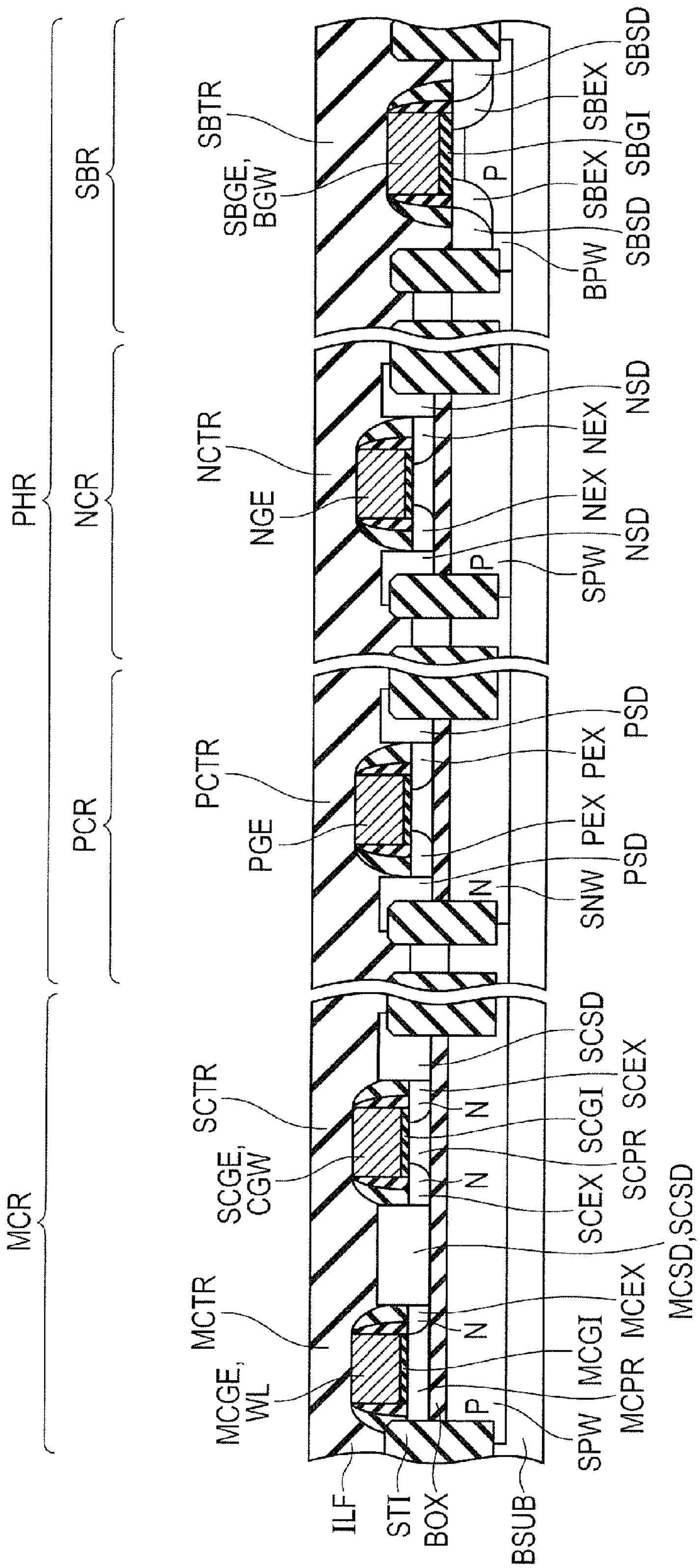
FIG. 69 is a sectional diagram showing a process performed after the process shown in FIG. 68 in the same embodiment.

Next, an interlayer insulating film ILF is formed so as to cover the memory transistor MCTR and the like as shown in FIG. 69 through a process similar to the process shown in FIG. 37. Thereafter, a contact plug SCCP and the like (refer to FIG. 51) are formed so as to penetrate the interlayer insulating film ILF. Further, a multilayer wiring structure including a plurality of wiring layers and an interlayer insulating film which insulates between the wiring layers is formed, and a main part of the semiconductor device shown in FIG. 51 is completed.

In the manufacturing method of the semiconductor device described above, firstly, the P type polysilicon film PF is formed as the polysilicon film which serves as the selection core gate electrode or the like, and the selection core gate electrode SCGE is patterned. Afterwards, when one of the pair of source-drain regions SCSD is formed, the selection core gate electrode SCGE is implanted with the N type impurity in a state of being covered by the hard mask HM and the resist pattern PR13.

Also, when the other thereof is formed, the selection core gate electrode SCGE is implanted with an N type impurity in a state of being covered by the resist pattern PR14. Thus, the conductivity type of the selection core gate electrode SCGE formed by patterning the P type polysilicon film can be kept at the P type.

Further, when the pair of extension regions SCSD is formed, an N type impurity is implanted in the selection core gate electrode SCGE. At this time, the amount of implantation of the N type impurity is smaller than the implantation amount when the source-drain region is formed. Therefore, the net conductivity type of the selection core gate electrode SCGE can be kept at the P type.

Thus, the withstand voltage of the selection core gate insulating film SCGI can be raised by keeping the conductivity type of the selection core gate electrode SCGE of the selection core transistor SCTR at the P type. Consequently, the counter voltage (absolute value) can further be raised. As a result, the breakdown efficiency of the memory gate insulating film MCGI is enhanced and the read-out accuracy of information can further be improved.

Incidentally, the respective embodiments described above have described by taking the N channel type for example as the conductivity type of the channel of each of the memory transistor MCTR and the selection core transistor SCTR, etc. A memory transistor and a selection core transistor, etc.

being of P channel type may however be applied. In this case, the voltage (positive) opposite in polarity to the voltage (negative) applied to the memory gate electrode is applied as the counter voltage. Also, the selection bulk transistor SBTR is also assumed to be formed in the silicon layer other than the bulk region. Further, the voltage value and the like mentioned in each embodiment are an example but are not limited thereto.

Incidentally, the semiconductor devices equipped with the anti-fuse memories, which have been described in the respective embodiments can be combined in various ways as needed.

Although the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. A semiconductor device comprising:

an SOI substrate having a bulk semiconductor substrate and a semiconductor layer formed over the bulk semiconductor substrate with a buried insulating film interposed therebetween;

a first element forming region defined in the semiconductor layer;

a second element forming region defined in the bulk semiconductor substrate;

a first conductivity type channel memory transistor formed in the first element forming region and including:

a memory gate electrode positioned over the semiconductor layer with a memory gate insulating film interposed therebetween;

a memory extension region formed in the semiconductor layer; and a first source/drain region formed in the semiconductor layer and adjacent to the memory extension region;

a first conductivity type channel first selection transistor formed in the first element forming region and including:

a first selection gate electrode positioned over the semiconductor layer with a first selection gate insulating film interposed therebetween;

a pair of first selection extension regions formed in the semiconductor layer; and a second source/drain region formed in the semiconductor layer and adjacent to one of the pair of first selection extension regions, wherein the other of the pair of first selection extension regions is adjacent to the first source/drain region, a first conductivity type channel second selection transistor formed in the second element forming region and including:

a second selection gate electrode formed on the bulk semiconductor substrate via a second selection gate insulating film;

a pair of second selection extension regions formed in the bulk semiconductor substrate; and a pair of third source/drain regions formed in the bulk semiconductor substrate, each third source/drain region being adjacent to a respective one of the pair of second selection extension regions;

a word line electrically coupled to the memory gate electrode; and a bit line electrically coupled to one of the third source/drain regions of the second selection transistor, wherein the memory transistor, the first selection transistor, and the second selection transistor are electrically coupled in series, wherein the first selection transistor and the second selection transistor are respectively brought into an ON state while applying a first voltage to the word line so as to cause dielectric breakdown of the memory gate insulating film, thereby performing a write-in operation of information, wherein the first selection transistor and the second selection transistor are respectively brought into an ON state while applying a second voltage to the word line and hence detect a current flowing from the memory gate electrode to the bit line through the first selection transistor and the second selection transistor, thereby performing a read-out operation of information, and wherein the write-in operation is performed while applying a counter voltage, opposite in polarity to the first voltage applied to the memory gate electrode, to the bit line.

2. The semiconductor device according to claim 1, wherein the memory extension region is of the first conductivity type, and wherein a first conductivity type impurity region, different from the memory extension region, is formed in the semiconductor layer and is positioned directly below the memory gate electrode so as to contact the memory extension region.

3. The semiconductor device according to claim 1, wherein the first selection gate electrode is of a second conductivity type.

4. The semiconductor device according to claim 1, wherein the memory extension region is arranged so as not to overlap with the memory gate electrode as seen in a plan view.

5. The semiconductor device according to claim 4, wherein the first selection extension regions overlap with the first selection gate electrode in the plan view, and the second selection extension regions overlap with the second selection gate electrode in the plan view.

6. The semiconductor device according to claim 5, wherein first sidewall spacers cover respective sidewalls of the first selection gate electrode, second sidewall spacers cover respective sidewalls of the second selection gate electrode, the second source/drain region does not overlap with the first sidewall spacers in the plan view, and the third source/drain regions overlap with the second sidewall spacers in the plan view.

7. The semiconductor device according to claim 1, wherein the semiconductor layer of the first element forming region includes an elevated portion.

8. The semiconductor device according to claim 1, wherein the first source/drain region has an upper surface that is above an upper surface of the memory extension region with respect to the buried insulating film.

9. The semiconductor device according to claim 8, wherein the upper surface of the first source/drain region is above an upper surface of the second selection gate electrode.

10. The semiconductor device according to claim 1, further comprising:

a first well region having a second conductivity type formed in the bulk semiconductor substrate under the memory transistor and the first selection transistor.

11. The semiconductor device according to claim 1, further comprising:

a second well region having a second conductivity type formed in the bulk semiconductor substrate under the second selection transistor.

12. The semiconductor device according to claim 1, wherein a first sidewall spacer covers a first sidewall of the memory gate electrode facing the first selection transistor, and the memory extension region overlaps with the first sidewall spacer in a plan view.

13. The semiconductor device according to claim 12, wherein a trench filled with a trench insulating film is on a side of the memory transistor opposite the first selection transistor, the trench extends through the semiconductor layer and the buried insulating film into the bulk semiconductor substrate, and the trench insulating film is in contact with a second sidewall spacer covering a second sidewall of the memory gate electrode opposite the first sidewall.

14. The semiconductor device according to claim 1, wherein the memory extension region has an impurity concentration less than that of the first source/drain region, the first selection extension region has an impurity concentration less than that of the second source/drain region, and the second selection extension regions have impurity concentrations less than that of the third source/drain regions.

* * * * *